(12) United States Patent
Kamimura et al.

(10) Patent No.: US 11,745,142 B2
(45) Date of Patent: Sep. 5, 2023

(54) FILTER DEVICE, PURIFICATION DEVICE, CHEMICAL SOLUTION PRODUCTION METHOD

(71) Applicant: FUJIFILM Corporation, Tokyo (JP)

(72) Inventors: Tetsuya Kamimura, Shizuoka (JP); Tadashi Omatsu, Shizuoka (JP); Tetsuya Shimizu, Shizuoka (JP); Satomi Takahashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 110 days.

(21) Appl. No.: 16/983,383

(22) Filed: Aug. 3, 2020

(65) Prior Publication Data

US 2020/0360862 A1 Nov. 19, 2020

Related U.S. Application Data

(63) Continuation of application No. PCT/JP2019/008077, filed on Mar. 1, 2019.

(30) Foreign Application Priority Data

Mar. 22, 2018 (JP) ................................. 2018-055149

(51) Int. Cl.
*B01D 61/14* (2006.01)
*B01D 61/18* (2006.01)
(Continued)

(52) U.S. Cl.
CPC ............ *B01D 61/58* (2013.01); *B01D 3/145* (2013.01); *B01D 61/145* (2013.01);
(Continued)

(58) Field of Classification Search
CPC .... B01D 61/145; B01D 61/147; B01D 61/58; B01D 65/02; B01D 71/36; B01D 2311/2623; G03F 7/26
See application file for complete search history.

(56) References Cited

U.S. PATENT DOCUMENTS 4,788,043 A * 11/1988 Kagiyama ................ B01D 3/36
422/292
5,242,468 A * 9/1993 Clark ................ H01L 21/67023
95/12
(Continued)

FOREIGN PATENT DOCUMENTS

CN 1371935 A 10/2002
CN 1726435 A 1/2006
(Continued)

OTHER PUBLICATIONS

Ogiwara, Tsutomu et al—JP 2016-037922 Machine Translation—May 12, 2016 (Year: 2016).*
(Continued)

*Primary Examiner* — Bradley R Spies
(74) *Attorney, Agent, or Firm* — Sughrue Mion, PLLC

(57) ABSTRACT

A filtering device is for obtaining a chemical liquid by purifying a liquid to be purified and has an inlet portion, an outlet portion, a filter A, a filter B different from the filter A, and a flow path extending from the inlet portion to the outlet portion, in which the filter A and the filter B are arranged in series between the inlet portion and the outlet portion and have, and the filter A is selected from the group consisting of predetermined filters A1, A2, and A3.

22 Claims, 17 Drawing Sheets

(51) Int. Cl.

| | | |
|---|---|---|
| *B01D 61/58* | (2006.01) | |
| *B01D 69/02* | (2006.01) | |
| *B01D 71/36* | (2006.01) | |
| *G03F 7/32* | (2006.01) | |
| *G03F 7/42* | (2006.01) | |
| *H01L 21/67* | (2006.01) | |
| *B01D 3/14* | (2006.01) | |
| *B01D 65/02* | (2006.01) | |
| *B01D 69/08* | (2006.01) | |
| *B01D 69/12* | (2006.01) | |
| *C08F 236/20* | (2006.01) | |
| *C08J 9/36* | (2006.01) | |

(52) U.S. Cl.
CPC .......... *B01D 61/147* (2013.01); *B01D 61/18* (2013.01); *B01D 65/02* (2013.01); *B01D 69/02* (2013.01); *B01D 69/08* (2013.01); *B01D 69/12* (2013.01); *B01D 71/36* (2013.01); *C08F 236/20* (2013.01); *C08J 9/365* (2013.01); *H01L 21/67017* (2013.01); *B01D 2311/25* (2013.01); *B01D 2311/2623* (2013.01); *B01D 2311/2669* (2013.01); *B01D 2317/02* (2013.01); *B01D 2321/16* (2013.01); *B01D 2325/022* (2013.01); *B01D 2325/36* (2013.01); *B01D 2325/42* (2013.01); *C08J 2327/18* (2013.01); *C08J 2347/00* (2013.01); *G03F 7/32* (2013.01); *G03F 7/422* (2013.01)

(56) References Cited

U.S. PATENT DOCUMENTS

| | | | |
|---|---|---|---|
| 2002/0128430 A1* | 9/2002 | Kumai | C08J 11/08 |
| | | | 528/480 |
| 2002/0144944 A1 | 10/2002 | Arcella et al. | |
| 2004/0154986 A1 | 8/2004 | Cheng et al. | |
| 2006/0014098 A1 | 1/2006 | Hada et al. | |
| 2007/0265478 A1* | 11/2007 | Ji | C07C 17/208 |
| | | | 570/161 |
| 2009/0039019 A1* | 2/2009 | Raman | B01D 69/147 |
| | | | 210/490 |
| 2009/0053576 A1 | 2/2009 | Wu | |
| 2010/0040912 A1 | 2/2010 | Arcella et al. | |
| 2010/0059441 A1 | 3/2010 | Pattil et al. | |
| 2010/0160465 A1 | 6/2010 | Aten et al. | |
| 2012/0118816 A1 | 5/2012 | Gjoka et al. | |
| 2014/0131278 A1* | 5/2014 | Sakamoto | B01D 41/04 |
| | | | 210/257.2 |
| 2015/0144557 A1 | 5/2015 | Ly et al. | |
| 2015/0299342 A1 | 10/2015 | Nanba | |
| 2015/0343391 A1* | 12/2015 | Ly | C07C 29/76 |
| | | | 210/259 |
| 2016/0144322 A1* | 5/2016 | Gjoka | B01D 71/36 |
| | | | 427/244 |
| 2016/0288059 A1* | 10/2016 | Aamer | B01D 71/80 |
| 2019/0033718 A1 | 1/2019 | Kamimura | |
| 2019/0060782 A1 | 2/2019 | Shimizu et al. | |

FOREIGN PATENT DOCUMENTS

| | | |
|---|---|---|
| CN | 1813099 A | 8/2006 |
| CN | 101606262 A | 12/2009 |
| CN | 102149452 A | 8/2011 |
| CN | 103771562 A | 5/2014 |
| CN | 104014250 A | 9/2014 |
| CN | 104470625 A | 3/2015 |
| CN | 104812781 A | 7/2015 |
| EP | 2 367 860 A1 | 9/2011 |
| JP | 2012-522882 A | 9/2012 |
| JP | 2015-061727 A | 4/2015 |
| JP | 2015-521101 A | 7/2015 |
| JP | 2016-073922 A | 5/2016 |
| KR | 2001-0101764 A | 11/2001 |
| KR | 10-2014-0147148 A | 12/2014 |
| WO | 00/44484 A2 | 8/2000 |
| WO | 2005/003444 A1 | 1/2005 |
| WO | 2017/175856 A1 | 10/2017 |
| WO | 2017/188209 A1 | 11/2017 |
| WO | 2018/043697 A1 | 3/2018 |

OTHER PUBLICATIONS

Communication dated Sep. 21, 2021 from the Japanese Patent Office in Application No. 2020-507484.
Office Action dated Oct. 21, 2021 in Korean Application No. 10-2020-7022177.
Office Action dated Oct. 22, 2021 in Chinese Application No. 201980013353.6.
Shi Jun, "Handbook of Membrane Technology", Beijing Chemical Industry Press, 1st edition, Jan. 2001, pp. 593 (3 pages total).
International Search Report dated May 28, 2019, issued by the International Searching Authority in application No. PCT/JP2019/008077.
Written Opinion dated May 28, 2019, issued by the International Searching Authority in application No. PCT/JP2019/008077.
International Preliminary Report on Patentability dated Sep. 22, 2020, issued by the International Bureau in application No. PCT/JP2019/008077.
Office Action dated Apr. 26, 2022 in Korean Application No. 10-2020-7022177 English, Translation.
Communication dated Apr. 12, 2022 from the Japanese Patent Office in Application No. 2020-507484.
Office Action dated May 16, 2022 from the Taiwanese Intellectual Property Office in TW Application No. 108108702.
Office Action dated May 5, 2022 from the China National Intellectual Property Administration in Chinese Application No. 201980013353.6.
Office Action dated Aug. 1, 2022 in Chinese Application No. 201980013353.6.

* cited by examiner

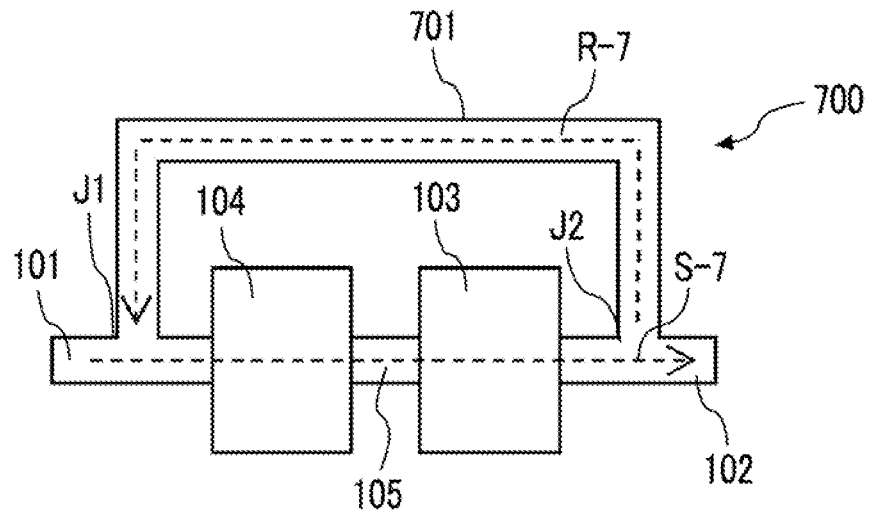
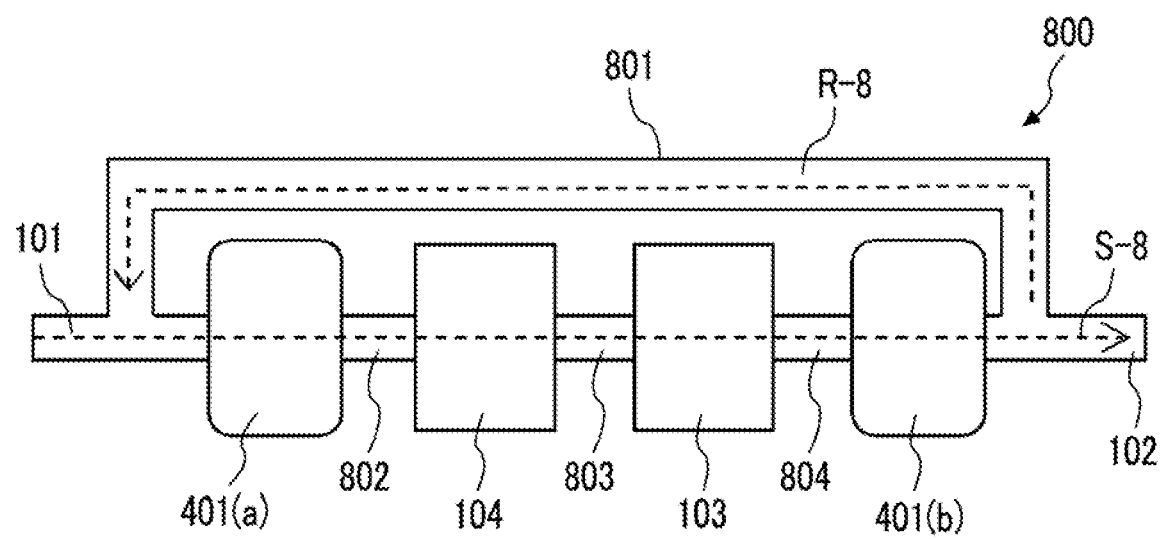

FILTER DEVICE, PURIFICATION DEVICE, CHEMICAL SOLUTION PRODUCTION METHOD

CROSS-REFERENCE TO RELATED APPLICATIONS

This application is a Continuation of PCT International Application No. PCT/JP2019/008077 filed on Mar. 1, 2019, which claims priority under 35 U.S.C § 119(a) to Japanese Patent Application No. 2018-055149 filed on Mar. 22, 2018. Each of the above application(s) is hereby expressly incorporated by reference, in its entirety, into the present application.

BACKGROUND OF THE INVENTION

1. Field of the Invention

The present invention relates to a filtering device, a purification device, and a method for manufacturing a chemical liquid.

2. Description of the Related Art

In a case where semiconductor devices are manufactured by a wiring forming process including photolithography, as a prewet solution, a resist solution (resist resin composition), a developer, a rinsing solution, a peeling solution, a chemical mechanical polishing (CMP) slurry, a post-CMP washing solution or the like or as a diluted solution of these, a chemical liquid containing water and/or an organic solvent is used.

In recent years, as photolithography techniques have become advanced, patterns have been further miniaturized.

The chemical liquid used in such a wiring forming process is required to have further improved defect inhibition performance. Generally, such a chemical liquid is considered to be obtained by purifying a liquid to be purified, which contains requisite components for the chemical liquid as main components, by using a filter or the like so as to remove impurities and the like.

As a filter that can be used for the purification of such a chemical liquid, JP2015-061727A describes "a hollow fiber membrane which has a skinned surface on one diameter and a porous surface on the opposite diameter and consists of a perfluorinated thermoplastic polymer", JP2012-522882A describes a porous membrane coated with "a fluorocarbon liquid composition including a fluorocarbon liquid medium containing dissolved or dispersed fluorinated ionomers dissolved or dispersed in the medium", and JP2015-521101A describes a microporous polytetrafluoroethylene ion-exchange membrane.

SUMMARY OF THE INVENTION

The inventors of the present invention obtained a chemical liquid by purifying a liquid to be purified by using the aforementioned filter and evaluated the defect inhibition performance of the chemical liquid. As a result, the inventors have found that sometimes a sufficient defect inhibition performance is not obtained. Therefore, an object of the present invention is to provide a filtering device capable of manufacturing a chemical liquid having excellent defect inhibition performance. Another object of the present invention is to provide a purification device and a method for manufacturing a chemical liquid.

In the present specification, "defect inhibition performance" of a chemical liquid means the performance of the chemical liquid evaluated by the method described in Examples. A chemical liquid used for manufacturing a semiconductor substrate is required to have "defect inhibition performance" corresponding to the type and role of the chemical liquid.

In the present specification, for a chemical liquid such as a prewet solution, a developer, or a rinsing solution used for forming a resist film, the residue defect inhibition performance described in [Test Example 1] in Examples, which will be described later, is regarded as "defect inhibition performance". Furthermore, for a resist resin composition which contains a resin and is used for forming a resist film, the bridge defect inhibition performance described in [Test Example 3] in Examples, which will be described later, is regarded as "defect inhibition performance". In addition, for a chemical liquid used as an etching solution, a resist peeling solution, or the like, the particle defect inhibition performance described in [Test Example 2] in Examples, which will be described later, is regarded as "defect inhibition performance".

Hereinafter, in a case where a characteristic is simply referred to as "defect inhibition performance", this means the defect inhibition performance (residue defect inhibition performance, bridge defect inhibition performance, or particle defect inhibition performance) corresponding to the type of the chemical liquid.

In order to achieve the aforementioned objects, the inventors of the present invention carried out intensive examinations. As a result, the inventors have found that the objects are achieved by the following constitution.

[1] A filtering device for obtaining a chemical liquid by purifying a liquid to be purified, the filtering device having an inlet portion, an outlet portion, a filter A, at least one filter B different from the filter A, and a flow path extending from the inlet portion to the outlet portion, in which the filter A and the filter B are arranged in series between the inlet portion and the outlet portion, in which the filter A is selected from the group consisting of a filter A1, a filter A2, and a filter A3, the filter A1 has a porous base material which is made of polytetrafluoroethylene and a coating layer which is disposed to cover the porous base material and contains a fluorinated ionomer, the fluorinated ionomer contains a fluorinated monomer unit containing an ethylene group and a functional group convertible to a hydrophilic group selected from the group consisting of $-SO_2F$, $-COOR$, $-COF$, and a combination of these, R represents a $C_1$-$C_{20}$ alkyl radical or a $C_6$-$C_{20}$ aryl radical; a monomer unit derived from at least one kind of bis-olefin selected from the group consisting of Formula (OF-1), Formula (OF-2), and Formula (OF-3) which will be described later; and at least one kind of atom selected from the group consisting of an iodine atom and a bromine atom, the filter A2 contains a copolymer having a repeating unit based on tetrafluoroethylene and another repeating unit, and the filter A3 is a laminated structure having a first layer which consists of a porous base material made of polytetrafluoroethylene having a first hydrophilic group on a surface thereof and a second layer which is disposed on the first layer and consists of a porous base material made of polytetrafluoroethylene having a second hydrophilic group different from the first hydrophilic group on a surface thereof.

[2] The filtering device described in [1], in which each of the first hydrophilic group and the second hydrophilic group is at least one kind of hydrophilic group selected from the group consisting of a polyether group, a hydroxyl group, a thioether group, a thiol group, a quaternary ammonium group, a carboxylic acid group, a sulfonic acid group, and a combination of these.

[3] The filtering device described in [1] or [2], in which the filter B includes at least one filter BU disposed on an upstream side of the filter A on the flow path.

[4] The filtering device described in [3], in which the at least one filter BU has a pore size larger than a pore size of the filter A.

[5] The filtering device described in [3] or [4], in which the at least one filter BU has a pore size equal to or greater than 20 nm.

[6] The filtering device described in any one of [3] to [5], in which the at least one filter BU contains a resin having an ion exchange group.

[7] The filtering device described in [6], in which the ion exchange group is at least one kind of group selected from the group consisting of an acid group, a base group, an amide group, and an imide group.

[8] The filtering device described in any one of [3] to [7], further having a return flow path capable of returning a liquid to be purified to an upstream side of a first reference filter from a downstream side of the first reference filter, in which the first reference filter consists of at least one kind of filter selected from the group consisting of the filter A and the filter BU.

[9] The filtering device described in any one of [1] to [8], in which the filter B includes at least a filter BD disposed on a downstream side of the filter A on the flow path.

[10] The filtering device described in [9], in which at least the one filter BD has a pore size smaller than a pore size of the filter A.

[11] The filtering device described in [9] or [10], in which at least the one filter BD has a pore size equal to or smaller than 20 nm.

[12] The filtering device described in any one of [9] to [11], in which the filter BD contains at least one kind of compound selected from the group consisting of polyolefin, polyamide, polyfluorocarbon, polystyrene, polysulfone, and polyethersulfone.

[13] The filtering device described in any one of [9] to [12], further having a return flow path capable of returning a liquid to be purified to an upstream side of a second reference filter from a downstream side of the second reference filter, in which the second reference filter consists of at least one kind of filter selected from the group consisting of the filter A and the filter BD.

[14] The filtering device described in any one of [1] to [13], further having a tank disposed in series with the filter A on an upstream side or a downstream side of the filter A between the inlet portion and the outlet portion on the flow path.

[15] The filtering device described in [14], further having a filter C having a pore size equal to or greater than 20 nm that is disposed in series with the tank on an upstream side of the tank in the flow path between the inlet portion and the outlet portion.

[16] The filtering device described in any one of [1] to [15], in which the chemical liquid is at least one kind of chemical liquid selected from the group consisting of a developer, a rinsing solution, a wafer washing solution, a line washing solution, a prewet solution, a wafer rinsing solution, a resist solution, a solution for forming an underlayer film, a solution for forming an overlayer film, and a solution for forming a hardcoat or at least one kind of chemical liquid selected from the group consisting of an aqueous developer, an aqueous rinsing solution, a peeling solution, a remover, an etching solution, an acidic washing solution, phosphoric acid, and a phosphoric acid-aqueous hydrogen peroxide mixture.

[17] A purification device having the filtering device described in any one of [1] to [16] and at least one distiller connected to the inlet portion of the filtering device.

[18] The purification device described in [17], in which at least one distiller includes a plurality of distillers connected in series.

[19] A method for manufacturing a chemical liquid that is for obtaining a chemical liquid by purifying a liquid to be purified, the method having a filtration step of purifying the liquid to be purified by using the filtering device described in any one of [1] to [16] so as to obtain a chemical liquid.

[20] The method for manufacturing a chemical liquid described in [19], further having a filter washing step of washing the filter A and the filter B before the filtration step.

[21] The method for manufacturing a chemical liquid described in [19] or [20], further having a device washing step of washing a liquid contact portion of the filtering device before the filtration step.

[22] A method for manufacturing a chemical liquid that is for obtaining a chemical liquid by purifying a liquid to be purified, the method having a step of filtering the liquid to be purified by using a filter A including a porous base material made of polyfluorocarbon and a coating layer which is disposed to cover the porous base material and contains a resin having a hydrophilic group and a filter B different from the filter A so as to obtain a chemical liquid.

According to the present invention, it is possible to provide a filtering device capable of manufacturing a chemical liquid having excellent defect inhibition performance. Furthermore, the present invention can also provide a purification device and a method for manufacturing a chemical liquid.

In the present specification, "defect inhibition performance" of a chemical liquid means the performance of the chemical liquid evaluated by the method described in Examples. A chemical liquid used for manufacturing a semiconductor substrate is required to have "defect inhibition performance" corresponding to the type and role of the chemical liquid.

In the present specification, for a chemical liquid such as a prewet solution, a developer, or a rinsing solution that is used for forming a resist film, the residue defect described in [Test Example 1] in Examples, which will be described later, is adopted as one of the typical indices of defects in a lithography process, and the residue defect inhibition performance is regarded as "defect inhibition performance". Furthermore, for a resist resin composition containing a resin and used for forming a resist film, the bridge defect described in [Test Example 3] in Examples, which will be described later, is adopted as one of the typical indices of defects derived from the resist resin composition in a lithography process, and the bridge defect inhibition performance is regarded as "defect inhibition performance". In addition, for a chemical liquid used as an etching solution, a resist peeling solution, or the like, the particle defect described in [Test Example 2] in Examples, which will be described later, is adopted as one of the typical indices of defects derived from the chemical liquid, and the particle defect inhibition performance is regarded as "defect inhibition performance".

Hereinafter, in a case where a characteristic is simply referred to as "defect inhibition performance", this means the defect inhibition performance (residue defect inhibition performance, bridge defect inhibition performance, or particle defect inhibition performance) corresponding to the type of the chemical liquid.

BRIEF DESCRIPTION OF THE DRAWINGS

FIG. 7 is a schematic view illustrating a filtering device according to a fifth embodiment of the present invention.

FIG. 8 is a schematic view illustrating a modification example of the filtering device according to the fifth embodiment of the present invention.

DESCRIPTION OF THE PREFERRED EMBODIMENTS

Figure 1:
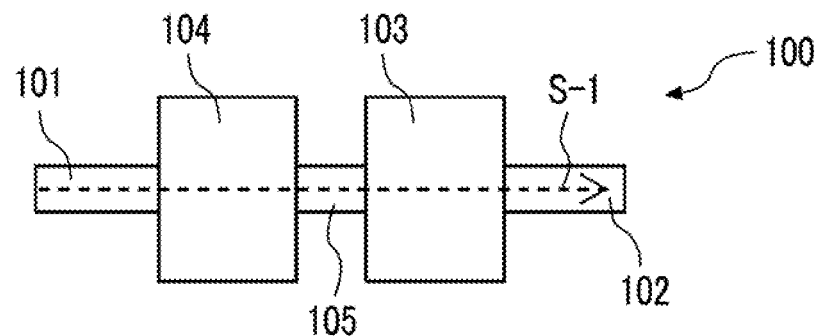
FIG. 1 is a schematic view illustrating a filtering device according to a first embodiment of the present invention.

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values described before and after "to" as a lower limit and an upper limit respectively.

[Filtering Device]

The filtering device according to an embodiment of the present invention has an inlet portion, an outlet portion, a filter A, at least one filter B different from the filter A, and a flow path extending from the inlet portion to the outlet portion (path through which a liquid to be purified flows), in which the filter A and the filter B are arranged in series between the inlet portion and the outlet portion (in other words, the filtering device has a filter A and at least one filter B different from the filter A that are arranged in series between an inlet portion and an outlet portion and a flow path that extends from the inlet portion to the outlet portion), in which the filter A is selected from the group consisting of a filter A1, a filter A2, and a filter A3 that will be described later. The filtering device has a flow path extending from the inlet portion to the outlet portion, in which the filter A and at least one filter B different from the filter A are arranged in series between the inlet portion and the outlet portion.

In the present specification, "the filter A and the filter B are different from each other" means that these filters are different from each other in terms of at least one kind of item selected from the group consisting of pore size, pore structure, and material (such as a material component contained in each filter).

Generally, as impurities in a chemical liquid involved in the defect inhibition performance of the chemical liquid, for example, a gel-like organic compound (particularly, a polymer compound) component, inorganic fine particles, inorganic ions, and the like are considered.

It is considered that among these, the gel-like polymer compound or the inorganic fine particles that can be solid contents in the chemical liquid may be easily removed by a sieving effect of a filter, and thus the defect inhibition performance of the obtained chemical liquid may be improved.

In contrast, it is considered that the inorganic components other than particles and the ionic components may be easily removed by an adsorption function of a filter (such as the adsorption by the interaction between ions and the adsorption by the hydrophilic and hydrophobic interaction), and thus the defect inhibition performance of the obtained chemical liquid may be improved.

By the inventors of the present invention, it has been found, for the first time, that in a case where a filter having a sieving effect and a filter having an adsorption effect are arranged in series on a flow path of a filtering device, a chemical liquid is obtained which has a defect inhibition performance improved further than in a case where the each of the above filters is used singly. According to the inventors of the present invention, the mechanism yielding the above result is assumed to be as below.

According to the study of the inventors of the present invention, it has been revealed that sometimes defects occur in a case where microgel (containing an organic compound) which is not a source of defect alone interacts with inorganic fine particles and/or inorganic ions, in a case where inorganic fine particles, trace metals, and the like which are not a source of defect alone interact with a gel-like organic compound, or in a case where microgel interacts with inorganic fine particles, trace metals, and the like.

Particularly, by the filtration based on a molecular sieving effect, microgel is not thoroughly removed due to the influence of solvation in a chemical liquid. In a case where the chemical liquid is applied to a wafer and then dried, the effect of solvation is reduced, and thus gel is formed, which is considered as one of the causes of the occurrence of defects.

For such a complex source of defect, it is effective to remove each of the causative components interacting with each other. It is considered that in a case where the microgel component and the inorganic ultrafine particle component and the inorganic ion component capable of interacting with the microgel component are removed by the sieving effect and the adsorption effect, defects could be further reduced.

Presumably, by the combination of the sieving effect brought about by the filter A, which will be described later, and the effect of removing the source of ions and/or the inorganic fine particles brought about by filters combined with the filter A, the filtering device according to the present embodiment can efficiently remove the substances easily causing defects by interactions from a liquid to be purified, and thus the effect of reducing defects in the chemical liquid could be further improved.

Hereinafter, the filtering device will be described using drawings. In the filtering device according to the embodiment of the present invention, because the filter A and the filter B are arranged in series on the flow path, the liquid to be purified is sequentially filtered through the filter A and the filter B (or the filter B and the filter A). Hereinafter, the filtering device according to the embodiment of the present invention will be described. In the following section, a filtering device for a dead-end filtration method that filters the entirety of a liquid to be purified introduced into a filter by using the filter will be described for example. However, the filtering device according to the embodiment of the present invention is not limited thereto, and may be a filtering device for a cross-flow method that divides the introduced liquid to be purified into a liquid to be purified having undergone purification and a concentrate (sometimes the concentrate is introduced again into a filter as a liquid to be purified) or may be a filtering device for a method as a combination of the dead-end filtration method and the cross-flow method.

First Embodiment

FIG. 1 is a schematic view illustrating a filtering device according to a first embodiment of the present invention.

A filtering device 100 is a filtering device in which a filter 103 as a filter A and a filter 104 (corresponding to a filter BU) different from the filter 103 are arranged in series through a piping 105 between an inlet portion 101 and an outlet portion 102.

The inlet portion 101, the filter 104, a piping 202, the filter 103, and the outlet portion 102 are constituted such that a liquid to be purified can flow in each of these members. These members are connected to one another and form a flow path S1 (path through which the liquid to be purified flows).

The shape of the inlet portion 101 and the outlet portion 102 is not particularly limited as long as the liquid to be purified can be introduced into and discharged from the filtering device. Typically, examples thereof include a hollow cylindrical piping (inlet portion and outlet portion) having an inlet port and an outlet port. Hereinafter, an embodiment in which each of the outlet portion and the inlet portion is a piping will be described for example.

The shapes of the inlet portion 101, the piping 105, and the outlet portion 102 are not particularly limited. Typically, examples thereof include a hollow cylinder shape in which the liquid to be purified can flow in these members. Although the material of these is not particularly limited, it is preferable that a liquid contact portion (a portion that is likely to contact the liquid to be purified in a case where the liquid to be purified is filtered) thereof contains an anticorrosive material, which will be described later, as a material component (constituent component). In other words, it is preferable that the liquid contact portion is formed of the anticorrosive material which will be described later.

The liquid to be purified introduced from the inlet portion 101 of the filtering device 100 flows in the filtering device 100 along the flow path S1. In the meantime, the liquid to be purified is sequentially filtered through the filter 103 (filter A) and the filter 104 (filter BU) and then discharged out of the filtering device 100 from the outlet portion 102. The form of the liquid to be purified will be described later.

For the purpose of allowing the liquid to be purified to flow, the filtering device 100 may have a pump, a damper, a valve, and the like, which are not shown in the drawing, on the flow path S1 (for example, in the inlet portion 101, the piping 105, the outlet portion 102, and the like). The method of allowing the liquid to be purified to flow along the flow path in the filtering device 100 is not limited to the above, and may be a method of introducing the liquid to be purified into the inlet portion by applying pressure thereto.

The shape of the filter 103 (filter A) and the filter 104 (filter BU) is not particularly limited. For example, the filter A and the filter B have a flat shape, a pleated shape, a spiral shape, a hollow cylindrical shape, and the like. Particularly, in view of further improving handleability, typically, the filter A and the filter B are preferably in the form of a cartridge filter having a core, which is formed of a material component permeable to the liquid to be purified and/or has a structure permeable to the liquid to be purified, and a filter which is disposed on the core in a state of being wound around the core. In this case, although the material component of the core is not particularly limited, it is preferable that the core is formed of the anticorrosive material which will be described later.

The method of arranging the filters is not particularly limited. Typically, it is preferable to arrange the filters in a housing not shown in the drawing that has at least one entrance, at least one exit, and at least one flow path formed between the entrance and the exit. In this case, the filters are arranged to cross the flow path in the housing. The flow path formed in the housing forms a portion of the flow path S1. While flowing through the flow path S1, the liquid to be purified is filtered through the filters that are arranged to cross the flow path S1.

The material component of the housing is not particularly limited. Examples thereof include any appropriate hard and impermeable material components including impermeable thermoplastic material components compatible with the liquid to be purified. For example, the housing can be prepared from a metal such as stainless steel or a polymer. In an embodiment, the housing is a polymer such as polyacrylate, polypropylene, polystyrene, or polycarbonate.

Furthermore, in view of obtaining a filtering device having further improved effects of the present invention, at least a portion of a liquid contact portion of the housing, which is preferably 90% and more preferably 99% of the surface area of the liquid contact portion, is preferably formed of the anticorrosive material which will be described later. In the present specification, the liquid contact portion means a portion which is likely to contact the liquid to be purified (here, the filter is not included in the liquid contact portion), and means the inner wall of a unit such as the housing and the like.

<Filter A>

The filter A according to an embodiment of the present invention is selected from the group consisting of a filter A1, a filter A2, and a filter A3 described below.

(Filter A1)

The filter A1 has a porous base material made of polytetrafluoroethylene and a coating layer which is disposed to cover the porous base material and contains a fluorinated ionomer. The fluorinated ionomer contains at least two kinds of monomer units, which will be described later, and at least one kind of atom selected from the group consisting of an iodine atom and a bromine atom.

Typical examples of the filter A1 include a porous base material (made of polytetrafluoroethylene) with a coating layer formed of a fluorocarbon liquid composition including a fluorocarbon liquid medium containing a fluorinated ionomer dissolved or dispersed in the medium, in which at least 90% by mass of the fluorinated ionomer consists of particles having a particle size less than 200 nanometers (nm), less than 125 nm in some modification examples, less than 40 nm in another modification example, and less than 15 nm in still another modification example. The equivalent weight of the fluorinated ionomer is preferably between 380 g/equivalent and 620 g/equivalent. The fluorinated ionomer includes a fluorinated monomer unit containing an ethylenic group and a functional group convertible to a hydrophilic group. The convertible group is selected from the group consisting of $-SO_2F$, $-COOR$, $-COF$, and a combination of these. R represents a $C_1$-$C_{20}$ alkyl radical or a $C_6$-$C_{20}$ aryl radical. The fluorinated ionomer further includes a monomer unit derived from a bis-olefin selected from Formulas (OF-1), (OF-2), (OF-3), and a combination of these. (OF-1) is represented by the following structure.

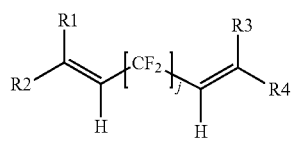

(OF-1)

In the structure of (OF-1), j is an integer of 2 to 10 and preferably an integer of 4 to 8, and R1, R2, R3, R4 are the same as or different from each other and each represent H, F, or a C1-C5 alkyl or (per)fluoroalkyl group. (OF-2) is represented by the following structure.

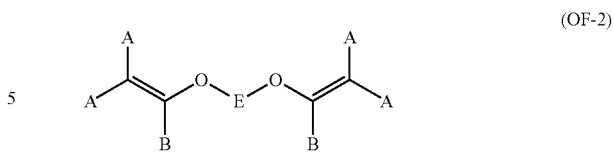

(OF-2)

In the structure of (OF-2), As may be the same or different from each other and are each independently selected from F, Cl, and H; Bs may be the same or different from each other and are each independently selected from F, Cl, H, and ORB, wherein RB represents a branched or linear alkyl radical capable of being fluorinated or chlorinated (may be fluorinated or chlorinated) at least partially or substantially totally; E represents a divalent group which can be inserted through an ether bond, is fluorinated as necessary, and has 2 to 10 carbon atoms (E represents a divalent group having 2 to 10 carbon atoms that may include an ether bond and/or may be fluorinated); E preferably represents a $-(CF_2)m-$ group, where m is an integer of 3 to 5; and one of the modification examples of the (OF-2) type bis-olefin is $F_2C=CF-O-(CF_2)_5-O-CF=CF_2$. (OF-3) is represented by the following structure.

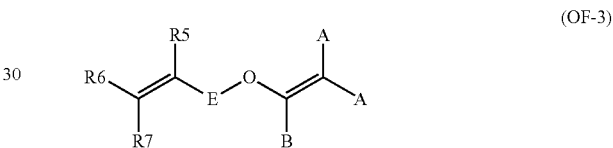

(OF-3)

In the structure of (OF-3), E, A, and B have the same definition as E, A, and B described above; R5, R6, R7 are the same or different from each other and each represent H, F, or a $C_1$-$C_5$ alkyl or (per)fluoroalkyl group. In some modification examples, the bis-olefin is represented by Formula: $R1R2C=CH-(CF_2)_m-CH=CR5R6$, where m=2 to 10, and R1, R2, R5, and R6 are the same as or different from each other and each represent H or a $C_1$-$C_5$ alkyl group.

The fluorinated ionomer further includes iodine and/or bromine atoms. In some modification examples, the iodine and/or bromine atoms are positioned at a terminal of the ionomer main chain. The iodine and/or bromine atoms are derived from a fluorocarbon chain transfer agent represented by Formula: X1(CF)nX2 wherein X1 and X2 are selected from the group consisting of I, Br, and a combination of these. In some modification examples, the content of the iodine and/or bromine atoms is between 0.1% by mass and 5% by mass based on the ionomer.

In some modification examples, the fluorinated ionomer includes a monomer unit including tetrafluoroethylene and a fluorinated monomer unit containing an ethylenic group and a functional group convertible to a hydrophilic group. The functional group convertible to a hydrophilic group is selected from the group consisting of $-SO_2F$, $-COOR$, $-COF$, and a combination of these. R represents a $C_1$-$C_{20}$ alkyl radical or a $C_6$-$C_{20}$ aryl radical. The fluorinated ionomer further includes a monomer unit derived from a bis-olefin represented by Formula: $R1R2C=CH-(CF_2)m-CH=CR5R6$, where m is an integer between 2 and 10, and R1, R2, R5, and R6 are the same as or different from each other and each represent H or a $C_1$-$C_5$ alkyl group. The fluorinated ionomer further includes iodine and/or bromine atoms positioned at a terminal of the main chain thereof. The iodine and/or bromine atoms are derived from a fluorocarbon chain transfer agent represented by Formula: X1(CF)nX2 wherein X1 and X2 are selected from the group consisting of I, Br, and a combination of these.

In some modification examples, the fluorinated monomer unit containing an ethylenic group and a functional group convertible to a hydrophilic group is represented by Formula: $CF_2=CF-O-CF_2CF_2SO_2F$.

In a modification example, the fluorocarbon liquid composition can additionally include a crosslinker and a radical initiator. In some modification examples, the crosslinker can be or is a bis-olefin represented by Formula: R1R2C=CH—(CF$_2$)m-CH=CR5R6, where m=2 to 10, and R1, R2, R5, and R6 are the same as or different from each other and each represent H or a $C_1$-$C_5$ alkyl group. The radical initiator can be or is an organic dialkyl peroxide, and is preferably 2,5-di(t-butylperoxy)-2,5-dimethylhexane.

In some modification examples of the fluorocarbon liquid composition, at least 95% by mass of the fluorinated ionomer can consist of particles having a particle size less than 200 nanometers (nm). In another modification example, at least 95% by mass of the fluorinated ionomer can consist of particles having a particle size less than 125 nm. In still another modification example, the particle size of the fluorinated ionomer is less than 40 nm. In yet another modification example, the particle size is smaller or less than 15 nm. In another modification example of the liquid composition, at least 99% by mass of the fluorinated ionomer can consist of particles having a particle size less than 200 nanometers (nm). In still another modification example, at least 99% by mass of the fluorinated ionomer can consist of particles having a particle size less than 125 nm. In yet another modification example, the particle size is less than 40 nm. In another modification example, the particle size is smaller or less than 15 nm. In another modification example of the present invention, the liquid composition has a fluorinated ionomer consisting of particles in which the proportion of particles having a particle size less than 125 nm is at least 99% by mass. In still another modification example of the liquid composition, at least 99% by mass of the fluorinated ionomer consists of particles having a particle size less than 40 nm. In yet another modification example of the liquid composition, at least 99% by mass of the fluorinated ionomer consists of particles having a particle size less than 15 nm.

In another modification example, the fluorocarbon liquid composition includes a fluorocarbon liquid medium containing a crosslinkable fluorinated ionomer dissolved or dispersed in the medium. At least 90% by mass of the crosslinkable fluorinated ionomer consists of particles having a particle size which is less than 200 nm, preferably less than 125 nm, more preferably less than 40 nm, and even more preferably less than 15 nm. In some modification examples of the liquid composition, the liquid composition can additionally include a crosslinker and a radical initiator.

In a modification example, the filter A1 includes a porous base material coated with the fluorocarbon liquid composition. Another modification example of the filter A1 is a porous base material coated with the fluorocarbon liquid composition cured to crosslink the fluorinated ionomer and the bis-olefin on a membrane. In still another modification example of the filter A1, the convertible group of the porous base material, which has the cured and crosslinked ionomer on a surface and pores thereof, is activated by a base or acid and forms a hydrophilic group.

A modification example of the filter A1 includes a non-dewetting microporous membrane composite material wettable with a solution containing methanol and water. The microporous membrane composite material has a crosslinked coating on a fluid contact surface and pores of the porous base material. The coating includes an amorphous fluorinated ionomer having a hydrophilic group. In some modification examples, the fluorinated ionomer is mainly constituted with an amorphous portion, and only a portion of the fluorinated ionomer is crystalline or partially crystalline. The ionomer in the coating on the porous base material is crosslinked by the hydrophobic group. The microporous membrane composite material maintains non-dewetting properties after being subjected to an autoclaving treatment in water, and has a surface energy equal to or higher than $27 \times 10^{-5}$ N/cm.

A modification example of the filter A1 is a microporous membrane composite material which includes a porous base material having a pore size equal to or smaller than 0.45 micrometers and having a rated pore size equal to or smaller than 0.1 micrometers in some modification examples and a coating including an amorphous crosslinked fluorinated ionomer coating the surface and pores of the porous base material, and is wettable with a solution containing methanol and water. Due to the crosslinked coating on the porous base material, in a case where a flow loss is measured using 500 mL of isopropyl alcohol under a pressure of 97,905 Pa, an average isopropyl alcohol flow loss of the microporous membrane composite material is equal to or lower than 82% of an average isopropyl alcohol flow loss of an uncoated porous base material. In some modification examples of the filter A1, the porous base material is constituted with multiple layers, and includes one or more retention layers and one or more supporting layers. The crosslinked fluorinated ionomer can be formed of a fluorinated monomer unit including tetrafluoroethylene; and a fluorinated monomer unit containing an ethylenically unsaturated group and a functional precursor group convertible to a hydrophilic group. The precursor group is selected from the group consisting of —SO$_2$F, —COOR, —COF, and a combination of these. R represents a $C_1$-$C_{20}$ alkyl radical or a $C_6$-$C_{20}$ aryl radical.

The crosslinked fluorinated ionomer can be formed of a crosslinking group without a hydrophilic group. In a modification example of the filter A1, the crosslinker is derived from a bis-olefin represented by Formula (I): R1R2C=CH—(CF$_2$)$_m$—CH=CR5R6, or includes or consists of this bis-olefin. In the formula, m=2 to 10, and R1, R2, R5, and R6 are the same or different from each other or each represent H or a $C_1$-$C_5$ alkyl group.

The fluorinated ionomer can include iodine and/or bromine groups derived from a fluorocarbon chain transfer agent represented by Formula: $X_1(CF)_nX_2$. In the formula, $X_1$ and $X_2$ are selected from the group consisting of I, Br, and a combination of these.

The fluorinated monomer unit containing the ethylenically unsaturated group and the functional group convertible to a hydrophilic group includes or consists of a $CF_2=CF-O-CF_2CF_2SO_2F$ unit, or can substantially consist of this unit. In a modification example, the fluorinated crosslinked ionomer coating having a hydrophilic group that coats the surface and pores of the microporous membrane results in a microporous membrane composite material which has an ion exchange capacity higher than 60 nmol/cm$^2$ and higher than 95 nmol/cm$^2$ in some modification examples and is wettable with a solution containing methanol and water. The crosslinked fluorinated coating in a modification example of the filter A1 is advantageous in that this coating is more stable in an oxidative environment compared to the conventional hydrophilization surface coating (for example, a polyvinyl alcohol coating on a microporous membrane).

A fluorinated compound or fluorocarbon compound refers to a compound, polymer, ionomer, chain transfer agent, crosslinker, solvent, or the like having at least one carbon-hydrogen bond or at least one carbon-bonded hydrogen atom substituted with fluorine. In a modification example, a fluorinated compound or fluorocarbon compound refers to a compound, polymer, ionomer, chain transfer agent, crosslinker, solvent, or the like in which all or substantially all of the carbon-bonded hydrogen atoms are not substituted with fluorine. A perfluorinated compound or perfluorocarbon compound refers to a compound (including a polymer, ionomer, crosslinking group, chain transfer agent, or the like) in which all or substantially all of the carbon-bonded hydrogen atoms are substituted with fluorine. For example, "perfluorinated" can be mentioned for a compound in which all of the hydrogen atoms are substituted with fluorine atoms except for hydrogen atoms that may substantially affect the properties of characteristic groups present in the compound by the substitution thereof. In a perfluorinated composition, some residual hydrides can exist, for example, at a proportion less than 2% by mass of the perfluorinated product and in some cases at a proportion less than 0.25% by mass of the perfluorinated product. For instance, polyvinylidene fluoride is not an example of a perfluorinated polymer but an example of a fluoropolymer. Examples of the perfluorinated polymer include PFA, MFA, FEP, polytetrafluoroethylene (PTFE), a blend of these, and the like. Examples of perfluorinated thermoplastic polymers useful for porous membranes include, but are not limited to, perfluoroalkoxy (Teflon (registered trademark) PFA from DuPont, Neoflon (registered trademark) PFA from DAIKIN INDUSTRIES, Ltd., and Teflon (registered trademark) PFA Plus from DuPont), perfluoromethylalkoxy (Hyflon (registered trademark) MFA from Solvay Solexis, Inc.), fluorinated ethylene propylene (Teflon (registered trademark) FEP from DuPont), and a copolymer of these. These perfluorinated thermoplastic substances are resistant to chemicals and stable against heat. Therefore, porous membranes prepared from these are markedly more advantageous compared to polymers that are chemically and thermally less stable. Examples of other useful thermoplastic fluoropolymers that can be used include homopolymers and copolymers including a monomer unit derived from a fluorinated monomer, for example, vinylidene fluoride (VF2), hexafluoropropene, (HFP), chlorotrifluoroethylene (CTFE), vinyl fluoride (VF), trifluoroethylene (TrFE), and tetrafluoroethylene (TFE), in combination with one or more kinds of other non-fluorinated monomers used as necessary.

A fluorosurfactant refers to a surfactant in which at least one hydrogen atom is substituted with a fluorine atom or refers to a surfactant which contains one or more fluorine atoms. In some modification examples, 3M (trademark) Novec (trademark) FC4432 is a fluorosurfactant in 5,000 parts per million (ppm) isopropyl alcohol. Novec (trademark) FC4432 is a nonionic polymeric fluorosurfactant available from 3M (trademark).

The fluorinated coating on the outer surface and pore surface of the porous base material or the perfluorinated coating in a modification example can be characterized by searching for a nontransparent site in a semitransparent coated microporous membrane in a process of wetting a sample of a microporous membrane composite material having undergone steps or operations of coating, curing, and activation and then subjecting the sample to a wetting test in various solutions containing methanol and water. In a modification example of the present invention, the coating can be characterized by searching for a nontransparent site in a sample of a coated microporous membrane composite material stained with methylene blue. Alternatively, a difference in densitometer readings of the microporous membrane composite material stained with a methylene blue dye can be used for characterizing the uniformity of the crosslinked ionomer coating the liquid contact surface of a microporous support. In some embodiments, the crosslinked ionomer coating is characterized by having a relative standard deviation (standard deviation divided by the average) of the densitometer readings of the coated microporous membrane composite material stained with methylene blue of less than 0.40. In another embodiment, the crosslinked ionomer coating is characterized by having a relative standard deviation of the densitometer readings of the coated microporous membrane composite material stained with methylene blue of less than 0.30. In still another embodiment, the uniformity of the crosslinked ionomer coating is characterized by having a relative standard deviation of the densitometer readings of the coated microporous membrane composite material stained with methylene blue of less than 0.06.

In a modification example of the filter A1, the microporous membrane composite material can be stained with methylene blue by immersing a test sample of the microporous membrane composite material that has been cured and activated (convertible functional precursor group such as —SO$_2$F and/or COF has been converted into —SO$_3$H and/or COOH) in isopropanol (IPA) such that the microporous membrane composite material is wet. The wet test sample of the microporous membrane composite material can then be immersed in a 0.1% aqueous solution of a methylene blue dye until the staining of the surface of the test sample of the microporous membrane composite material is affected. The stained sample can then be washed sequentially with water, IPA, and water with stirring so as to remove an excess of dye from the membrane. The microporous membrane composite material stained with methylene blue can then be dried and evaluated by densitometry.

Modification examples of the filter A1 include a non-dewetting microporous membrane composite material having a crosslinked amorphous ionomer coating on the surface and pores of a porous base material wet with a solution containing methanol and water. In a modification example, the microporous membrane composite material can have a surface energy equal to or higher than $27 \times 10^{-5}$ N/cm (wet with about 80% by mass MeOH in water) or equal to or higher than $27 \times 10^{-5}$ N/cm. In a modification example, the microporous membrane composite material can have a surface energy equal to or higher than $40 \times 10^{-5}$ N/cm (wet with about 30% by mass MeOH in water). In some other modification examples, the microporous membrane composite material can have a surface energy equal to or higher than $50 \times 10^{-5}$ N/cm (wet with about 15% by mass MeOH in water). In still another modification example, the microporous membrane composite material can have a surface energy between $40 \times 10^{-5}$ N/cm and $50 \times 10^{-5}$ N/cm. The microporous membrane composite material of the modification examples that has the surface energy described above is advantageous in that the material can be directly wet with many substances for chemical treatment. Therefore, a filter containing the microporous membrane composite material can be packaged in a dry state and shipped to end users. Depending on the manufacturer, the steps of prewetting and autoclaving the filter containing the dry microporous membrane composite material may be skipped. Therefore, the manufacturing costs of the filter can be reduced, and the shipping costs of the filter can be reduced further compared to prewetted heavier hydrated filters. End users can benefit from the filter containing the dry microporous membrane composite material because they can eliminate the shipping stop time and associated costs as well as the wastes that occur due to the solvent exchange and the conditioning of a prewet filter.

In a modification example, the microporous membrane composite material maintains non-dewetting properties after being subjected to an autoclaving treatment in water. Furthermore, after the autoclaving in water, the flow time of water in the microporous membrane composite material becomes shorter than before the autoclaving in water, and the microporous membrane composite material has a coating structure that allows the material to maintain non-dewetting properties.

In a modification example, the coating including the crosslinked ionomer on the liquid contact surface of the porous base material can be characterized by spectroscopic techniques such as FTIR or by optical methods such as reflectance. For example, in a modification example, the coated porous base material is stained with a dye that shows a hydrophilic group in the coating, and a reflectance is read at various spots on the microporous membrane composite material by using a densitometer. In a modification example of the microporous membrane composite material, the crosslinked ionomer coating on the porous base material can be further characterized by the properties thereof after a chemical treatment. For example, in this treatment, isopropyl alcohol containing 5,000 parts per million (ppm) of 3 M (trademark) Novec (trademark) FC4432 as a fluorosurfactant can be allowed to flow through a sample of the microporous membrane composite material having a diameter of 47 mm at a temperature between 70° C. and 80° C. at least at a flow rate of 80 mL/min for 4 hours or longer such that the microporous membrane composite material stained with methylene blue contacts isopropyl alcohol. Then, the densitometer readings or other spectral properties of the treated coated microporous membrane composite material and the untreated coated microporous membrane composite material can be compared. In some modification examples, the coated microporous membrane composite material has densitometer readings or other characteristics (for example, FTIR transmission intensity of hydrophilic groups) in which a difference in average of characteristics between the coated microporous membrane composite material before the thermal surfactant treatment and the coated microporous membrane composite material after the same treatment is less than ±9%. In some modification examples of the microporous membrane composite material, the average of the characteristics (characteristics before and after the thermal surfactant treatment) do not vary in 95% confidence limits (CL) by the Student's t-test. In some other modification examples of the present invention, the average of the characteristics do not vary in 95% confidence limits by the Student's t-test, and a difference in average of the densitometer readings or other characteristics between the coated microporous membrane composite material before the thermal surfactant treatment and the coated microporous membrane composite material after the same treatment is less than ±9%. In some modification examples, the coated microporous membrane composite material has densitometer readings or other characteristics in which a difference in average of the characteristics between the coated microporous membrane composite material before the treatment and the coated microporous membrane composite material after the treatment is less than ±4%. In some modification examples, the average of the characteristics do not vary in 95% confidence limits, and a difference in average of the characteristics between the coated membraned before the treatment and the coated membrane after the treatment is less than ±4%.

The microporous membrane composite material, which is wettable with a solution containing a mixture of methanol and water and has non-dewetting properties, in a modification example can have high water permeability. Particularly, in a modification example, a calculated water permeability of the microporous membrane composite material, which is based on the flow time of water measured for a sample of the microporous membrane composite material having a diameter of 47 mm after the autoclaving treatment in water, can be higher than 1,000 L/atm×time×m$^2$ at 22.5° C. In a modification example, the calculated water permeability based on the flow time of water measured for the sample of the microporous membrane composite material having a diameter of 47 mm is higher than 1,200 L/atm×time×m$^2$ at 22.5° C. In another modification example, the calculated water permeability of the microporous membrane composite material, which is based on the flow time of water measured for the sample of the microporous membrane composite material having a diameter of 47 mm, is higher than 1,800 L/atm×time×m$^2$ at 22.5° C. Although the present invention is not restricted by theories, the higher water permeability and the shorter flow time accomplished in the modification examples of the microporous membrane composite material show that the surface of the microporous membrane in the modification examples has a crosslinked coating thinner than other coating films. In addition, the microporous membrane composite materials in modification examples have a crosslinked ionomer coating characterized by a relative standard deviation of the densitometer readings of the composite material stained with methylene blue of less than 0.4 and the non-dewetting properties of the composite materials based on the autoclaving test in water.

In a modification example, the fluorinated ionomers, fluorinated monomers, chain transfer agents, radical initiators, and crosslinkers disclosed in U.S. Pat. Nos. 6,902,676B and 6,576,100B can be used for coating the porous membrane. The entire content of these two patent documents is incorporated into the present specification by reference. In some modification examples, one or more kinds of —SO$_2$F and/or COF type ionomers having the same equivalent weight or different equivalent weights and a solvent are used for forming a coating solution including ionomers. In some modification examples, the solvent includes a fluorocarbon solvent. In some modification examples, the coating solution can include a solution and discrete particles of ionomers. In still another modification example, the coating solution can include discrete particles of ionomers. These coating solutions are used for coating the porous base material.

A coating solution containing small ionomer particles equal to or smaller than 200 nm can be obtained by dissolving a fluorinated ionomer or a fluorinated ionomer precursor in a fluorocarbon solvent with stirring and then performing filtration or a centrifugation treatment. The centrifugation treatment can be performed at a high speed (for example, at a speed equal to or higher than 10,000 rpm) for about 2 hours. In this way, the resulting ionomer residues are separated, and a transparent liquid composition including small ionomer particles is obtained. Depending on the fluorocarbon solvent used, a fractionating effect relating to the equivalent weight of copolymers and insoluble residues in the solution can be produced.

The resulting ionomer liquid solution provides improved coating properties in the process of coating the surface of the porous base material with the ionomer or the ionomer precursor. Particularly, such advantageous effects include the reduction of flow loss, the possibility of performing flow-through coating without clogging pores, coating of both the outer surface of the membrane and surface of the internal pores, and these result in excellent non-dewetting properties. The fluorocarbon liquid composition coating solution obtained by using the above preparation method includes a crosslinkable fluorinated ionomer. At least 90% by mass of the ionomer consists of ionomer particles having a particle size less than 200 nanometers (nm). In some modification examples, at least 90% by mass of the ionomer consists of ionomer particles having a particle size less than 125 nm. In another modification example, at least 90% by mass of the ionomer consists of ionomer particles having a particle size less than 40 nm. In still another modification example of the present invention, at least 90% by mass of the ionomer includes, consists of, or substantially consists of ionomer particles having a particle size less than 15 nm.

In some modification examples, the fluorinated ionomer or the fluorinated ionomer precursor is present in the solvent of the coating solution as colloidal particles or as gel particles suspended, dispersed, or dissolved in the solvent. The colloidal particles or the ionomer particles can have a particle size of about equal to or smaller than 200 nm. In some modification examples, the colloidal particles or the ionomer particles can have a particle size of about equal to or smaller than 40 nm. In another modification example, the colloidal particles or the ionomer particles can have a particle size of about equal to or smaller than 15 nm. The small ionomer particles minimize the clogging of pores of the porous base material and result in a microporous membrane composite material having a lower flow loss. In some modification examples, the fluorinated ionomer or the fluorinated ionomer precursor particles can have a particle size between 10 nm and 40 nm or a particle size between about 10 nm and about 40 nm. In another modification example, the fluorinated ionomer or the fluorinated ionomer precursor particles in some modification examples can have a particle size between 10 nm and 600 nm or a particle size between about 10 nm and about 600 nm.

In some modification examples, the fluorinated monomer unit can form ionomers or ionomer precursors by partially reacting with a monomer unit derived from a bis-olefin, a radical initiator, and, optionally, a chain transfer agent. These ionomers or ionomer precursors can form a cross-linked ionomer coating on the porous base material by further reacting with other bis-olefins and radical initiators. The term "ionomer" used in the claims and specification includes not only a fluorinated ionomer but also a fluorinated ionomer precursor.

In a modification example, the liquid contact surface of the porous base material is coated with the coating solution which can be the fluorocarbon liquid composition in some modification examples. The coating solution or fluorocarbon liquid composition in some modification examples can include a fluorocarbon solvent, a fluorinated ionomer or ionomer precursor particles, a radical initiator, a bis-olefin crosslinker, and, optionally, a chain transfer agent. The fluorinated ionomer includes a fluorinated monomer unit containing an ethylenic group and a functional group convertible to a hydrophilic group. The fluorinated ionomer is dissolved or dispersed in a fluorocarbon solvent, such that at least 90% by mass of the fluorinated ionomer consists of particles having a particle size which is less than 200 nanometers (nm) in some modification examples, less than 125 nm in some modification examples, less than 40 nm in another modification example, and 15 nm in still another modification example. The equivalent weight of the fluorinated ionomer is between 380 g/equivalent and 620 g/equivalent. After the liquid contact surface of the membrane support is coated with the coating solution or the fluorocarbon liquid composition, the solution or the composition is cured to convert the functional group into a hydrophilic group, and can then be activated.

Examples of the solvent, which is for the coating solution, centrifugation, and the fluorocarbon liquid composition and also called liquid fluorocarbon medium in the present specification, include solvents that solvate or disperse the fluorinated ionomer particles, the crosslinker, the radical initiator, and, optionally, the chain transfer agent and wet the porous base material. The solvent or the liquid fluorocarbon medium can include the fluorocarbon solvent and, optionally, one or more kinds of other solvents that solvate or disperse the ionomer, the crosslinker, and the radical initiator and wet the microporous membrane. Examples of the solvent or the fluorocarbon medium include, but are not limited to, Novec (trademark) HFE-7100 (methoxynonafluorobutane, surface tension $13 \times 10^{-5}$ N/cm, available from 3M (trademark) Company), Galden (registered trademark) SV90 (Perfluoropolyether, surface tension $16 \times 10^{-5}$ N/cm, available from Solvay Solexis, Inc.), and other similar fluorinated low-surface tension solvents, a combination of these, and a mixture containing these solvents. In some modification examples, the fluorocarbon liquid medium includes a methoxynonafluorobutane isomer $(CF_3)_2CFCF_2$—O—$CH_3$ and/or $CF_3CF_2CF_2CF_2$—O—$CH_3$ having, in some cases, a cumulative purity of higher than 99% w/w.

In some modification examples, the fluorocarbon liquid medium includes perfluoropolyether or consists of a mixture of perfluoropolyethers. In a modification example, the perfluoropolyether can be represented by General Formula $F_3C$—O—$[CF_2$—$CF(CF_3)$—O$]_n[CF_2$—O$]_m$—$CF_3$, wherein m and n are integers satisfying n>0 and m≥0. The perfluoropolyether each has a molecular weight between 300 amu and 600 amu and a boiling point between 20° C. and 150° C. In another modification example, the fluorinated liquid medium contains a mixture of perfluoropolyethers represented by the above formula. The mixture has a general ("average") boiling point between 55° C. and 135° C., and the average ratio between the subscripts m and n (m/n) is less than 0.05. A modification example of the liquid fluorocarbon medium composition contains a mixture of perfluoropolyethers represented by the above formula. Each of the perfluoropolyethers has a molecular weight between 400 amu and 600 amu. The mixture has a general ("average") boiling point between 80° C. and 100° C., and the average ratio between the subscripts m and n (m/n) is less than 0.05.

In some modification examples, the fluorocarbon liquid medium includes hydrogenated fluoropolyether or consists of a mixture of hydrogenated fluoropolyethers. In a modification example, the hydrogenated fluoropolyether (HFPE) can be represented by General Formula R*—O—$R_f'$—R*' (in the formula, —R* and R*' are the same as or different from each other are different from each other and independently selected between a —$C_mF_{2m+1}$ group and a —$C_nF_{2n+1-h}H_h$ group wherein m and n are integers of 1 to 3 and h is an integer equal to or greater than 1 selected to satisfy h≤2n+1, and at least one of R* or R*' is a —$C_nF_{2n+1-h}H_h$ group defined as above), and —$R_f'$ is selected from the following ones:

$$—(CF_2O)_a—(CF_2CF_2O)_b—(CF_2—(CF_2)_{z'}—CF_2O)_c—, \quad (1)$$

wherein a, b, and c are integers equal to or smaller than 10 and preferably integers equal to or smaller than 50, z' is an integer of 1 or 2, a, b, and c satisfy a≥0, b≥0, c≥0 and a+b>0; each of a and b is preferably greater than 0, and b/a is between 0.1 and 10;

$$—(C_3F_6O)_{c'}—(C_2F_4O)_b—(CFXO)_t—, \quad (2)$$

wherein X is each independently selected between —F and $CF_3$; b, c' and t are integers equal to or smaller than 10, b, c', and t satisfy c'>0, b≥0, and t≥0; b and t are preferably greater than 0, c'/b is between 0.2 and 5.0, and (c'+b)/t is between 5 and 50;

$$—(C_3F_6O)_{c'}—(CFXO)_t—, \quad (3)$$

wherein X is each independently selected between —F and $CF_3$; c' and t are integers equal to or smaller than 10, c' and t satisfy c'>0 and t≥0, t is preferably greater than 0, and CA is between 5 and 50. $R_f'$ is preferably selected between the structures (1) and (2) specifically described above.

The concentration of the ionomer or ionomer precursor in the fluorocarbon liquid composition as a coating solution applied to the porous base material is sufficient for providing an activated crosslinked coating on the surface and pores of the porous base material, such that the liquid contact surface of the microporous membrane composite material maintains non-dewetting properties by the autoclaving test and the microporous membrane composite material can be fully wet with the solution containing methanol and water. The concentration of the ionomer in this solution provides a microporous membrane composite material having a relative standard deviation of the densitometer readings of equal to or smaller than 0.4. In some modification examples, the concentration of the ionomer used in the fluorocarbon liquid composition solution for coating an inactive porous base material can be within a range of 0.1% by mass to 4% by mass or a range of about 0.1% by mass to about 4% by mass. In another modification example, the concentration of the ionomer used in the fluorocarbon liquid composition solution for coating an inactive porous base material in some modification examples can be within a range of 0.1% by mass to 3.5% by mass or a range of about 0.1% by mass to about 3.5% by mass. An ionomer concentration less than 0.25% (for example, 0.1%) is used, and the coating can be evaluated based on wettability and densitometer readings. In a case where the ionomer concentration is excessively low, a porous base material is obtained which has a hydrophobic site, is not thoroughly wet with the solution containing methanol and water, has densitometer readings yielding a relative standard deviation larger than 0.4 as necessary, and is not completely coated. In a case where the ionomer concentration, which is measured using isopropyl alcohol and calculated based on the flow time in an uncoated porous base material, is about higher than 3.5% by mass or higher than about 4% by mass, a microporous membrane composite material having a flow loss higher than 82% can be obtained.

In a modification example, the microporous membrane composite material has a thin coating including a crosslinked fluorinated ionomer. In some modification examples, a mass percentage of the coating can be 2% by mass to 50% by mass with respect to the total mass of a high-surface-area microporous membrane composite material. In another modification example, a mass percentage of the coating can be 2% by mass to 30% by mass with respect to the total mass of the high-surface-area microporous membrane composite material. In some other modification examples of the present invention, a mass percentage of coating can be 25% by mass to 30% by mass or about 25% by mass to about 30% by mass with respect to the total mass of the high-surface-area microporous membrane composite material. In another modification example, a mass percentage of the coating can be 2% by mass to 25% by mass or about 2% by mass to about 25% by mass with respect to the total mass of the high-surface-area microporous membrane composite material. The mass percentage of the coating (percentage with respect to the support and the coating) is not limited to the mass percentage of the coating disclosed herein, and can be changed according to the surface area of the porous base material. The mass percentage of the coating is selected such that a non-dewetting microporous membrane composite material is obtained which is characterized by a flow loss equal to or lower than 82% on average or equal to or lower than about 82% based on the flow time in the uncoated porous base material (based on the flow time of 500 mL of isopropyl alcohol under a pressure of about 14.2 psi (approximately 97,905 Pa)).

In some modification examples, the thickness of the crosslinked ionomer coating on the porous base material is characterized by a flow loss equal to or lower than 82% on average based on the flow time in an uncoated porous base material (based on the flow time of 500 mL of isopropyl alcohol flowing through the microporous membrane composite material under a pressure of about 14.2 psi (approximately 97905.5 Pa)). In another modification example, the thickness of the crosslinked ionomer coating on the porous base material is characterized by a flow loss equal to or lower than 46% on average based on the flow time in an uncoated porous base material (based on the flow time of 500 mL of isopropyl alcohol flowing through the microporous membrane composite material under a pressure of about 14.2 psi (approximately 97905.5 Pa)). In some other modification examples, the thickness of the thin crosslinked coating on the porous base material is characterized by a flow loss equal to or lower than 30% on average based on the flow time in an uncoated porous base material (based on the flow time of 500 mL of isopropyl alcohol flowing through the microporous membrane composite material under a pressure of about 14.2 psi (approximately 97905.5 Pa)). In another modification example, the thickness of the thin crosslinked coating on the porous base material is characterized by a flow loss in a range of 24% to 82% on average based on the flow time in an uncoated porous base material (based on the flow time of 500 mL of isopropyl alcohol flowing through the microporous membrane composite material under a pressure of about 14.2 psi (approximately 97905.5 Pa)).

The fluorinated ionomer or perfluorinated ionomer used in the coating in modification examples can be amorphous or a mixture of an amorphous ionomer and a small amount of crystalline ionomer as disclosed in U.S. Pat. No. 6,902,676B, the entire content of which is incorporated into the present specification by reference. The ionomer and ionomer precursor in modification examples can have an equivalent weight of about 380 g/equivalent to about 620 g/equivalent. In some modification examples, the ionomer and ionomer precursor can have a equivalent weight of about 400 g/equivalent to about 620 g/equivalent. In some other modification examples, the ionomer can have an equivalent weight of about 460 g/equivalent to about 600 g/equivalent or an equivalent weight between 460 g/equivalent and 600 g/equivalent. In some cases, the ionomer can have an equivalent weight distribution that is around an average equivalent weight. However, for the purposes of the claims and specification, the ionomer can be described as having a specific equivalent weight. Examples of the ionomer described as having a specific equivalent weight of 460 g/equivalent include, but are not limited to, an ionomer having an equivalent weight that is about 460 g/equivalent on average and in a range of 400 g/equivalent to 520 g/equivalent. As will be described in Examples of the present specification, while the wettability of the microporous membrane composite material is reduced as the equivalent weight of the ionomer in the coating solution decreases, the flow loss thereof rises as the equivalent weight of the ionomer increases (for example, the 2% by mass ionomer for 458 g/equivalent (flow loss 44%) in Example 6, the 2% by mass ionomer for 512 g/equivalent (flow loss 68%) in Example 5, and the 2% by mass ionomer for 597 g/equivalent (flow loss 77%) in Examples 4). Therefore, in some modification examples, the microporous membrane composite material can have a low flow loss and excellent wettability in combination in a case where an ionomer is used which has an equivalent weight in a range of about 400 g/equivalent to about 620 g/equivalent and has an equivalent weight in a range of about 460 g/equivalent to about 600 g/equivalent in some modification examples. The mass percentage of the ionomer in the coating solution can be in a range of about 0.1% to about 3.5%.

A mixture of one or more kinds of ionomers or ionomer precursors having different equivalent weights or a mixture of one or more kinds of ionomer compositions each having an equivalent weight distribution around the average equivalent weight can also be used for coating the porous base material. The ionomer or ionomer precursor can be fluorinated. A mixture or combination of a low-equivalent-weight ionomer and a high-equivalent-weight ionomer refers to, but is not limited to, a mixture of an ionomer having an equivalent weight centered at about 460 g/equivalent and an ionomer having an equivalent weight centered at about 600 g/equivalent. By using one or more kinds of ionomers together with one or more kinds of crosslinkers, one or more kinds of chain transfer agents, and one or more kinds of radical initiators, it is possible to form a thin crosslinked coating on the liquid contact surface and filtration surface of the porous base material. The equivalent weight of one or more kinds of ionomers used in the coating can be selected such that the coating is formed on an uncovered surface and pores of the inactive porous base material and a non-dewetting microporous membrane composite material wettable with a methanol-containing aqueous solution is obtained. The ionomer composition can be optionally subjected to filtration or centrifugation so as to remove ionomer particles and/or ionomer gel particles which may be present and can block or clog the pores in the inactive porous base material.

In a modification example, the ionomer is a fluorinated polymer and can include or consist of $SO_3H$ and/or COOH functional groups. In some modification examples, the fluorinated polymer includes or consists of a —$SO_3H$ group. In some modification examples, these ionomers have an equivalent weight that results in an amorphous polymer. In some modification examples, a fluorinated ionomer used for modifying the surface of a porous membrane can include a mixture of amorphous and crystalline ionomers as disclosed in U.S. Pat. No. 6,902,676B. The ionomers can consist of or include (A) monomer unit derived from or including one or more kinds of fluorinated monomers containing at least one ethylenically unsaturated group; and (B) a fluorinated monomer unit containing a functional group such as —$SO_2F$ and/or COOR and —COF convertible to a hydrophilic group [wherein R is a $C$—$C_{20}$ alkyl radical or a $C_6$-$C_{20}$ aryl radical] in such an amount that the ionomers have an equivalent weight resulting in an amorphous ionomer, in which the functional group is converted into a hydrophilic group and is preferably converted into —$SO_3H$ and/or COOH groups in a final membrane in a case where the functional group is —$SO_2F$ and/or COOR and —COF. The ionomers used in modification examples are not the ionomer represented by Formula: $[T-SO_2Y—SO_2T']^-M^+$ disclosed in U.S. Pat. No. 7,094,469B.

Fluorinated monomers of the type (A) can be selected from vinylidene fluoride (VDF); $C_2$-$C_8$ perfluoroolefins which is preferably tetrafluoroethylene (TFE); $C_2$-$C_8$ chloro- and/or bromo- and/or iodo-fluoroolefins (for example, chlorotrifluoroethylene (CTFE) and bromotrifluoroethylene); $CF_2$=$CFOR_f$ (per)fluoroalkyl vinyl ether (PAVE) [wherein $R_f$ is $C_1$-$C_6$ (per)fluoroalkyl (for example, trifluoromethyl, bromodifluoromethyl, or pentafluoropropyl); and $CF_2$=CFOX perfluoro-oxyalkyl vinyl ether [wherein X is $C_1$-$C_{12}$ perfluoro-oxyalkyl having one or more ether groups (for example, perfluoro-2-propoxy-propyl)].

Crosslinking can occur by both the ionic and radical pathways. Mixed crosslinking may also be used. In some modification examples, crosslinking occurs through the peroxy pathway. Accordingly, the ionomer contains a site of radical attack (for example, iodine and/or bromine atoms) in the chain and/or at the terminal position of the polymer. Radical crosslinking can also occur on carbon atoms of a bis-olefin in a case where the ionomer contains this unit. In some modification examples, ionic crosslinking occurs. For example, for sulphonic ionomer crosslinking, a crosslinker that can cause a reaction between two —$SO_2F$ groups can be added. See WO99/038897A, the entire content of which is incorporated into the present specification by reference. In other modification examples, the crosslinking is not ionic crosslinking, and no crosslinking occurs between two —$SO_2F$ groups or two —$SO_3H$ groups. In a modification example, the non-dewetting coating, in which the amount of ionomers coating the wall, surface, and pores of the porous base material results in an isopropyl alcohol flow loss equal to or lower than 82% as described in the present specification, is obtained by crosslinking. In a modification example, the crosslinker in the coating and fluorocarbon liquid composition is hydrophobic, contains or has no hydrophilic group, or has no crosslinking group having a sulfonyl or carbonyl-containing group (for example, those disclosed in U.S. Pat. No. 7,112,363B). In some modification examples, the crosslinker can include or consist of a bis-olefin selected from structures represented by Formulas (OF-1), (OF-2), and (OF-3) and a combination of these.

In some modification examples, the fluorinated ionomer includes 0.01 mol % to 5 mol % of a monomer unit derived from a bis-olefin of TFE unit (monomer unit derived from $CF_2$=CF—O—$CF_2CF_2SO_2F$; Formula (I): R1R2C=CH—$(CF_2)_m$—CH=CR5R6 (I) [wherein m=2 to 10 and, in some modification examples, m=4 to 8; R1, R2, R5, and R6 are the same as or different from each other or each represent H or a $C_1$-$C_5$ alkyl group]. In some modification examples, the ionomer contains iodine and/or bromine atoms derived from a fluorocarbon chain transfer agent (for example, a fluorocarbon chain transfer agent represented by Formula $R_f(I)_x$ $(Br)_y$ [wherein $R_f$ represents a fluoroalkyl, (per)fluoroalkyl, or (per)fluorochloroalkyl group having 1 to 8 carbon atoms, and x and y are integers between 0 and 2 and satisfy $1 \leq x+y \leq 2$] (for example, see U.S. Pat. Nos. 4,243,770A and 4,943,622A)) at a terminal position thereof. According to U.S. Pat. No. 5,173,553A, it is also possible to use iodine and/or bromine of an alkali or an alkaline earth metal as a chain transfer agent.

In some modification examples, in radical-type crosslinking, an ionomer is used which contains the unit of bis-olefin represented by Formula (I) and contains iodine at the terminal or terminal position of the polymer chain.

The introduction of the iodine and/or bromine atoms into the chain can be performed in a reaction mixture by adding brominated and/or iodized comonomers as a "curing site" (for example, a bromo and/or iodoolefins having 2 to 10 carbon atoms (for instance, those described in U.S. Pat. No. 4,035,565A or 4,694,045A) or iodo and/or bromofluoroalkyl vinyl ethers (those described in U.S. Pat. Nos. 4,745,165A, 4,564,662A, and EP199138B)) that is contained in the end product generally in an amount ranging from 0.05 mol to 2 mol per 100 mol of other basic monomer units.

The introduction of the comonomer of the bis-olefin represented by Formula (I) in which the number of unsaturated groups is greater than the units is advantageous because the comonomer has a function of preliminarily crosslinking ionomers during polymerization. The introduction of the bis-olefin represented by Formula (I) is advantageous in increasing the length of the main chain constituting the finally obtained coating.

In a case where the ionomer is crosslinked through a radical pathway, according to the type of the porous base material and a peroxide initiator to be used, a crosslinking or curing temperature in a range of 100° C. to 300° C. can be used for crosslinking the monomer. As a result of curing, a thin coating is bonded to the porous base material. Generally, the amount of the peroxide initiator can be in a range of 0.1% by mass to 5% by mass with respect to the ionomer. Examples of preferred radical initiators include, but are not limited to, dialkyl peroxides (for example, di-terbutyl-peroxide and 2,5-dimethyl-2,5-di(terbutylperoxy)hexane); dicumyl peroxide; dibenzoyl peroxide; diterbutyl perbenzoate; di-1,3-dimethyl-3-(terbutylperoxy)butyl carbonate, and the like). Other peroxide-based initiators are described, for example, in EP136596B and EP410351B. Typically, the amount of the bis-olefin added to the solution is about 0.1% by mass to about 5% by mass. In some modification examples, the amount is about 0.1% by mass to 3% by mass.

After the various surfaces of the porous base material (examples thereof include, but are not limited to, an outer surface, an inner surface, a filtration surface, a fluid contact surface, a pore surface, and the like) are coated with the coating solution, an excess of the coating solution having, for example, the fluorinated ionomer, the radical initiator, the fluorocarbon solvent, and the crosslinker can be removed from the inactive porous base material. The solvent can be removed from the coated porous base material. In some modification examples, crosslinking can be performed in an airtight container at a temperature of about 140° C. to about 180° C. for about 10 minutes to 60 minutes or about 60 minutes. A modification example of the present invention is a porous base material which has a crosslinked ionomer coating on the liquid contact surface and pores thereof.

The conversion of the convertible precursor group of the fluorinated ionomer into a hydrophilic group (for example, conversion of a sulfonyl group —$SO_2F$ to an acidic sulfonic acid group $SO_3H$) or activation can be performed by known methods. For example, the activation can occur by treating a porous microporous membrane as an intermediate product coated with the cured and crosslinked ionomer in an aqueous strong base such as, but is not limited to, a KOH solution with a concentration of about 10% by mass at a temperature of about 65° C. to about 85° C. for about 4 hours to about 8 hours, washing the cured and coated microporous membrane treated with the base in demineralized water, treating the cured and coated microporous membrane treated with the base in an aqueous strong acid such as, but is not limited to, 20% by mass HCl or nitric acid at room temperature for about 2 hours to about 16 hours, and finally washing the activated cured microporous membrane composite material with dimineralized water or deionized water. The conversion of —COF and/or COOR groups can be performed in the manner similar to those described above. The cured and activated porous base material coated with the ionomer or ionomer precursor disclosed in the present specification is called microporous membrane composite material in a modification example.

One modification example includes an intermediate product composite material having a high-surface-area or multilayer porous base material having a filtration surface coated with a cured fluorinated crosslinked ionomer coating having a group convertible to a hydrophilic group.

After being cured and then activated by the treatment with a strong base and a strong acid, the microporous membrane composite material can be further subjected to an extraction treatment in a solvent such as hot water at a temperature at which the porous base material remains intact. It has been found that in a case where some of the multilayer porous base materials used in modification examples are subjected to the extraction treatment in boiling water, the microporous membrane composite material undergoes delamination. In a case where a temperature lower than the boiling point of the extraction solvent was used, the multilayer microporous membrane composite material could remain intact, and the amount of extracts could be reduced. For example, the crosslinked fluorinated ionomer coating on the porous base material could be washed in hot water at a temperature ranging from about 80° C. to about 90° C. for about 30 minutes or could be washed by being treated for the time sufficient for removing undesirable residual contaminants including anions and cations from the membrane without causing the delamination of the porous base material under the coating. Modification examples include a non-dewetting multilayer microporous membrane composite material which has undergone an extraction treatment in a non-boiling solvent or undergone, in some cases, an extraction treatment in non-boiling water, remains as an intact multilayer microporous membrane composite material, and is wet with an aqueous solution containing methanol.

The outer surface of the porous membrane having a hydrophilic coating as described in the cited documents can be directly wet with water. However, in a case where the coating of the porous membrane with a coating is not wet and does not adhere to the entirety of the surface of the microporous membrane (for example, the surface of the internal pores or the outer or geometric surface of the membrane), sometimes the membrane does not maintain non-dewetting properties after the autoclaving treatment in water at 135° C.

In a modification example, the porous base material is coated with a crosslinked fluorinated ionomer coating composition or a crosslinked perfluorinated ionomer coating composition such that the surface of the porous base material, which is a liquid contact surface, and the pores of the porous base material do not have an uncovered exposed microporous membrane surface which can turn into dewetting surface after the autoclaving treatment using water at 135° C. The coating composition can be applied by various methods for coating the outer surface, which is a fluid contact surface, of the porous base material and the surface of pores. In some modification examples, permeation is exploited to coat the filtration surface or liquid contact surface of the porous base material. In another modification example, the coating is applied to the surface of the porous base material and the surface of pores. The application of a coating can be performed by a mechanical method (examples thereof include, but are not limited to, roll coating, web coating using one or more squeeze bars, and the like), pushing under pressure, and other related techniques (for example, gravity flow and pressure). By these methods, the coating material contacts and wets the pores and liquid contact surface of the microporous membrane, and the porous base material is coated with the solution containing the fluorinated ionomer. By the application of the composition including the fluorinated ionomer in a solution containing the fluorocarbon solvent, the uncovered surface of the microporous membrane is wet with a coating of an ionomer and a crosslinker. Furthermore, by the application of the coating solution to the surface and interior of the porous base material, it is possible to prepare a non-dewetting microporous membrane composite material having a flow loss structure that can change in proportion to the percentage of the ionomer in the coating solution. Although the thickness of the coating is proportional to the percentage of the flow loss, the application of the coating to the surface of the porous base material makes it possible to accomplish the task of uniformly attaching a thin crosslinked fluorinated ionomer coating to the high-surface-area porous base material.

In some modification examples, the porous base material can be patterned by masking such that uncovered portions of the surface and pores of the porous base material are coated with the ionomer and the crosslinker while other covered portions of the surface and pores of the microporous membrane are not coated with the ionomer and the crosslinker. In some modification examples, while the edge portion of the microporous membrane is not coated such that a peripheral hydrophobic membrane region is formed, the central portion of the microporous membrane is coated with the fluorinated ionomer and the crosslinker described in the present specification such that a microporous membrane composite material region wettable with a solution containing methanol and water is formed. Such a patterned microporous membrane composite material is useful, for example, as a filtration membrane having a degassing ability by which a gas can pass through the uncoated portion of the microporous membrane composite material but cannot pass through the coated portion of the microporous membrane composite material. An aqueous liquid can pass through the coated portion of the microporous membrane composite material but cannot pass through the uncoated portion of the microporous membrane composite material.

In a modification example, the microporous membrane composite material has a crosslinked coating of a fluorinated ionomer having a hydrophilic group on the liquid contact surface and the filtration surface of the porous base material (that is, the pore surface and the outer geometric surface). The coating of the crosslinked ionomer on the liquid contact surface of the matrix material mainly constituting the microporous membrane composite material allows the coated surface to have dewetting properties (after autoclaving in water at 135° C.) and enables the coated surface to be wet with a mixture of water and methanol. The ionomer coating on the surface of the porous base material can be bonded by crosslinking or by mechanical bonding, physical bonding, chemical bonding, or any combination of these by curing.

The crosslinked ionomer coating on the porous base material prevents the microporous membrane composite material from becoming a dewetting material in a case where a gas generating liquid is filtered. The crosslinked ionomer coating promotes uniform filtration and uniform non-dewetting properties in the entirety of a filter device including the microporous membrane composite material in a modification example. The crosslinked ionomer coating on the porous base material in a modification example can be measured or characterized by methylene blue dye staining, the relative standard deviation of densitometer readings of equal to or smaller than 0.4, and the non-dewetting behavior of the microporous membrane composite material after autoclaving in water. The composition including the ionomer and the crosslinker in a modification example is used in an amount and at a concentration determined by measuring the percentage of flow loss or the flow time taken for purified water or isopropyl alcohol to flow through the microporous membrane composite material, such that the porous base material is substantially not blocked or clogged. Regarding the microporous membrane composite material, the average flow loss of several microporous membrane composite material samples is equal to or lower than 82% based on the average flow time of the uncoated microporous support and the average flow time of the microporous membrane composite material. In another modification example, the average flow loss of several microporous membrane composite material samples is equal to or lower than 60% based on the average flow time of the uncoated microporous support and the average flow time of the microporous membrane composite material. In still another modification example, the average flow loss of several microporous membrane composite material samples is equal to or lower than 50% based on the average flow time of the uncoated microporous support and the average flow time of the microporous membrane composite material. In yet another modification example, the average flow loss of several microporous membrane composite material samples is equal to or lower than 40% based on the average flow time of the uncoated microporous support and the average flow time of the microporous membrane composite material. In a case where the percentage of the flow loss of the microporous membrane composite material is further reduced, it is possible to use a smaller membrane and to prepare a smaller filtering device. As a result, costs and the space for storing such a filter are reduced.

In order to characterize the coating bonded to the porous base material, flow loss characteristics are used. In addition, the coating modifying the microporous membrane composite material can be characterized by optical methods. The relative standard deviation of the optical readings obtained from the microporous composite material can be related to the uniformity of the coating. In some modification examples, the coating uniformity has a measured relative standard deviation of the optical readings of equal to or smaller than 0.4. For example, in a modification example, the crosslinked ionomer coating on the porous base material is characterized in that the average of densitometer readings of the coated microporous membrane composite material stained with methylene blue has a relative standard deviation equal to or smaller than 0.4. In some modification examples, the crosslinked ionomer coating on the porous base material is characterized in that the average of the densitometer readings of the coated microporous membrane composite material stained with methylene blue has a relative standard deviation equal to or smaller than 0.3. In another modification example, the crosslinked ionomer coating on the porous base material is characterized in that the average of the densitometer readings of the coated microporous membrane composite material stained with methylene blue has a relative standard deviation equal to or smaller than 0.06. A smaller relative standard deviation of the densitometer readings shows that the microporous membrane composite material has a more uniform coating, which makes it possible to more effectively use the area of the microporous membrane composite material during the filtration of a gas generating fluid.

The porous base material can be formed of a polymer or thermoplastic substance that is chemically inert to the curing and activation steps in the coating treatment. In some modification examples, the porous base material polymer is polyfluorocarbon or polyperfluorocarbon that is chemically inert to the curing and activation steps in the coating treatment. Examples of the porous base material that can withstand the curing and activation steps can include, but are not limited to fluorine-containing polymers such as polytetrafluoroethylene (PTFE), fluorinated ethylene-propylene (FEP) copolymers, copolymers of tetrafluoroethylene and perfluoropropyl vinyl ether copolymers (PFA, also referred to as perfluoroalkoxy polymer), copolymers of tetrafluoroethylene and perfluoromethyl vinyl ether (MFA), and polymer compositions including any of these. The porous base material can be formed, for example, of polytetrafluoroethylene. Examples of fluorinated ethylene-propylene copolymers or perfluoroalkoxy polymers include a group of fluoropolymers, which are generally known as fluorocarbons marketed by E. I. Dupont de Nemours and Company, Inc. under the names of Teflon(registered trademark) PTFE, Teflon(registered trademark) FEP, and Teflon(registered trademark) PFA, or amorphous Teflon (registered trademark) polymers (for example, a Teflon(registered trademark) AF polymer). Examples of other fluorocarbons for the porous base material include, but are not limited to, fluorocarbons available from DAIKIN INDUSTRIES, Ltd. such as Neoflon(registered trademark)-PFA and Neoflon(registered trademark)-FEP or various grades of Hyflon (registered trademark)-PFA and Hyflon (registered trademark)-MFA available from solvay Solexis, Inc. Fluoropolymers have excellent chemical and heat resistance and are generally hydrophobic. Expanded porous polytetrafluoroethylene (ePTFE) polymers have excellent strength properties. Therefore, various forms of expanded porous polytetrafluoroethylene can be used as a porous base material in modification examples, because the polymer is useful as a filter medium for organic solvents to be used in harsh chemical environments.

For purposes of the present specification and claims, the term "porous base material" includes porous membranes that can also be described by the terms such as "ultraporous membrane", "nanoporous membrane", and "microporous membrane". Such a microporous membrane retains a feed stream component (retentate) that is larger than the pores of the microporous membrane (examples of the retentate include, but are not limited to, gels, particles, colloids, cells, poly-oligomers, and the like). In contrast, the components larger than the pores of the microporous membrane pass through the pores and enter a permeate stream. The feed stream component retentivity of the microporous membrane can depend on the operation conditions (for example, the surface velocity and the use of a surfactant) and on the size and structure of particles relative to the size, structure, and distribution of pores of the membrane.

A porous medium is useful in many separation and adsorption techniques (for example, filtration). The microporous membrane, which is a certain type of porous medium, is used for various purposes. The microporous membrane can be described as having a first porous surface, a second porous surface, and a continuous porous structure extending throughout the membrane from the first porous surface to the second porous surface. The continuous porous structure includes a matrix as a main material and a network of pores. The interface separating the main matrix from the pore volume (for example, the surface of the internal pore network) can be referred to as interstitial surface.

Examples of the microporous membrane useful as a porous support in a modification example include a microporous membrane capable of forming a microporous membrane composite material, which has an isopropyl alcohol flow loss equal to or lower than 82% of the isopropyl alcohol flow loss of an uncoated porous base material, by being coated. In some modification examples, the porous base material can have a pore size that can be equal to or smaller than 10 micrometers. In another modification example, the pore size of the porous base material can be equal to or smaller than 0.45 micrometers. In some other modification examples of the present invention, the pore size of the porous base material can be equal to or smaller than 0.2 micrometers. In some other modification examples of the present invention, the pore size of the porous base material can be equal to or smaller than 0.1 micrometers. In another modification example, the pore size of the porous base material can be in a range of about 0.001 micrometers to 0.45 micrometers. In still another modification example, a rated pore size of the porous base material can be in a range of about 0.005 micrometers to about 0.1 micrometers. In some modification examples, the porous base material can be characterized by molecular weight cut off (MWCO) and can include a membrane having a MWCO of about 2 kDa (1 kDa=1000 g/mol) to about 20,000 kDa. A microporous membrane having a smaller pore size can retain smaller particles in a liquid by sieve retention, compared to a microporous membrane having a larger pore size. The porous base material can have a total thickness. The microporous membrane includes one or more retention layers and, optionally, one or more supporting layers such that the total thickness of the microporous membrane can be in a range of about 4 micrometers to about 75 micrometers and, in some modification examples, can be in a range of about 14 micrometers to about 25 micrometers. Pressure reduction is smaller in a thinner porous base material than in a thicker microporous membrane. In some modification examples, the porous base material has a multilayer structure including one or more retention layers and one or more supporting layers. In some modification examples, the multilayer porous base material is a microporous PTFE membrane having a pore size of 0.1 micrometers; in some modification examples, the multilayer microporous membrane is a microporous PTFE membrane having a pore size of 0.05 micrometers; in some modification examples, the multilayer microporous membrane is a microporous PTFE membrane having a pore size of 0.03 micrometers; and in some modification examples, the multilayer membrane is a microporous PTFE membrane having a pore size of 0.02 micrometers. The multilayer PTFE composite material membrane is available from Gore & Associates, Inc. and is described in U.S. Pat. No. 7,306,729B and US2007/0012624A. The entire content of these documents is incorporated into the disclosure of the present specification by reference. Membranes having a smaller rated pore size have better sieving retentivity for obtaining only small particles, and are advantageous for being used in manufacturing environments of chemicals, semiconductors, and medicines and other industrial manufacturing environments in which the treatment purity and treatment yield of particles, gels, colloids, and the like can be reduced.

The rated pore size, nominal pore size, or pore size of the coated microporous support In a modification example can be mentioned regarding the microporous membrane characterized by the method disclosed in U.S. Pat. No. 7,306,729B. The entire content of the US patent specification is incorporated into the present specification by reference. In some cases, the rated pore size, nominal pore size, or pore size of the microporous support means that the microporous support retains at least 90% or more of the particles which have the pore size of the membrane or MWCO or retains at least 90% or more of the particles which are larger than the pore size of the membrane or have a molecular weight larger than MWCO. In some modification examples, the rated pore size, nominal pore size, or pore size of the microporous support means that the microporous support retains at least 99% or more of the particles which have the pore size of the membrane or MWCO or retains at least 99% or more of the particles which are larger than the pore size of the membrane or have a molecular weight larger than MWCO. Retentivity can be measured by an optical method or by analyzing retentate and permeate particles after solvent evaporation by using an electron microscope.

The porous membrane base material or porous membrane support is formed of a polymer composition which is chemically inert, is not solvated or decomposed by the solvent for the fluorocarbon polymer composition, and is not decomposed by the conditions and reagents used for the curing and activation of the amorphous fluorinated coating on the porous base material. The porous base material can have any appropriate geometric shape (including shapes of a flat sheet, a corrugated or pleated sheet, hollow fibers, and the like). The porous base material can be supported by a web, net, cage, or the like, or can be unsupported. The porous base material can be isotropic or anisotropic, skinned or unskinned, or symmetric or asymmetric material, or has characteristics as a combination of any of these. Alternatively, the porous base material can be a composite membrane including one or more retention layers and one or more supporting layers. In some modification examples, the porous base material has a large surface area due to the small pore size ratings of one or more retention layers, and has one or more porous supporting layers as necessary. In some modification examples, the high-surface-area membrane has a retention layer having a pore size less than 0.45 micrometers and one or more supporting layers. In a modification example, the porous base material can have an asymmetric structure overall because a porous supporting layer is on either of the sides of one or more microporous retention layers.

In some modification examples, not only the porous base material, but also the microporous membrane composite material has a surface area equal to or greater than 10 $m^2/g$ per mass. In some modification examples, the porous base material has a surface area equal to or greater than 20 $m^2/g$ per mass. The surface area of the porous membrane support and microporous membrane composite material can be measured by the BET method as disclosed in U.S. Pat. No. 7,306,729B, the entire content of which is incorporated into the present specification by reference. The porous base material with a higher surface area can result in a microporous membrane composite material with a higher surface area having not only a higher ion exchange capacity, which is advantageous for the microporous membrane composite material to be used for purification, but also the improved wettability.

The non-dewetting properties of the porous base material having the crosslinked ionomer coating in a modification example can be measured by heating a sample of the microporous membrane composite material wet with a liquid to a temperature higher than the boiling point of the liquid in an autoclave. In a case where the sample of the microporous membrane composite material has non-dewetting properties, the sample remains wet and semitransparent after the autoclaving treatment. For example, in a modification example, a non-dewetting microporous membrane composite material refers to a microporous membrane composite material which does not become a dewetting material in a case where the material is subjected to an autoclaving treatment in water for 40 minutes to 60 minutes or about 60 minutes at a temperature of about equal to or higher than 135° C. The sample of the microporous membrane composite material can be prepared as a sample for autoclaving test by wetting the sample with a solution containing methanol and water first and then exchanging the solution of methanol and water with water by means of washing with running water. The sample obtained by the exchange with water can be subjected to the autoclaving treatment in a sealed container containing water in an oven. In a case where the porous base material is not thoroughly coated with the crosslinked ionomer, and the incompletely coated sample is subjected to the autoclaving treatment in water, the incompletely coated sample turns into a dewetting material after the autoclaving treatment and thus appears nontransparent. The non-dewetting properties are different from the measured value of contact angle showing the surface energy of a microporous membrane, because the non-dewetting properties are not only the wetting properties of the outer surface of the microporous membrane but also the wetting properties of the entirety of the microporous membrane in the thickness direction as well as pores, that is, the wetting properties of the entirety of the liquid contact surface and the filtration surface of the membrane.

A modification example of the microporous membrane composite material is wet with a solution containing methanol and water, and the microporous membrane composite material is not directly wet with water. The term "wettable" or "wettability" is used to describe a dry microporous membrane composite material in which a solution containing methanol and water or a solution substantially consisting of methanol and water immediately soaks into and/or is immediately absorbed into substantially the entirety of the coated microporous structure within about 5 seconds without using heat, pressure, mechanical energy, a surfactant, or other prewetting agents. Even though the microporous membrane composite material in a modification example has a crosslinked ionomer coating including a hydrophilic group, and the microporous membrane composite material maintains non-dewetting properties after the autoclaving treatment using water, the material is not directly wettable with water. Wettability can be measured by dropping a drop of the solution of methanol and water directly onto a portion of the sample of the microporous membrane composite material from a height of about equal to or smaller than 5 cm. Then, the time taken for the liquid droplet to permeate the pores of the sample is measured. In a case where the liquid droplet permeates the pores of the sample within 5 seconds, and the sample appears transparent, the sample is regarded as being wet with the liquid droplet of the solution of methanol and water. In a case where the liquid droplet does not permeate the sample of the microporous membrane composite material, a solution of methanol and water that contains methanol at a higher mass percentage is used for retesting the sample. In some modification examples, the microporous membrane composite material can be wet with a solution of methanol and water that contains methanol at a proportion equal to or lower than 95% by mass. In some modification examples, the microporous membrane composite material can be wet with a solution of methanol and water that contains methanol at a proportion equal to or lower than 80% by mass. In another modification example, the microporous membrane composite material can be wet with a solution of methanol and water that contains methanol at a proportion equal to or lower than 50% by mass. In still another modification example, the microporous membrane composite material can be wet with a solution of methanol and water that contains methanol at a proportion equal to or lower than 30% by mass. In yet another modification example, the microporous membrane composite material can be wet with a solution of methanol and water that contains methanol at a proportion higher than 0% by mass and equal to or lower than 20% by mass. In another modification example of the present invention, the microporous membrane composite material can be wet with a solution of methanol and water that contains methanol at a proportion of 20% by mass to 60% by mass with respect to water. In still another modification example of the present invention, the microporous membrane composite material can be wet with a solution of methanol and water that contains methanol at a proportion of 20% by mass to 30% by mass with respect to water. In a case where the microporous membrane composite material is wet with the solution of methanol and water that contains a smaller amount of methanol, the material has higher surface energy and more resistant to dewetting. The surface tension of various solutions of methanol and water is disclosed in FIG. 3 of U.S. Pat. No. 6,835,480B, which is incorporated into the present specification by reference. Based on FIG. 3 in the reference document, for the mass percentages of methanol in water, which are approximately 80% by mass, 50% by mass, 25% by mass, and 10% by mass, the corresponding surface tensions of the solutions are approximately $27 \times 10^{-5}$ N/cm, $32 \times 10^{-5}$ N/cm, $43 \times 10^{-5}$ N/cm, and $55 \times 10^{-5}$ N/cm respectively.

The microporous membrane composite material in a modification example that is wettable with the solution of methanol and water can be used for aqueous filtration. In this case, an aqueous liquid can smoothly flow through the microporous membrane composite material without causing dewetting of the membrane. "Aqueous liquid" means liquids including water and water-based liquids (for example, various aqueous products used in the semiconductor industry (examples thereof include, but are not limited to, SC1 or SC2 cleaning baths, concentrated sulfuric acid that contains or does not contain oxidants (for example, hydrogen peroxide or ozone), other water-based liquids that need to be filtered (for example, aqueous solutions of salts (buffered oxide etching solutions) and aqueous solutions of bases or acids).

The crosslinked perfluorinated ionomer coating on the microporous membrane can be characterized by absorption, transmission, or reflection spectroscopy (for example, FTIR spectroscopy, solid state NMR, or UV/VIS spectroscopy). In some modification examples, densitometry is used to characterize the microporous membrane composite material having been stained with a methylene blue dye as described in the present specification. A reflection densitometer is an instrument used for measuring the optical density of a surface, and is sensitive or responsive to light reflected from a surface. The intensity of the reflected light can be used to measure the density of a stain or ink on a substrate such as the microporous membrane composite material. The darker the color of a surface, the higher the optical density. Accordingly, a black surface has a density higher than that of a gray surface, and a dark yellow surface has a density higher than that of a pale yellow surface.

Densitometer readings are taken at any spot or in any region on the microporous membrane composite material stained with methylene blue, or taken at a spot or in a region on a grid on the microporous membrane composite material stained with methylene blue.

In some modification examples, in a case where an average of densitometer readings is determined by a treatment of causing an isopropyl alcohol solution containing 5,000 parts per million (ppm) of 3M (trademark) Novec (trademark) FC4432 fluorosurfactant to flow for 4 hours or longer through samples of the microporous membrane composite material stained with a methylene blue dye having a diameter of 47 mm at a temperature between 70° C. and 80° C. at least at a flow rate of 80 mL/min and in some cases at a flow rate of about 100 mL/min to about 120 mL/min such that the solution contacts the samples and then taking densitometer readings from the microporous membrane composite material stained with the methylene blue, an average of densitometer readings of the microporous membrane composite material determined by the densitometer readings of the samples of the microporous membrane composite material stained with a methylene blue dye is within a range of the average of densitometer readings determined by the above treatment ±9%.

In another modification examples, in a case where a treatment is performed in which isopropyl alcohol containing 5,000 parts per million (ppm) of 3M (trademark) Novec (trademark) FC4432 fluorosurfactant is caused to flow for 4 hours or longer through samples of the microporous membrane composite material stained with a methylene blue dye having a diameter of 47 mm at a temperature between 70° C. and 80° C. at least at a flow rate of 80 mL/min such that the isopropyl alcohol contacts the samples, the average of densitometer readings of the samples of the microporous membrane composite material stained with methylene blue and the average of densitometer readings of the same samples of the microporous membrane composite material stained with a methylene blue dye after the aforementioned treatment do not vary in 95% confidence limits by the Student's t-test.

Some modification examples of the coated microporous membrane composite material stained with methylene blue have the average of densitometer readings or other characteristics (for example, FTIR transmission intensity of a hydrophilic group) in which there is a difference less than ±4% between the average of the characteristics of the coated microporous membrane composite material before the treatment and the average of the readings after the treatment in a hot isopropyl alcohol bath containing 5,000 parts per million (ppm) of a fluorosurfactant described above. In some modification examples, the average before and after the treatment does not vary in 95% confidence limits (CL). In some modification examples, the average does not vary in 95% CL, and the difference in average characteristics between the microporous membrane composite material before the treatment and the microporous membrane composite material after the treatment in hot isopropyl alcohol containing 5,000 parts per million (ppm) of a fluorosurfactant is less than ±4%.

As long as the microporous membrane composite material is not exposed for a time long enough for the microporous membrane composite material to be dried, the coating bonded to the surface of the porous base material prevents the dewetting of the membrane while the microporous membrane composite material is being exposed to a gas (for example, air). While being used in the filtration treatment (for example, in the process of replacing the liquid to be filtered), the filter can be exposed to air under a small differential pressure across the filter. Furthermore, the microporous membrane composite material in a modification example is particularly useful for filtering chemically active aqueous liquids (for example, acids or bases) (including aqueous liquids that can contain a gas generating oxidant or a dissolved gas at a high concentration). In these examples, both the porous base material and the crosslinked ionomer composition are highly resistant to chemical decomposition, minimize flow loss, and provide a non-dewetting microporous membrane composite material.

The microporous membrane composite material in a modification example can be used in various constitutions together with various supports in a filtering device. By being pleated together with one or more supporting layers or nets and packed using a cage, a support, and an end cap structure, the microporous membrane composite material can form various filter cartridges. The cartridges may be replaceable and may be stored in and combined with a housing. In a case where the microporous membrane composite material is hollow fiber, one or more strands of the hollow fiber can be packed to form a device.

(Filter A2)

The filter A2 contains a copolymer having a repeating unit based on tetrafluoroethylene and another repeating unit (a repeating unit other than "repeating unit based on tetrafluoroethylene"). Hereinafter, the filter A2 will be described, but the details common to the filter A1 will not be described. In other words, the matters that are not described in the following section are the same as those of the filter A1.

The copolymer having a repeating unit based on tetrafluoroethylene and another repeating unit is not particularly limited, and examples thereof include a tetrafluoroethylene-perfluoro(alkyl vinyl ether) copolymer (poly(PTFE-CO-PFVAE)), a tetrafluoroethylene-hexafluoropropylene copolymer (FEP), a mixture of these, and the like. PFA Teflon (registered trademark) is an example of the tetrafluoroethylene-perfluoro(alkyl vinyl ether) copolymer in which alkyl is mainly or completely a propyl group. FEP Teflon (registered trademark) is an example of the tetrafluoroethylene-hexafluoropropylene copolymer. Both of these are manufactured by DuPont. Neoflon (trademark) PFA (DAIKIN INDUSTRIES, LTD.) is a polymer similar to PFA Teflon (registered trademark) from DuPont. U.S. Pat. No. 5,463,006A describes a tetrafluoroethylene-perfluoro(alkyl vinyl ether) copolymer in which the alkyl group is mainly methyl. As a polymer, Hyflon(registered trademark) poly (PTFE-CO-PFVAE) 620 available from Ausimont USA, Inc. in Thorofare, N.J. is preferable.

It has been found that saturated low-molecular-weight polymers of chlorotrifluoroethylene are solvents effective for poly(PTFE-CO-PFVAE), PFA, and FEP polymers. As the solvent, HaloVac (registered trademark) 60 manufactured by Halocarbon Products Corporation in River Edge, N.J. is preferable.

In a case where the filter A2 contains a copolymer having a repeating unit based on tetrafluoroethylene and another repeating unit, the pore size, the pore structure, and the like thereof are not particularly limited. Typically, the filter A2 is preferably a membrane formed using hollow fibers prepared by the method described below. Hereinafter, a method for manufacturing hollow fibers that can be used for the filter A2 according to the above embodiment will be described.

A hollow fiber porous membrane is a tubular filament having outer and inner diameters and a porous wall thickness therebetween. The inner diameter defines the hollow portion of the fiber, and is used for transporting either a liquid, that is, a feed stream supposed to be filtered through the porous wall or a permeate in a case where the filtration is performed on the outer surface. The inner hollow portion is sometimes called lumen.

The outer or inner surface of the hollow fiber membrane can be skinned or unskinned. The skin is a thin and dense surface layer that is integrated with the base material of the membrane. In the case of skinned membrane, most of flow resistance in the membrane occurs in the thin skin. The skin of the surface may include pores that establish a continuous porous structure of the base material or may be a non-porous complete film. Asymmetry relates to the uniformity of the pore size in the thickness direction of the membrane. In the case of hollow fiber, asymmetry is found in the porous wall of the fiber. An asymmetric membrane has a structure in which the pore size is plotted as a function of position in a cross section. Another method of defining asymmetry is the ratio of the pore size on one surface to the pore size on the opposite surface.

As a material, a copolymer having the repeating unit based on tetrafluoroethylene described above and another repeating unit can be used. A synthetic polymer is a type of material that is most generally used. The most important type of synthetic polymer is a thermoplastic polymer which can flow and be molded by heating and can restore the original properties thereof as a solid by cooling. As the conditions under which the membrane is used become more strict, the materials that can be used are also limited further. For example, organic solvent-based solutions used for wafer coating in the microelectronics industry dissolve or swell and weaken the most common polymer membrane. The hot stripping bath in the same industry consists of highly oxidizing compounds having high acidity, which destroy the membranes consisting of common polymers. In contrast, perfluorinated thermoplastic polymers such as tetrafluoroethylene-perfluoro(alkyl vinyl ether) copolymers (Poly (PTFE-CO-PFVAE)) or tetrafluoroethylene-hexafluoropropylene copolymers (FEP) are not affected by the strict usage conditions. Therefore, the membranes consisting of these polymers are markedly more advantageous compared to ultrafiltration membranes made of polymers having low chemical and thermal stability. These thermoplastic polymers are more advantageous than polytetrafluoroethylene (PTFE) that is not thermoplastic. That is, these thermoplastic polymers are or can be molded by a standard process such as extrusion molding. In a case where the process of the present invention is used, it is possible to manufacture a hollow fiber membrane having a diameter smaller than a diameter that can be obtained using PTFE. In a compact device used in outer space, a smaller diameter is useful.

Being chemically inert, the poly(PTFE-CO-PFVAE) or FEP polymer is difficult to be molded into a membrane by using typical solution casting methods. These polymers can be made into a membrane by using a thermally induced phase separation (TIPS) process. In an example of the TIPS process, a polymer and an organic solvent are mixed together and heated in an extruder to a temperature at which the polymer dissolves. The membrane is molded by extrusion through an extrusion die, and the extruded membrane is cooled to form a gel. In the process of cooling, a polymer solution is cooled to a temperature equal to or lower than the upper critical consolute temperature. The temperature equal to or lower than the upper critical consolute temperature is a temperature equal to or lower than a temperature at which two phases are generated from a homogeneous heated solution. One of the two phases is mainly a polymer, and the other phase is mainly a solvent. In a case where the above process is appropriately carried out, the solvent-rich phase obtains porosity in which pores continuously interconnected to one another. Then, the solvent-rich phase is extracted, and the membrane is dried.

One of the advantages of the membrane used for purposes accompanying contact is that because the surface tension of the perfluorinated polymer is extremely low, a liquid having a low surface tension can be used. For example, sometimes highly corrosive developers used in the semiconductor manufacturing industry contain additives such as surfactants that reduce surface tension. These developers cannot be degassed with typical porous membranes, because the liquid permeates pores at the working pressure, is transmitted, and causes solution loss or unnecessary evaporation. In addition, the liquid that fills up the pores excessively increases the mass transfer resistance for gas transport. U.S. Pat. No. 5,749,941A describes why the conventional hollow fiber membrane made of polypropylene or polyethylene cannot be used for the absorption of carbon dioxide or hydrogen sulfide into an aqueous solution containing an organic solvent without using a solution additive for preventing leakage. Although the PTFE membranes function in such applications because they have a low surface tension, it is difficult to process the membranes into hollow fibers. The membrane of the present invention consists of a polymer having surface tension characteristics similar to those of PTFE, and is more easily processed into a hollow fiber membrane having a small diameter.

The ultrafiltration membrane is manufactured mainly as a skinned asymmetric membrane, because such a membrane has an advantage in that the structure thereof has small pores necessary for effectively retaining solutes, but the permeation speed thereof is high. In the case of skinned asymmetric membrane, the pores necessary for retaining solutes occur only in the skin of the surface. In a case where the length of the pores, that is, the thickness of the skin is reduced, the high flow resistance inherent to the pores having a diameter generally found in ultrafiltration membranes is offset. This is a big difference with the microporous membrane. Usually, the microporous membrane is unskinned, and has a symmetric pore structure in the cross section of the membrane. For a membrane having a uniform pore size along the entire thickness direction of the membrane, the larger pore size of the microporous membrane is sufficient to have a permeation speed that can be economically achieved. The permeation speed is extremely low in a membrane which has a pore size of an ultrafiltration membrane that is symmetrical in the film thickness direction. Likewise, the mass transfer resistance increases in a contactor membrane having the same pore size as that of the ultrafiltration membrane, unless the contactor membrane is prepared as an asymmetric skinned membrane having small pores only in the skin.

An asymmetric skinned hollow fiber used mainly has skin on the lumen thereof. Hereinafter, such a membrane and a manufacturing process thereof will be described. The process that will be described below is also suitable for manufacturing an asymmetric hollow fiber membrane provided with skin on the outside thereof. The inventors of the present method have found that by extremely shorten the air gap, that is, the distance between the tip outlet of a die and the surface of a cooling bath, it is possible to control the thickness of skin formed in a case where a solvent evaporates from the outer surface. The conventional microporous poly(PTFE-CO-PFVAE) or FEP membrane prepared by the TIPS method needs to be extruded through the air gap. The poly(PTFE-CO-PFVAE) or FEP membrane prepared by the TIPS process is disclosed in U.S. Pat. Nos. 4,902,456A, 4,906,377A, 4,990,294A, and U.S. Pat. No. 5,032,274A. In U.S. Pat. Nos. 4,902,456A and 4,906,377A, the membrane has a dense surface in which crack-like openings or pores are spaced apart, that is, are present as individual pores or present as several continuous pores. U.S. Pat. Nos. 4,990,294A and 5,032,274A disclose the use of a membrane covered with a solvent which dissolves the molded membrane as the solvent exits the die. In one example, a sheet-like membrane is stretched in a lateral axis direction. It has been found that in a case where the solvent rapidly evaporates at a high extrusion temperature, skin is formed on the membrane, and the porosity of the surface is difficult to control. To solve the problem of the formation of skin, the inventors used a solvent coating method or post-stretching. With this method, the problem of dense skin or crack-like opening is solved by carefully adjusting the air gap to an extremely short distance which is preferably about equal to or shorter than 0.5 inches, and thus thin skin having a uniform surface structure is formed.

Therefore, it is desirable that the filter A2 has an asymmetric hollow fiber membrane that functions for an extremely corrosive liquid or gas and can be used for a liquid having a surface tension equal to or higher about 20 mN/m.

According to the following method, first, an asymmetric hollow fiber porous membrane having at least one skinned surface consisting of a perfluorinated thermoplastic polymer, particularly, tetrafluoroethylene-perfluoro(alkyl vinyl ether) copolymer (poly(PTFE-CO-PFVAE)) or a tetrafluoroethylene-hexafluoropropylene copolymer (FEP), more specifically, an ultrafiltration membrane and a contactor membrane are provided. These membranes can function in chemically harsh environments that have not been disclosed in citable articles. These membranes have a low surface tension. Therefore, the membranes can be used as a contactor with a liquid having a surface tension lower than that of water.

A manufacturing process of these membranes will be described. This process is based on a thermally induced phase separation (TIPS) method for manufacturing porous structures and membranes. First, a mixture of polymer pellets, which are preferably crushed in a size smaller than the size of pellets generally supplied by the manufacturer and crushed in a size of about 100 to about 1,000 micrometers and preferably about 300 micrometers, and a solvent such as a chlorotrifluoroethylene oligomer is mixed until the mixture turns into a paste or shows paste-like consistency. The amount of the polymer with respect to the mixture is about 12% by mass to 75% by mass and preferably 30% by mass to 60% by mass. The solvent is selected such that a membrane is formed not by solid-liquid separation but by liquid-liquid separation in a case where the solution is extruded and cooled. As the solvent, a saturated low-molecular-weight polymer of chlorotrifluoroethylene is preferable. As the solvent, HaloVac (registered trademark) 60 manufactured by Halocarbon Products Corporation in River Edge, N.J. is preferable. The solvent to be selected is determined based on the ability of a solvent that forms a solution at an upper critical consolute temperature by dissolving the polymer by heating but does not excessively boil at the temperature. The extrusion of fibers is called spinning, and the length of the extruded fibers from the outlet of a die to a winding position is called the spinning line. The paste is metered and then supplied into a barrel of an extruder heated to a temperature equal to or higher than the upper critical consolute temperature such that dissolution occurs. Next, the homogeneous solution is extruded from the annular die directly into a liquid cooling bath without passing through the air gap. The liquid cooling bath is kept at a temperature equal to or lower than the upper critical consolute temperature of the polymer solution. For the bath, it is preferable to use a liquid that does not dissolve the thermoplastic polymer even at the extrusion temperature. By cooling, the heat-molded solution undergoes phase separation, and gel-like fibers are generated. In order to perform vertical spinning, that is, in order that the spinning line tilts downwards along the direction of a free-falling object, the tip of the die is slightly bent down. In horizontal spinning, a specially designed die is used in a case where the spinning line is taken out directly in a horizontal position and is kept more or less flat at least up to a first guide roll. The die is firmly fixed to an insulating wall such that the tip of the die passes through the opening having a liquid tight seal and penetrates the wall of an insulator. A trough for cooling the liquid stream is put in a recess on the opposite side of the insulating wall by a method of keeping the outlet of a projection portion of the die immersed in the trough. The cooling liquid flows through the trough, causes the outlet of the projection portion of the die to be immersed into the stream of the cooling liquid, and overflows where the trough is not deep enough. In both the vertical and horizontal methods, a booster heater and a temperature control unit are used for the purpose of easily raising the temperature of the solution at the tip of the die so as to prevent rapid cooling. In the subsequent steps, the solvent for dissolution is removed by extraction, and the hollow fiber membrane formed in this way is dried with restraint so as to prevent the membrane from shrinking or breaking. The dried fibers may be subjected to heat setting at 200° C. to 300° C.

U.S. 60/117,852A filed on Jan. 29, 1999, which is incorporated into the present specification by reference, discloses a manufacturing process of a hollow fiber microporous membrane using a die with a tip that is immersed in a bath so as to prevent a solvent from rapidly evaporating from the outer diameter of the hollow fiber. The rapid evaporation of the solvent resulted in an increase in the polymer concentration on the surface, and thus dense skin was formed. The dense skin adversely affected the properties of the microporous membrane. In the disclosed process, about 12% to about 35% of a polymer solution was used in the manufacturing process of the membrane. It has been found that with a solution having a concentration higher than about 35%, it is possible to manufacture a useful microporous membrane that does not have an extremely low porosity. Furthermore, in the disclosed process, while the hollow fiber microporous membrane is being extruded, the liquid is also pushed into the lumen of the membrane. The fluid in the lumen is necessary for controlling the porosity of a hollow fiber membrane by preventing a course in which the solvent rapidly evaporates from the surface of an extrudate, the polymer concentration on the surface thus increases, and then skin is formed.

In the following manufacturing method, the control of solvent evaporation from at least one surface of the hollow fiber that comes out of the tip of the die, a solid solution with higher polymer solid contents, and a immersion extrusion process are combined so as to manufacture an asymmetric hollow fiber porous membrane having at least one skinned surface, more specifically, an ultrafiltration membrane and a contactor membrane from perfluorinated thermoplastic polymer. It has been found that the polymer concentration required for manufacturing the intended suitable membrane described above is about 12% to about 75% and preferably about 30% to about 60%. Furthermore, in a suitable example in which skin is formed on the inner surface, the liquid in the lumen is replaced with a fluid and preferably with a gas that does not hinder the evaporation of the solvent. In a case where the lumen has no liquid of the above invention, as soon as the fiber comes out of the die, the overheated solvent evaporates from the inside of the lumen. The loss of the solvent causes an apparent increase in solid concentration on the surface of the lumen. As the melt is quenched, extremely thin skin is formed on the surface of the lumen. Meanwhile, the rest of the membrane forms a microporous structure because the membrane is immersed in a quenching bath for inhibiting the formation of skin on the outer surface by preventing the rapid evaporation of a pore forming substance from the outer surface.

In order to manufacture an asymmetric skinned hollow fiber membrane having skin on the outer surface, the aforementioned process is designed such that the lumen is filled with a fluid for preventing evaporation and the outer surface is exposed to the atmosphere in an extremely short air gap before the fiber enters the cooling bath.

Composition of Fiber to be Spun

A paste or dispersion of a polymer and a solvent is manufactured by mixing together the polymer metered in advance and the solvent metered in predetermined amounts in a container. The polymer is obtained in a desired size. Alternatively, the polymer is crushed into small pieces in advance by an appropriate pulverization process in a desired size, that is, a size about 50 to 1,000 micrometers and preferably a size about 300 micrometers. As an available polymer having a size in the above range, there is HYFLON (registered trademark) MFA 620 available from Ausimont USA, Inc. in Thorofare, N.J. Particles having a larger size do not require a longer heating time in a preferred heating step and do not completely dissolve. Particles having a smaller size increase the process costs and thus need to be pulverized at higher costs. Therefore, particles having a size within the above range are preferable. The content of the polymer with respect to the mixture is between about 12% and 75%, and preferably between 15% and 60%.

Examples of the saturated low-molecular-weight polymer of chlorotrifluoroethylene include HaloVac(registered trademark) 60 (Halocarbon Products Corporation). The solvent to be selected is determined based on the ability of a solvent that forms a solution at an upper critical consolute temperature by dissolving the polymer by heating but does not excessively boil at the temperature. In a case where the polymer dissolves at a temperature higher than the boiling point of the solvent, bubbles are formed in the extrudate, which leads to the damage of the spinning line. The solvent does not need to be a single pure compound, but may be a mixture of low-molecular-weight polymers of chlorotrifluoroethylene having different molecular weights or copolymer ratios. Such a mixture may be applied to achieve balance between solubility and appropriate boiling point characteristics.

Dissolution and Extrusion

The paste or dispersion is metered and supplied into the heating and mixing zone of a conventional twin screw extruder. The paste or dispersion is heated preferably to a temperature in a range of about 270° C. to about 320° C., and more preferably to a temperature in a range of 285° C. to 310° C. The heating may be performed in an inert atmosphere such as nitrogen so as to prevent the decomposition of the solvent at the above temperature. The temperature depends on the melting point of the polymer used. By the extruder, the heated solution is moved to an in-line heating metering pump. The pump supplies the solution to an annular die and controls the extrusion speed. An in-line filter can also be optionally used.

Extrusion of Fiber

In a case where the membrane is supported just as a coagulated substance, the manufacturing of a hollow fiber membrane does not cause problems that may arise in the manufacturing of a sheet-like membrane. Such problems are serious in a case where hollow fibers are manufactured at an extremely high temperature. Hollow fibers are manufactured by extruding a polymer solution or dispersion from the annular space of a die made of two concentric tubes. The inner tube transports a liquid or gas, that is, a lumen fluid that maintains the inner diameter defining the lumen during coagulation, and the lumen fluid controls the formation of skin on the inner surface of the hollow fiber membrane by the liquid or gas. During the operation, the polymer solution is extruded into a liquid bath together with the lumen fluid. In the thermally induced phase separation method, the liquid in the bath is kept at a temperature lower than a temperature at which the used polymer solution undergoes phase separation. In a case where the molded solution is cooled, phase separation occurs, and the fibers are coagulated. Unlike a flat sheet-like membrane coating or extruded on a roll or web carrier or a tubular membrane formed on the inner or outer surface of a mandrel, the extruded hollow fibers are not supported during coagulation. Because the extruded solution is unsupported, the force of transporting the fibers through the cooling bath is directly acting on the molded solution such as a coagulated substance. In a case where the force is too high, the fibers are torn apart.

In order to manufacture fibers through a useful process, two correlated problems have to be overcome. One of the problems is that the fiber needs to have an asymmetric skinned membrane, and the other is that a solution having intensity sufficient for continuously producing the fiber needs to be extruded at a practical speed. Perfluorinated thermoplastic polymers melt at high temperatures, that is, at a temperature of about 260° C. to 310° C. and are difficult to dissolve. Very few solvents are known as effective, and saturated low-molecular-weight polymers of chlorotrifluoroethylene found to be useful are also limited. In these solvents, chemical species having a higher molecular weight have a higher boiling point. It is generally accepted that in a thermally induced phase separation (TIPS) process, the boiling point of the solvent should be about 25° C. to 100° C. higher than the boiling point of the polymer and the volatility at the extrusion temperature should be low (Lloyd, D R et al, J. Membrane Sci. 64 1-11 (1991)). However, saturated low-molecular-weight polymers of chlorotrifluoroethylene having a boiling point higher than about 290° C. are not practical solvents for such polymers, because these solvents are difficult to dissolve the perfluorinated thermoplastic polymer. Therefore, it has been required to develop a method using a solvent having a boiling point lower than or close to the melting point of the polymer.

It is preferable that the hollow fiber membrane has a structure in which at least one surface, preferably, the inner surface is skinned. This structure maximizes permeation. In order to obtain a hollow fiber membrane in which only the inner surface is skinned, the formation of the outer surface has to be controlled such that a porous outer surface, preferably, an unskinned outer surface is formed. At these temperatures, the volatility of the solvent is very high, and in a case where the die has an air gap, rapid solvent loss from the outer surface occurs in the air gap, the polymer concentration on the surface of the fiber increases, and the outer surface is skinned. In order to prevent the formation of skin on the outer surface by the rapid evaporation of the solvent, the outlet of the die is immersed in a cooling bath.

The immersion extrusion looks simple. However, actually, it is extremely difficult to perform the immersion extrusion. In the TIPS process, the heated extrudate passes through an air gap before contacting the cooling surface or the liquid in a bath. The air gap, that is, the distance between the outlet of the die to the cooling or quenching surface, plays a key role in stretching the melt. Stretching can be expressed as the ratio of the thickness of the membrane wall to the annular space of the die. By the air gap, the (stretching) speed of the melt increases, and the melt is pulled up at a fast and economical speed. However, in the immersion extrusion of hollow fibers, the extruded fibers exit the die, enter the cooling bath, are coagulated by being rapidly cooled, and become resistant to stretching. Therefore, the fibers can be stretched only at an extremely low stretching ratio. In a case where the fibers are not sufficiently coagulated, the fibers are highly likely to be broken. Therefore, the fibers need to be spun at a low stretching ratio.

The immersion extrusion was completed to remove the air gap. First, in order to avoid the dilemma over stretching, a die for hollow fiber is manufactured which has a markedly narrow die gap about 350 to 400μ long that determines the wall thickness. Because the length of the die gap is extremely close to the dimensions of the final fiber, the fiber needs to be minimally stretched. The die was designed and machined such that only about $\frac{1}{16}$ inches of the tip contact a quenching bath. This amelioration is important for the success of the present technique which enables the temperature control of an extrudate. The temperature of the quenching liquid is extremely lower than that of the body of the die. Accordingly, in a case where the conventional die is immersed into the quenching liquid, the temperature of the die is lowered down to a temperature at which a solution cannot flow. Even though only the tip is immersed in the quenching bath, the temperature is lowered down to the temperature of the tip of the die. In order to control the temperature of the tip of the die and to increase the temperature of the solution at the tip of the die, a microthermocouple and a strategically positioned booster heater are used. Generally, the exact amount of contact between the tip of the die and the cooling bath depends, for example, on the design of the extruder used and the temperature of the cooling bath. For a die having a long tip, a more powerful booster heater and a more complicated control system are required. A die with a short tip is more difficult to machine and more difficult to install. Those skilled in the related art may be able to accept these instructions and adapt them for the combination of a device and a material.

The fiber can be extruded in either of two positions, that is, a horizontal direction and a vertical direction. The solution is metered and supplied through the annular die by a metering pump at a volumetric speed approximately corresponding to the pulling speed of the spinning line. The solution needs to be supplied in this way to prevent any noticeable bending of the fibers that causes the fracture of the weak extrudate. The inner and outer diameters and the resulting annular space are set according to the requirements for the final fibers. In a case where the wall thickness is 100 micrometers to 250 micrometers and preferably 150 micrometers to 200 micrometers, useful fibers are obtained. The pulling-up speed of the spinning line depends on the dimensions of the fibers and the extrusion speed. The pulling-up speed can be about 10 ft/min to about 200 ft/min, and is preferably 25 ft/min to 100 ft/min.

During the fiber extrusion, the inner diameter of the die is filled with a continuous stream of a fluid so as to prevent the collapse of the lumen of the fiber. In order to prevent the uncontrolled change of the dimensions of the fiber, the flow rate of the fluid in the lumen needs to be carefully controlled. Along with the immersion extrusion method, the flow of the fluid plays a key role in controlling the skinned surface. The formation of membrane-like skin will be described below, but the present invention is not limited thereto. In a preferred method, the solvent is superheated immediately before exiting the die, and thus the solvent in the discharged fiber is at a temperature higher than the boiling point thereof. In the inner diameter, due to the evaporation of the solvent that depends on the heat transfer conditions at that temperature, the external air rapidly becomes close to or reaches a supersaturated or saturated state. Due to the solvent loss, the polymer concentration on the surface increases, and the subsequent phase separation forms skin. It is well known that the permeation resistance of a membrane is mainly caused by the skin and is inversely proportional to the thickness of the skin. Therefore, it is desirable that the skin is as thin and uniform as possible. It is well understood that the faster the skin is formed, the thinner the skin will be, because the initial skin inhibits further evaporation and reduces the build up of the solid polymers on or near the surface. However, in a case where evaporation continues, more solid polymers are concentrated on or near the surface, and thicker skin is generated.

The immersion extrusion is important for controlling the thickness of skin, because as instantaneous cooling reduces further boiling or evaporation after the initial skin formation. This technique not only controls the thickness of the final skin, but also suppresses defects that are caused by rapid evaporation or boiling under the formed skin and cause bubbles and skin penetration. A preferred membrane has skin on the inner surface thereof and a porous surface on the outer surface thereof. By the immersion extrusion, the outer surface becomes porous and preferably has an asymmetric structure, and the structure maximizes the overall permeability.

In a case where a lumen gas is used, the formation of skin can be further controlled. The control of the gas temperature affects the saturation or supersaturation limit of the lumen atmosphere. Although a lumen gas that is at room temperature or heated is preferable, a cooled gas may also be used as necessary. It is well known that under the same pressure and temperature conditions, a low-molecular-weight gas such as helium has a mass transfer coefficient higher than that of a gas having a higher molecular weight. Therefore, it is possible to exploit the type of gas for controlling the evaporation speed. A gas mixture can also be used to control evaporation.

In the extrusion process, a transient change is induced in the fiber. However, for the gas stream control method, it is preferable to use a differential pressure controller that maintains the internal pressure of the lumen at a constant value.

The die consists of a standard crosshead die on which a projection portion of the die is mounted. The die has two temperature control zones. The crosshead portion of the die is kept at a temperature in a range of 270° C. to 320° C. and preferably in a range of 280° C. to 290° C. The projection portion of the die surrounds the outlet of the die, and is independently controlled in a range of 290° C. to 320° C. and preferably in a range of 300° C. to 310° C. The heated zone of the projection portion of the die simply raises the solution temperature to a temperature close to or higher than the boiling point of the solvent.

In vertical extrusion, the tip of the die is positioned such that the gel-like fiber that is being discharged does not pass through the air gap before contacting the cooling bath. During fiber spinning in a horizontal direction, the die is firmly fixed to the insulating surface. The tip of the die is caused to penetrate the insulator through an opening having a liquid tight seal. A trough for cooling the liquid stream is placed in a recess opposite to the insulating seal, in a state where the outlet of the die projection portion is immersed in the trough. The trough may be permanently fixed or may be removable. The trough has a great depth and a small depth and touches the insulator in the recess. In a case where the trough optionally comprises, for example, a pump unit for removing overflowing cooling fluid, the trough can have a uniform depth. The cooling liquid flows through the trough, causes the outlet of the projection portion of the die to be immersed in the stream of the cooling liquid, and overflows in a shallow portion of the trough. An optional trough may be provided such that a small amount of the cooling liquid flows between the end of the trough and the surface of the insulator.

Cooling Bath

The cooling bath cools the extruded fiber to a temperature equal to or lower than upper critical consolute temperature, and causes phase separation. The liquid in the bath has a boiling point high enough to prevent the formation of bubbles in the fiber that is being discharged from the die. As such a liquid, it is possible to use any liquid that does not adversely affect the formation of pores on the surface. The temperature of the bath is 25° C. to 230° C., and preferably 50° C. to 150° C.

As the liquid in the bath, it is also possible to use any liquid that does not boil at the cooling temperature or at a point at which the heated extrudate enters the cooling bath, does not interact with the fiber to cause the formation of skin, and does not dissolve or swell the polymer at the temperature of the cooling bath. Examples of preferred liquids include mineral oil, dimethyl silicone oil, and dioctyl phthalate. Other disubstituted phthalates may also be used.

Extraction and Drying

Then, the gel-like fiber is introduced into a liquid extraction bath of a liquid for removing solvents substantially without being softened, weakened, or dissolved. As extraction solvents, 1,1 dichloro-1-fluoroethane (Genesolve) 2000 (AlliedSignal, Inc., New Jersey), 1,1,2 trichlorotrifluoroethane (Freon(registered trademark) TF, DuPont), hexane, or analogues thereof are preferable. The extraction is usually performed at a temperature of about 20° C. to about 50° C. so as to minimize the influence of the extraction liquid on the fiber. The extracted fiber is dried on a cylindrical core or the like at a temperature of 20° C. to 50° C. in a state of being constrained to prevent shrinking. Subsequently, the fiber may be subjected to heat setting at a temperature of 200° C. to 300° C.

One of the advantages of the immersion extrusion method is that a hollow fiber membrane having a practical length can be continuously manufactured by this method. The hollow fiber membrane of the perfluorinated thermoplastic polymer prepared by the methods of the conventional technique easily breaks during extrusion, and thus the hollow fiber membrane having a practical length cannot be recovered.

A typical spinning process in a vertical direction for manufacturing hollow fiber will be described. A past-like mixture of polymer/solvent is introduced into a heated barrel extruder through an inlet by a pumping device, for example, a progressive cavity pump. The solution is formed in a heated barrel of the extruder. The extruder transports the heated solution into a melt pump, which meters and supplies the solution, through a conduit and then to a crosshead die through the conduit. The solution may be transported from the extruder into a melt pump through a conduit, then to a solution filter through the conduit, and then to a crosshead die through the conduit.

Through the crosshead die, the solution enters a projection portion of the die where the solution is shaped into hollow fiber. From a mandrel of the die, a lumen gas is introduced into the inner diameter of the hollow fiber solution that is being discharged from the die. The lumen gas is supplied to the mandrel of the die by a lumen gas supply unit.

During fiber spinning performed in a vertical direction, along with the lumen gas, the solution is vertically extruded from the projection portion of the die without passing through an air gap, such that the solution is extruded in the fluid of the cooling bath in which the solution is cooled and undergoes microphase separation of the polymer and the solvent and turns into gel-like membrane hollow fiber. The gel-like membrane hollow fiber is guided through the cooling bath by a guide roller, and taken out of the cooling bath by godet rolls. The gel-like membrane hollow fiber is removed from the godet rolls by a cross winder.

A typical spinning process in a horizontal direction for manufacturing hollow fiber will be described. A paste-like mixture of polymer/solvent is introduced into a heated barrel extruder through the outlet by using a pumping device, for example, a progressive cavity pump. The solution is formed in a heated barrel of the extruder. The extruder transports the heated solution into a melt pump, which meters and supplies the solution, through a conduit and then to a crosshead die through the conduit. The solution may be transported from the extruder into a melt pump through a conduit, then to a solution filter through the conduit, and then to a crosshead die through the conduit.

Through the crosshead die, the solution enters a projection portion of the die where the solution is shaped into hollow fibers. From a mandrel of the die, a lumen gas is introduced into the inner diameter of the hollow fiber solution that is being discharged from the die. The lumen gas is supplied to the mandrel of the die by a lumen gas supply unit.

During fiber spinning performed in a horizontal direction, along with the lumen gas, the solution leaving the projection portion of the die passes through the wall of an insulator of die/cooling bath and moves into a cooling fluid in a cooling bath without passing through an air gap, such that the solution is cooled to undergo the microphase separation of the polymer and solvent and turn into gel-like membrane hollow fiber.

The gel-like membrane hollow fiber is guided from the cooling bath by a guide roller, and is taken out of the cooling bath by godet rolls. The gel-like membrane hollow fiber is removed from the godet rolls by a cross winder.

Then, the solvent is removed from the gel-like fiber by being extracted using a solvent that does not weaken or adversely affect the hollow fiber membrane. Thereafter, the fiber is constrained to minimize shrinkage and dried. The fiber may be stretched in a longitudinal direction. The fiber may be subjected to heat setting.

Although a hollow fiber membrane having skin on the inner diameter is a preferred product, sometimes a hollow fiber membrane having skin on the outer surface can be desirably used as a contactor. A membrane having a skinned outer surface is more suitably used in a case where a liquid phase is on the outer shell of the fiber. In the case of membrane having a skinned outer surface, those skilled in the related art control the rapid evaporation of the solvent from the outer surface of the membrane by adopting the preferred method of the present invention having a coextruded liquid or other appropriate liquids in the lumen. The amount of the rapidly evaporating solvent is controlled, for example, by a combination of the extrusion speed and the distance between the outlet of the die tip that the fiber exits and the inlet of the cooling bath that the fiber enters. The contact time with air, that is, the time for which the outer surface of the extruded fiber is exposed to the atmosphere between the outlet of the extruder and the surface of the cooling bath is preferably less than about 0.05 seconds, and most preferably less than 0.02 seconds.

(Filter A3)

The filter A3 is a laminated structure having a first layer which consists of porous base material made of polytetrafluoroethylene having a first hydrophilic group on a surface thereof and a second layer which is disposed on the first layer and consists of a porous base material made of polytetrafluoroethylene having a second hydrophilic group different from the first hydrophilic group on a surface thereof. Hereinafter, the form of the filter A3 will be described, but what has already been described regarding the filter A1 and the filter A2 will not be described. In other words, the matters that are not described below are as already described regarding the filter A1 and the filter A2.

The method for forming the porous base material (membrane) made of PTFE having a hydrophilic group on the surface is not particularly limited, and examples thereof include a method of bonding the first hydrophilic group and/or the second hydrophilic group to the surface of the unmodified porous membrane made of PTFE.

The method for introducing a hydrophilic group into an unmodified porous base material made of PTFE is not particularly limited, but is preferably a method of using unmodified PTFE as a base material and introducing a hydrophilic group into the base material.

The method for introducing the hydrophilic group is not particularly limited. A porous membrane made of PTFE is irradiated with ionizing radiation (such as α-rays, β-rays, γ-rays, X-rays, or electron beams) such that active portions (radicals) are generated in the PTFE resin. The irradiated PTFE resin is immersed in a solution containing a compound having a predetermined functional group such that the compound is bonded to the base material. In this case, by the immersion of the resin in the monomer having a functional group, the monomer having a functional group is graft-polymerized with the main chain of the resin. As a result, a product is generated in which the monomer is bonded to polyolefin fiber as a side chain by graft polymerization.

Furthermore, sometimes a hydrophilic group can be introduced into the porous base material made of PTFE by a plasma treatment, a flame treatment, and the like in addition to the above method.

The first hydrophilic group and the second hydrophilic group are not particularly limited, and examples thereof include a hydroxyl group, a (poly) ether group, an oxyalkylene group, a polyoxyalkylene group, a carboxylic acid group, a boronic acid group, a phosphonic acid group, a sulfonic acid group, an amino group, a quaternary ammonium group, an imidazolium group, a pyridinyl group, an ester group, a carbonic acid ester group, a thiol group, a thioether group, a phosphoric acid group, a phosphoric acid ester group, an amide group, an imide group, a (per) fluoroalkyl group, a group obtained by combining these, and the like. Among these, a hydrophilic group different from the hydrophilic group of the filter A is preferable, which is preferably at least one kind of group selected from the group consisting of a polyether group, a hydroxyl group, a thioether group, a thiol group, a quaternary ammonium group, a carboxylic acid group, a sulfonic acid group, and a group obtained by combining these.

The water contact angle on the surfaces of the first layer and the second layer is not particularly limited. As a static contact angle measured at 25° C. by using a contact angle meter, the contact angle is preferably equal to or smaller than 60°, and more preferably equal to or smaller than 50°.

More specifically, the filter A3 is in the form of a pleated filter member including at least three microporous membranes each having a substantially neutral surface; and a microporous polytetrafluoroethylene ion-exchange membrane at the downstream of at least three microporous membranes described above; each of the microporous membranes is modified with amide and has pore size ratings greater than the pore size ratings of the microporous polytetrafluoroethylene ion-exchange membrane; and the microporous polytetrafluoroethylene ion-exchange membrane has a surface modified with sulfonic acid and has pore size ratings of about 1 nanometer to about 25 nanometers. Each of the at least three microporous membranes can be a microporous polytetrafluoroethylene membrane.

The microporous membrane having a substantially neutral surface and methods for preparing the membrane are disclosed in Steuck et al. U.S. Pat. No. 4,618,533A and WO01/051170A, the entire content of which is incorporated into the present specification by reference. In some embodiments, the microporous membrane having a substantially neutral surface is adapted to remove chromium (for example, a chromium salt or a chromium complex) from organic solvents (for example, IPA). In some embodiments, the microporous membrane having a substantially neutral surface is a microporous PTFE membrane having a substantially neutral surface, for example, a surface modified with an amide group or a polymer containing an amide group. The membrane modified with amide and the method for preparing the membrane are disclosed in WO01/51170A, the entire content of which is incorporated into the present specification by reference. In some embodiments, the surface of the membrane modified with an amide group is advantageous for reducing the amount of non-volatile residues in an organic solvent.

A substantially neutral surface or a weakly charged surface is a surface having an electrostatic potential of 0 mV or around 0 mV. The electrostatic potential is proportional to the zeta potential. The substantially neutral surface can be formed by appropriately selecting the material of the membrane or modifying the surface of the membrane. The substantially neutral surface or the weakly charged surface has an advantage of being able to retain particles, for example, chromium particles by a non-sieving retention mechanism. Surprisingly, it is possible to remove chromium from isopropanol by using the microporous membrane having a substantially neutral surface.

The non-sieving retention mechanism includes retention mechanisms such as blocking, diffusion, and adsorption and removes particles from a stream of fluid regardless of the pressure reduction or bubble point of the filter or microporous membrane. The adsorption of particles onto the membrane surface can be performed, for example, by the intermolecular van der Waals force and electrostatic force. Blocking occurs in a case where the particles moving through a serpiginous membrane cannot change direction quickly enough to avoid the contact with the membrane. The transport of particles caused by diffusion mainly results from random motion or Brownian motion of small particles, and causes particles to be slightly likely to collide with a filter medium. The non-sieving retention mechanism can be activated in a case where there is no repulsive force between the particles and the filter or membrane.

Generally, the pore size ratings of the microporous membrane having a substantially neutral surface are greater than the pore size ratings of the microporous PTFE membrane. The particle size ratings of the microporous membrane having a substantially neutral surface can be about equal to or smaller than 10 µm, about equal to or smaller than 5 about equal to or smaller than 1 or about equal to or smaller than 0.5 In some embodiments, the particle size ratings of the microporous membrane having a substantially neutral surface may be about equal to or smaller than 0.2 or about equal to or smaller than 0.1 µm.

In another embodiment, the pleated filter member includes at least three microporous membranes each having a substantially neutral surface; and a microporous polytetrafluoroethylene ion-exchange membrane at the downstream of at least microporous membranes described above; each of the microporous membranes is modified with amide and has pore size ratings greater than the pore size ratings of the microporous polytetrafluoroethylene ion-exchange membrane; and the microporous polytetrafluoroethylene ion-exchange membrane has a surface modified with sulfonic acid and has pore size ratings of about 1 nanometer to about 25 nanometers. Each of the at least three microporous membranes can be a microporous polytetrafluoroethylene membrane.

<Filter BU>

The filter BU is a filter different from the filter A, and is arranged in series with the filter A on the upstream side of the filter A on the flow path. In the present specification, "filter different from the filter A" means a filter different from the filter A in terms of at least one kind of item selected from the group consisting of material, pore size, and pore structure. On the flow path, the inlet portion is the upstream side, and the outlet portion is the downstream side.

Particularly, in view of obtaining a filtering device having further improved effects of the present invention, the filter BU is preferably different from the filter A in terms of at least one item selected from the group consisting of pore size and material, and preferably different from the filter A at least in terms of material.

In the present specification, the case where filter BU is different from the filter A in terms of material typically includes a case where the components (material components) contained in the filters are different from each other; a case where the filters consist of a resin and the types of substituents arranged on the surface of the filters are different from each other due to the difference of the surface treatment; and the like.

The pore size of the filter BU is not particularly limited as long as the filter has an arbitrary pore size used in the filtering device. Particularly, in view of obtaining a chemical liquid having further improved defect inhibition performance, the pore size of the filter BU is preferably larger than the pore size of the filter A. Especially, pore size of the filter BU is preferably equal to or smaller than 200 nm. The pore size of the filter BU is preferably equal to or greater than 10 nm, and more preferably equal to or greater than 20 nm.

According to the examination of the inventors of the present invention, it has been found that in a case where a filtering device is used in which the filter BU having a pore size equal to or greater than 20 nm is disposed on the upstream side of the filter A on the flow path S1, it is more difficult for the filter A to be clogged, and the pot life of the filter A can be further extended. As a result, a filtering device capable of stably providing a chemical liquid having further improved defect inhibition performance can be obtained.

Particularly, in a case where the filtering device has a plurality of filters BU, the pore size of the filter BU disposed on the uppermost stream side in the flow path is preferably equal to or greater than 20 nm, and more preferably equal to or greater than 50 nm. Furthermore, the pore size of the filter BU disposed on the uppermost stream side in the flow path is preferably equal to or smaller than 200 nm. It is preferable that the pore size of the filter BU (which may be a filter C that will be described later) disposed on the uppermost stream side of the flow path is within the above range, because then the pot life of the filter is further extended, and as a result, a chemical liquid having excellent defect inhibition performance can be stably produced.

The pore structure of the filter BU is not particularly limited.

In the present specification, the pore structure of a filter means a pore size distribution, a positional distribution of pores in a filter, a pore shape, and the like. Typically, the pore structure can be controlled by the manufacturing method of the filter.

For example, in a case where powder of a resin or the like is sintered to form a membrane, a porous membrane is obtained. Furthermore, in a case where a methods such as electrospinning, electroblowing, and melt blowing are used to form a membrane, a fiber membrane is obtained. These have different pore structures.

"Porous membrane" means a membrane which retains components in a liquid to be purified, such as gel, particles, colloids, cells, and polyoligomers, but allows the components substantially smaller than the pores of the membrane to pass through the membrane. The retention of components in the liquid to be purified by the porous membrane depends on operating conditions, for example, the surface velocity, the use of a surfactant, the pH, and a combination of these in some cases. Furthermore, the retention of components can depend on the pore size and structure of the porous membrane, and the size and structure of particles supposed to be removed (such as whether the particles are hard particles or gel).

An ultra-high-molecular-weight polyethylene (UPE) filter is typically a sieving membrane. A sieving membrane means a membrane that traps particles mainly through a sieving retention mechanism or a membrane that is optimized for trapping particles through a sieving retention mechanism.

Typical examples of the sieving membrane include, but are not limited to, a polytetrafluoroethylene (PTFE) membrane and a UPE membrane.

"Sieving retention mechanism" refers to retention caused in a case where the particles to be removed are larger than the size of micropores of the porous membrane. Sieving retentivity can be improved by forming a filter cake (aggregate of particles to be removed on the surface of the membrane). The filter cake effectively functions as a secondary filter.

The pore structure of the porous membrane (for example, a porous membrane including UPE, PTFE, and the like) is not particularly limited. The pores have, for example, a lace shape, a string shape, a node shape, and the like.

The size distribution of pores in the porous membrane and the positional distribution of pores size in the membrane are not particularly limited. The size distribution may be narrower, and the positional distribution of pore size in the membrane may be symmetric. Furthermore, the size distribution may be wider, and the positional distribution of pore size in the membrane may be asymmetric (this membrane is also called "asymmetric porous membrane"). In the asymmetric porous membrane, the size of the pores changes in the membrane. Typically, the pore size increases toward the other surface of the membrane from one surface of the membrane. In this case, the surface containing pores having a large pore size is called "open side", and the surface containing pores having a small pore size is also called "tight side".

Examples of the asymmetric porous membrane include a membrane in which the pore size is minimized at a position in the thickness direction of the membrane (this is also called "hourglass shape").

In a case where the asymmetric porous membrane is used such that large pores are on the primary side, in other words, in a case where the primary side is used as the open side, a pre-filtration effect can be exerted.

The porous membrane layer may include a thermoplastic polymer such as polyethersulfone (PESU), perfluoroalkoxyalkane (PFA, a copolymer of tetrafluoroethylene and perfluoroalkoxyalkane), polyamide, or a polyolefin, or may include polytetrafluoroethylene and the like.

Particularly, as a material component of the porous membrane, ultra-high-molecular-weight polyethylene is preferable. The ultra-high-molecular-weight polyethylene means thermoplastic polyethylene having a very long chain. The molecular weight thereof is equal to or greater than 1,000,000. Typically, the molecular weight thereof is preferably 2,000,000 to 6,000,000.

For example, in a case where the liquid to be purified contains, as impurities, particles containing an organic compound, such particles are negatively charged in many cases. For removing such particles, a filter made of polyamide functions as a non-sieving membrane. Typical non-sieving membranes include, but are not limited to, nylon membranes such as a nylon-6 membrane and a nylon-6,6 membrane.

"Non-sieving" retention mechanism used in the present specification refers to retention resulting from the mechanism such as blocking, diffusion, and adsorption irrelevant to the pressure reduction of the filter or the pore size of the filter.

The non-sieving retention includes a retention mechanism such as blocking, diffusion, and adsorption for removing particles supposed to be removed from the liquid to be purified irrespective of the pressure reduction of the filter or the pore size of the filter. The adsorption of particles onto the filter surface can be mediated, for example, by the intermolecular van der Waals force and electrostatic force. In a case where the particles moving in the non-sieving membrane layer having a serpiginous path cannot sufficiently rapidly change direction so as not to contact the non-sieving membrane, a blocking effect is exerted. The transport of particles by diffusion is mainly caused by the random motion or the Brownian motion of small particles that results in a certain probability that the particles may collide with the filter medium. In a case where there is no repulsive force between the particles and the filter, the non-sieving retention mechanism can be activated.

The material of the fiber membrane is not particularly limited as long as it is a polymer capable of forming the fiber membrane. Examples of the polymer include polyamide and the like. Examples of the polyamide include nylon 6, nylon 6,6, and the like. The polymer forming the fiber membrane may be poly(ethersulfone). In a case where the fiber membrane is on the primary side of the porous membrane, it is preferable that the surface energy of the fiber membrane is higher than the surface energy of the polymer which is the material of the porous membrane on a secondary side. For example, in some cases, nylon as a material component of the fiber membrane and polyethylene (UPE) as the porous membrane are combined.

As the method for manufacturing the fiber membrane, known methods can be used without particular limitation. Examples of the method for manufacturing the fiber membrane include electrospinning, electroblowing, melt blowing, and the like.

Furthermore, the filter may be subjected to surface treatment. As the surface treatment method, known methods can be used without particular limitation. Examples of the surface treatment method include a chemical modification treatment, a plasma treatment, a hydrophobization treatment, coating, a gas treatment, sintering, and the like.

The plasma treatment is preferable because the surface of the filter is hydrophilized by this treatment. Although the water contact angle on the surface of each filter hydrophilized by the plasma treatment is not particularly limited, a static contact angle measured at 25° C. by using a contact angle meter is preferably equal to or smaller than 60°, more preferably equal to or smaller than 50°, and even more preferably equal to or smaller than 30°.

As the chemical modification treatment, a method of introducing ion exchange groups into the base material is preferable.

That is, the filter is preferably obtained by using various material components exemplified above as a base material and introducing ion exchange groups into the base material. Typically, it is preferable that the filter includes a layer, which includes a base material having ion exchange groups, on a surface of the base material described above. Although there is no particular limitation, as the surface-treated base material, a base material obtained by introducing ion exchange groups into the aforementioned polymer is preferable because the manufacturing of such a base material is easier.

Examples of the ion exchange groups include cation exchange groups such as a sulfonic acid group, a carboxy group, and a phosphoric acid group and anion exchange groups such as a quaternary ammonium group. The method for introducing ion exchange groups into the polymer is not particularly limited, and examples thereof include a method of reacting a compound, which has ion exchange groups and polymerizable groups, with the polymer such that the compound is grafted on the polymer typically.

The method for introducing the ion exchange groups is not particularly limited. In a case where the aforementioned resin fiber is irradiated with ionizing radiation (such as α-rays, β-rays, γ-rays, X-rays, or electron beams), active portions (radicals) are generated in the resin. The irradiated resin is immersed in a monomer-containing solution such that the monomer is graft-polymerize with the base material. As a result, a product is generated in which the monomer is bonded to polyolefin fiber as a side chain by graft polymerization. By bringing the resin having the generated polymer as a side chain into contact with a compound having an anion exchange group or a cation exchange group so as to cause a reaction, an end product is obtained in which the ion exchange group is introduced into the polymer of the graft-polymerized side chain.

Furthermore, the filter may be constituted with woven cloth or nonwoven cloth, in which ion exchange groups are formed by a radiation graft polymerization method, combined with glass wool, woven cloth, or nonwoven filter material that is conventionally used.

Although the filtering device in FIG. 1 has one filter BU, the filtering device according to the present embodiment may have a plurality of filters BU. In this case, the relationship between the pore sizes of the plurality of filters BU is not particularly limited. However, in view of easily obtaining a chemical liquid having further improved defect inhibition performance, it is preferable that a filter BU disposed in the uppermost stream on the flow path has the largest pore size. In a case where the filter BU having the largest pore size is positioned as described above, the pot life of the filters (including the filter A) disposed in the downstream of the filter BU in the uppermost stream can be further extended, and as a result, a filtering device capable of stably providing a chemical liquid having further improved defect inhibition performance is obtained.

The material of the filter BU is not particularly limited, and the filter BU may optionally contain an inorganic material (such as a metal, glass, or diatomite), an organic material, and the like. The material of the filter BU may be the same as the material of the filter A described above, or may be the same as the material of the filter BD which will be described later.

Particularly, in view of obtaining a filtering device having further improved effects of the present invention, it is preferable that the filter BU consists of a material capable of removing ions. In this case, it is preferable that the filter BU contains, as a material component, a resin having an ion exchange group.

The ion exchange group is not particularly limited. However, in view of obtaining a filtering device having further improved effects of the present invention, the ion exchange group is preferably at least one kind of ion exchange group selected from the group consisting of an acid group, a base group, an amide group, and an imide group.

As a material component of the filter BU, a material is more preferable which includes a base material such as polyfluorocarbon or polyolefin and an ion exchange group introduced into the base material.

In a case where the filter BU contains a resin having an ion exchange group as a material component, the pore size of the filter BU is not particularly limited. However, in view of obtaining a chemical liquid resulting in further improved pattern width uniformity, the pore size of the filter BU is preferably equal to or smaller than 200 nm, more preferably equal to or smaller than 100 nm, and even more preferably equal to or smaller than 50 nm. The pore size of the filter BU is preferably equal to or greater than 1 nm, and more preferably equal to or greater than 3 nm.

In a case where one filter BU of the filtering device or at least one of the plurality of filters BU of the filtering device contains a resin having an ion exchange group as a material component, the ion exchange group has stronger interaction with metal impurities (for example, metal ions and the like) contained in the liquid to be purified. As a result, the content of metal ions in the obtained chemical liquid can be reduced, and the obtained chemical liquid results in further improved pattern width uniformity.

Second Embodiment

Figure 2:
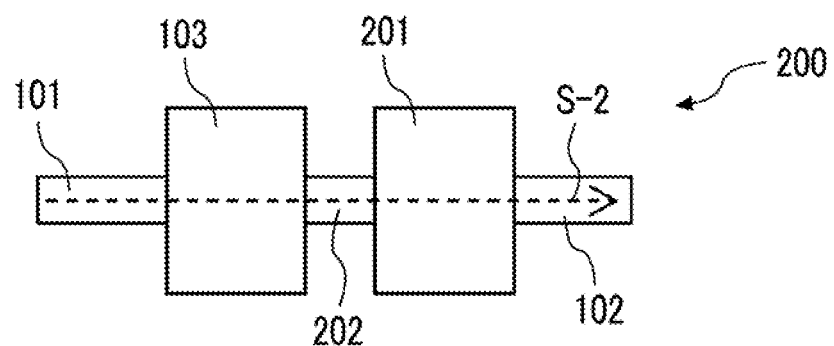
FIG. 2 is a schematic view illustrating a filtering device according to a second embodiment of the present invention.

FIG. 2 is a schematic view illustrating a filtering device according to a second embodiment of the present invention.

A filtering device 100 is a filtering device in which a filter 103 as a filter A and a filter 201 (filter BD) different from the filter 103 are arranged in series through a piping 202 between the inlet portion 101 and the outlet portion 102.

The inlet portion 101, the filter 103, the piping 202, the filter 104, and the outlet portion 102 are constituted such that a liquid to be purified can flow in the interior of each of these members. These members are connected to one another and form a flow path S2 (path through which the liquid to be purified flows).

In the filtering device 200, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

<Filter BD>

The filter BD is a filter different from the filter A, and is arranged in series with the filter A on the downstream side of the filter A on the flow path. Particularly, in view of obtaining a filtering device having further improved effects of the present invention, the filter BD is preferably different from the filter A at least in terms of pore size, and more preferably different from the filter A in terms of pore size and material.

The pore size of the filter BD according to the present embodiment is not particularly limited as long as it is smaller than the pore size of the filter A, and a filter having a pore size generally used for filtering a liquid to be purified can be used. Particularly, the pore size of the filter is preferably equal to or smaller than 200 nm, more preferably equal to or smaller than 20 nm, still more preferably equal to or smaller than 10 nm, particularly preferably equal to or smaller than 5 nm, and most preferably equal to or smaller than 3 nm. The lower limit thereof is not particularly limited, but is generally preferably equal to or greater than 1 nm from the viewpoint of productivity.

In a case where the liquid to be purified is filtered using the filter A, and fine particles are generated due to the filter A, the fine particles are mixed into the liquid to be purified. The filtering device according to the present embodiment has the filter BD at the downstream on the flow path. Therefore, even though fine particles are generated due to the filter A, the fine particles can be separated from the liquid to be purified by filtration, and a chemical liquid having further improved defect inhibition performance can be easily obtained.

Although the filtering device in FIG. 2 has one filter BD, the filtering device according to the present embodiment may have a plurality of filters BD. In this case, the relationship between the pore sizes of the plurality of filters BD is not particularly limited. However, in view of easily obtaining a chemical liquid having further improved defect inhibition performance, it is preferable that a filter BD disposed on the downmost stream side in the flow path has the smallest pore size.

In this case, the pore size of the filter BD disposed on the downmost stream side in the flow path is preferably equal to or smaller than 20 nm, more preferably equal to or smaller than 15 nm, and even more preferably equal to or smaller than 10 nm. The lower limit thereof is not particularly limited, but is preferably equal to or greater than 1 nm in view of the productivity of a chemical liquid.

Particularly, in a case where the pore size of the filter disposed on the downmost stream side is equal to or smaller than 15 nm, the obtained chemical liquid has further improved bridge defect inhibition performance.

The material component of the filter BD is not particularly limited, and may be the same as or different from the material component of the filter A. Particularly, in view of obtaining a filtering device having further improved effects of the present invention, it is preferable that the material component of the filter BD is different from that of the filter A.

The material component of the filter BD is not particularly limited, and those known as material components of filters can be used. Specifically, in a case where the material component is a resin, examples thereof include polyamide such as 6-nylon and 6,6-nylon; polyolefin such as polyethylene and polypropylene; polystyrene; polyimide; polyamidoimide; poly(meth)acrylate; polyfluorocarbons such as polytetrafluoroethylene, perfluoroalkoxyalkane, a perfluoroethylene propene copolymer, an ethylene/tetrafluoroethylene copolymer, an ethylene-chlorotrifluoroethylene copolymer, polychlorotrifluoroethylene, polyvinylidene fluoride, and polyvinyl fluoride; polyvinyl alcohol; polyester; cellulose; cellulose acetate, and the like. Among these, in view of obtaining further improved solvent resistance and obtaining a chemical liquid having further improved defect inhibition performance, at least one kind of resin is preferable which is selected from the group consisting of nylon (particularly preferably 6,6-nylon), polyolefin (particularly preferably polyethylene), poly(meth)acrylate, and polyfluorocarbon (particularly preferably polytetrafluoroethylene (PTFE) and perfluoroalkoxyalkane (PFA)). One kind of each of these polymers can be used singly, or two or more kinds of these polymers can be used in combination.

In addition to the resin, diatomite, glass, and the like may also be used.

Furthermore, the filter may be subjected to surface treatment. As the surface treatment method, known methods can be used without particular limitation. Examples of the surface treatment method include a chemical modification treatment, a plasma treatment, a hydrophobization treatment, coating, a gas treatment, sintering, and the like.

The plasma treatment is preferable because the surface of the filter is hydrophilized by this treatment. Although the water contact angle on the surface of each filter hydrophilized by the plasma treatment is not particularly limited, a static contact angle measured at 25° C. by using a contact angle meter is preferably equal to or smaller than 60°, more preferably equal to or smaller than 50°, and even more preferably equal to or smaller than 30°.

As the chemical modification treatment, a method of introducing ion exchange groups into the base material is preferable.

That is, the filter is preferably obtained by using various material components exemplified above as a base material and introducing ion exchange groups into the base material. Typically, it is preferable that the filter includes a layer, which includes a base material having ion exchange groups, on a surface of the base material described above. Although there is no particular limitation, as the surface-treated base material, a base material obtained by introducing ion exchange groups into the aforementioned polymer is preferable because the manufacturing of such a base material is easier.

Examples of the ion exchange groups include cation exchange groups such as a sulfonic acid group, a carboxy group, and a phosphoric acid group and anion exchange groups such as a quaternary ammonium group. The method for introducing ion exchange groups into the polymer is not particularly limited, and examples thereof include a method of reacting a compound, which has ion exchange groups and polymerizable groups, with the polymer such that the compound is grafted on the polymer typically.

The method for introducing the ion exchange groups is not particularly limited. In a case where the aforementioned resin fiber is irradiated with ionizing radiation (such as α-rays, β-rays, γ-rays, X-rays, or electron beams), active portions (radicals) are generated in the resin. The irradiated resin is immersed in a monomer-containing solution such that the monomer is graft-polymerize with the base material. As a result, a product is generated in which the monomer is bonded to polyolefin fiber as a side chain by graft polymerization. By bringing the resin having the generated polymer as a side chain into contact with a compound having an anion exchange group or a cation exchange group so as to cause a reaction, an end product is obtained in which the ion exchange group is introduced into the polymer of the graft-polymerized side chain.

Furthermore, the filter may be constituted with woven cloth or nonwoven cloth, in which ion exchange groups are formed by a radiation graft polymerization method, combined with glass wool, woven cloth, or nonwoven filter material that is conventionally used.

Particularly, in view of obtaining a filtering device having further improved effects of the present invention, the material component of the filter BD preferably contains at least one kind of resin selected from the group consisting of polyolefin, polyamide, polyfluorocarbon, polystyrene, polysulfone, and polyethersulfone, and more preferably consists of at least one kind of resin selected from the group consisting of polyolefin, polyamide, and polyfluorocarbon.

Examples of the polyolefin include polyethylene, polypropylene, and the like. Among these, ultra-high-molecular-weight polyethylene is preferable. Examples of the polyamide include 6-nylon, 6,6-nylon, and the like. Examples of the polyfluorocarbon include polytetrafluoroethylene, perfluoroalkoxyalkane, a perfluoroethylene propene copolymer, an ethylene/tetrafluoroethylene copolymer, an ethylene-chlorotrifluoroethylene copolymer, polychlorotrifluoroethylene, polyvinylidene fluoride, polyvinyl fluoride, and the like. Among these, at least one kind of compound selected from the group consisting of polyethylene and nylon is preferable, and in another embodiment, polytetrafluoroethylene is preferable.

Furthermore, it is also preferable that the filter BD contains a second resin having a hydrophilic group as a material component. The hydrophilic group is not particularly limited, and examples thereof include a hydroxyl group, an ether group, an oxyalkylene group, a polyoxyalkylene group, a carboxylic acid group, an ester group, a carbonic acid ester group, a thiol group, a thioether group, a phosphoric acid group, and a phosphoric acid ester group, an amide group, an imide group, and the like. Among them, a hydrophilic group different from the hydrophilic group of the filter A is preferable, and at least one kind of hydrophilic group is preferable which is selected from the group consisting of a hydroxyl group, a carboxylic acid group, an ester group, a carbonic acid ester group, a thiol group, a thioether group, a phosphoric acid group, a phosphoric acid ester group, an amide group, and an imide group.

The second resin is not particularly limited, but is preferably at least one kind of resin selected from the group consisting of polyolefin, polyamide, polyfluorocarbon, polystyrene, polysulfone, and polyethersulfone. Furthermore, as another embodiment, polyether, novolak, a cycloolefin polymer, polylactic acid, and the like are also preferable.

The pore structure of the filter BD is not particularly limited, and may be appropriately selected according to the components of the liquid to be purified.

Particularly, in view of obtaining a chemical liquid having further improved effects of the present invention, the filter BD disposed on the downmost stream side in the flow path preferably contains, as a material component, polyfluorocarbon, more preferably contains polytetrafluoroethylene, and even more preferably consists of polytetrafluoroethylene.

In a case where the filtering device has a plurality of filters BD, each of the filters BD is expected to have a different role, that is, to remove different impurities from the liquid to be purified. For example, in a case where the filter BD is a filter made of nylon, the filter can more efficiently remove gel-like impurities. In a case where the filter BD is ultra-high-molecular-weight polyethylene, the filter can more efficiently remove particle-like impurities.

However, according to the examination of the inventors of the present invention, it has been found that although a filter such as nylon and ultra-high-molecular-weight polyethylene removes impurities from the liquid to be purified, sometimes this filter allows a trace of impurities to be eluted into the liquid to be purified in a case where the liquid to be purified passes through the filter.

In this case, by disposing a filter containing PTFE as a material component (for example, a filter made of PTFE) on the downmost stream side in the flow path, the trace of impurities mixed into the liquid to be purified due to the filter on the upstream side can be removed, and further improved defect inhibition performance can be obtained.

Modification Example of Filtering Device According to Second Embodiment

Figure 3:
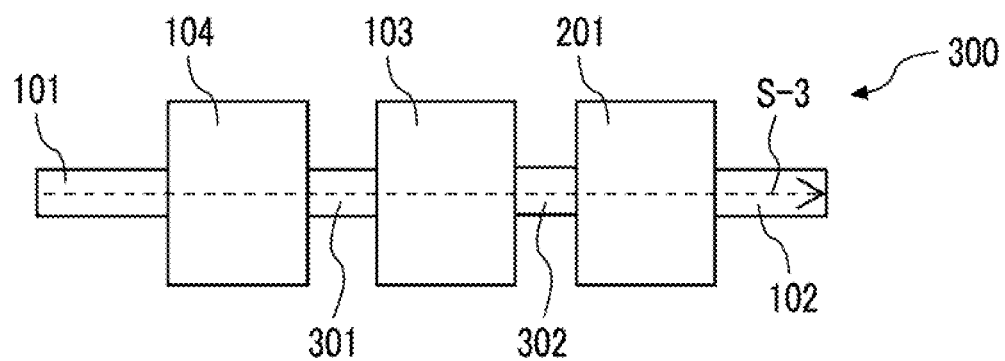
FIG. 3 is a schematic view illustrating a modification example of the filtering device according to the second embodiment of the present invention.

FIG. 3 is a schematic view of a filtering device illustrating a modification example of a filtering device according to a second embodiment of the present invention. A filtering device 300 includes a filter 103 as a filter A, a filter 104 as a filter BU, and a filter 201 as a filter BD between an inlet portion 101 and an outlet portion 102 in which the filter 104, the filter 103, and the filter 201 are arranged in series through a piping 301 and a piping 302.

In the filtering device 300, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The inlet portion 101, the filter 104, the piping 301, the filter 103, the piping 302, and the filter 201 are constituted such that a liquid to be purified can flow in the interior of each of these members. These members are connected to one another and form a flow path S3 (path through which the liquid to be purified flows). The constitutions of the piping and each filter are as described above.

The filtering device 300 has the filter BU on the upstream side of the filter A on the flow path. Therefore, the pot life of the filter A is further extended. Furthermore, the filtering device 300 has the filter BD on the downstream side of the filter A on the flow path. Therefore, the fine particles mixed into the liquid to be purified due to the filter A can be efficiently removed, and as a result, a chemical liquid having further improved defect inhibition performance can be easily obtained.

Third Embodiment

Figure 4:
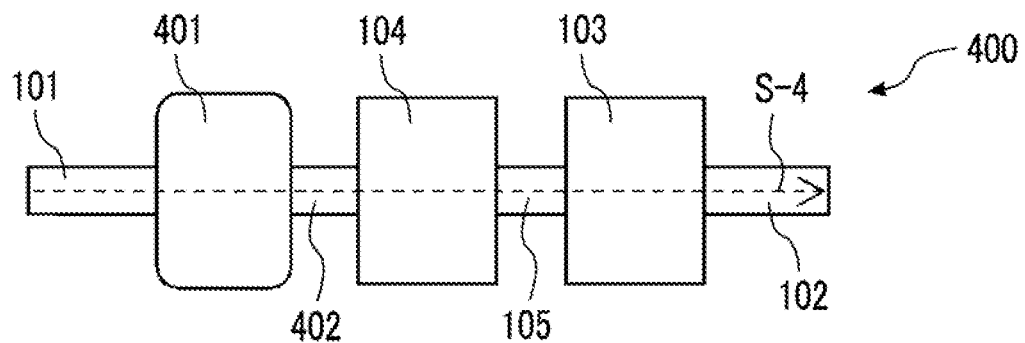
FIG. 4 is a schematic view illustrating a filtering device according to a third embodiment of the present invention.

FIG. 4 is a schematic view illustrating a filtering device according to a third embodiment of the present invention.

A filtering device 400 further includes a tank 401 disposed in series with a filter A on the upstream side of the filter 104 (filter BU) on a flow path S4 between the inlet portion 101 and the outlet portion 102. The tank 401, the filter 104 (filter BU), and the filter 103 (filter A) are arranged in series through a piping 402 and the piping 105. The tank 401 constitutes the flow path S4 together with the filters, pipings, and the like described above.

In the filtering device 400, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The filtering device according to the present embodiment has a tank on the upstream side of the filter 104. Therefore, the liquid to be purified that will flow through the filter 104 can be retained in the tank and can be homogenized. As a result, a chemical liquid having further improved defect inhibition performance is obtained. Particularly, in a case where circulation filtration, which will be described later, is performed, and the liquid to be purified is returned to the upstream of a first reference filter, which is selected from the group consisting of the filter 104 (filter BU) and the filter 103 (filter A), in the flow path S4 from at least the downstream of the first reference filter in the flow path S4, the tank 401 can be used to receive the returned liquid to be purified. In a case where the tank 401 is used as described above, the returned liquid to be purified can be retained in the tank, homogenized, and passed again through the subsequent filters. Therefore, a chemical liquid having further improved defect inhibition performance is obtained.

The material component of the tank 401 is not particularly limited, and the same material component as the material component of the housing described above can be used. It is preferable that at least a portion of the liquid contact portion of the tank 401 (preferably 90% or more of the surface area of the liquid contact portion, and more preferably 99% or more of the surface area of the liquid contact portion) consists of the anticorrosive material which will be described later.

Modification Example of Filtering Device According to Third Embodiment

Figure 5:
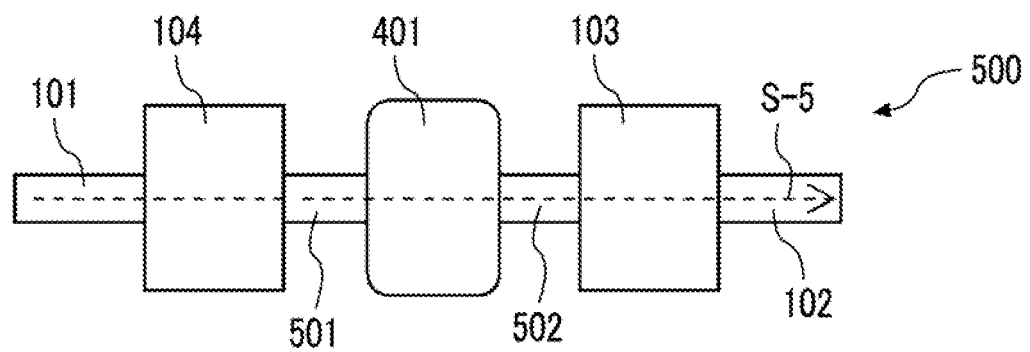
FIG. 5 is a schematic view illustrating a modification example of the filtering device according to the third embodiment of the present invention.

FIG. 5 is a schematic view illustrating a modification example of the filtering device according to the third embodiment of the present invention.

A filtering device 500 further includes the tank 401 disposed in series on the downstream side of the filter 104 (filter BU) on a flow path S5 between the inlet portion 101 and the outlet portion 102. The filter 104 (filter BU), the tank 401, and the filter 103 (filter A) are arranged in series through a piping 501 and a piping 502. The tank 401 constitutes a flow path S5 together with the filters, pipings, and the like described above.

In the filtering device 500, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The filtering device according to the present embodiment has a tank on the downstream side of the filter BU. Therefore, the liquid to be purified filtered through the filter BU can be retained in the tank. Particularly, in a case where circulation filtration, which will be described later, is performed, and the liquid to be purified is returned to the upstream side of the filter 103 in the flow path S5 from the downstream side of the filter 103 (reference filter) in the flow path S5, the tank 401 can be used to retain the returned liquid to be purified. In a case where the tank 401 is used as described above, the returned liquid to be purified can be retained in the tank, homogenized, and passed again through the filter 103. Therefore, a chemical liquid having further improved defect inhibition performance is obtained.

In the filtering device 500 according to the present embodiment, the tank 401 is disposed on the upstream side of the filter 103 (filter A) on the flow path S5. However, in the filtering device according to the present embodiment, the tank 401 may be disposed on the downstream side of the filter 103 on the flow path S5.

As described above, the tank 401 can be used to retain the returned liquid to be purified during circulation filtration. In other words, the tank 401 can be a starting point of the circulation filtration. In this case, either a filter on the downstream side of the tank 401 (filter 103 in the filtering device 500) or a filter on the upstream side of the tank 401 (filter 104 in the filtering device 500) on the flow path S5 is frequently used as a filter for circulation filtration. The starting point of the circulation filtration includes a starting point in a case where the tank constitutes a return flow path or a starting point in a case where a piping on the upstream or downstream side of the tank constitutes a return flow path.

In the filtering device 500, the tank 401 is disposed on the upstream side of the filter 103 (filter A). In a case where the tank 401 is disposed on the upstream side of the filter 103 (filter A), and filtration is repeated using a filter disposed on the downstream side of the tank 401 in the flow path S5 during circulation filtration, it is possible to adopt a flow in which particle-like impurities are finally removed using the filter 103 (filter A) from the liquid to be purified filtered through the filter BU (for example, a filter having ion exchange groups).

The filtering device according to the present embodiment may be in the form of a filtering device in which the filter A and the filter BD are arranged in series in this order (for example, the second embodiment), and in the form of a filtering device in which the filter BU, the filter A, and the filter BD are arranged in series in this order (for example, a modification example of the second embodiment), and the tank 401 is further provided on the upstream or downstream side of the filter A.

Fourth Embodiment

Figure 6:
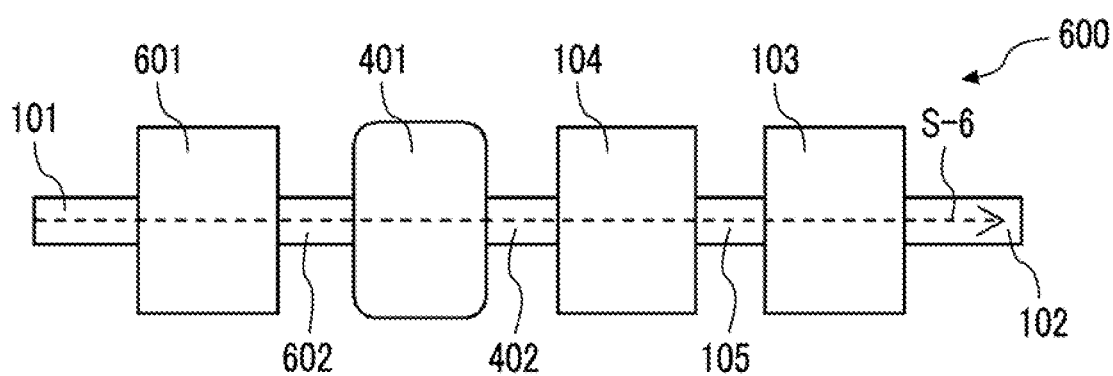
FIG. 6 is a schematic view illustrating a filtering device according to a fourth embodiment of the present invention.

FIG. 6 is a schematic view illustrating a filtering device according to a fourth embodiment of the present invention.

A filtering device 600 includes a filter 601 as a filter C, a tank 401, a filter 104 as a filter BU, and a filter 103 as a filter A that are arranged in series through a piping 602, a piping 402, and a piping 105 between an inlet portion 101 and an outlet portion 102.

In the filtering device 600, the inlet portion 101, the filter 601, the piping 602, the tank 401, the piping 402, the filter 104, the piping 105, the filter 103, and the outlet portion 102 form a flow path S6.

In the filtering device 600, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

The filter 601 (filter C) is a filter which is disposed on the upstream side of the tank 401 in the flow path S6 and has a pore size equal to or greater than 20 nm. In the filtering device according to the present embodiment, a filter having a predetermined pore size is disposed on the upstream side of the tank 401 in the flow path S6. Therefore, impurities and the like contained in the liquid to be purified flowing into the filtering device from the inlet portion 101 can be removed in advance by using the filter 601. Accordingly, it is possible to further reduce the amount of impurities mixed into the flow path after the piping 602. As a result, it is possible to further extend the pot life of the subsequent filter BU and filter A (or the filter BD in a case where the filter BD is disposed in the flow path). Consequently, with the filtering device described above, it is possible to stably manufacture a chemical liquid having further improved defect inhibition performance.

The form of the filter C is not particularly limited, and the filter C may be the same filter as the filter A described above or a different filter (filter B). Particularly, in view of easily obtaining a chemical liquid having further improved defect inhibition performance, the filter C is preferably the filter B. Especially, as the material and pore structure of the filter C, those described as the material and pore structure of the filter BD are preferable. The pore size of the filter C may be equal to or greater than 20 nm, and is preferably equal to or greater than 50 nm. The upper limit thereof is not particularly limited, but is preferably equal to or smaller than 250 nm in general.

The filtering device according to the present embodiment may be in the form of a filtering device in which the filter A and the filter BD are arranged in series in this order on the flow path (for example, the second embodiment), and in the form of a filtering device in which the filter BU, the filter A, and the filter BD are arranged in series in this order on the flow path (for example, a modification example of the second embodiment), a tank is further provided on the downstream side of the filter A, and the filter C is provided on the upstream side of the tank.

Fifth Embodiment

FIG. 7 is a schematic view of a filtering device according to a fifth embodiment of the present invention. A filtering device 700 includes an inlet portion 101, an outlet portion 102, a filter 104 as a filter BU, and a filter 103 as a filter A, in which the filter 104 and the filter 103 are arranged in series between the inlet portion 101 and the outlet portion 102, and a flow path S7 extending from the inlet portion 101 to the outlet portion 102 is formed.

In the filtering device 700, the inlet portion 101, the filter 104, a piping 105, the filter 103, and the outlet portion 102 form the flow path S7.

In the filtering device 700, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 700, a return flow path R7 is formed which is capable of returning the liquid to be purified can be to the upstream side of the filter 104 in the flow path S7 from the downstream side of the filter 104 (and the filter 103) in the flow path S7. Specifically, the filtering device 700 has a piping 701 for return, and the piping 701 forms a return flow path R7. One end of the piping 701 is connected to the flow path S7 on the downstream side of the filter 104 (and the filter 103) and the other end thereof is connected to the flow path S7 on the upstream side of the filter 104. On the return flow path R7, a pump, a damper, a valve, and the like not shown in the drawing may be arranged. Particularly, it is preferable to dispose a valve in connection portions J1 and J2 shown in FIG. 7 so as to control the liquid to be purified such that the liquid does not unintentionally flow through the return flow path.

The liquid to be purified that has flowed through the return flow path R7 and has been returned to the upstream side of the filter 104 (in the flow path S7) is filtered through the filter 104 and the filter 103 in the process of flowing again through the flow path S7. This process is called circulation filtration. The filtering device 700 can perform the circulation filtration, and as a result, a chemical liquid having further improved defect inhibition performance is easily obtained.

In FIG. 7, the piping 701 is disposed on the flow path S7 such that the liquid to be purified can be returned to the upstream side of the filter 104 (filter BU) from the downstream side of the filter 103 (filter A). That is, the filtering device has a return flow path in which the filter 104 is adopted as a first reference filter and through which the liquid to be purified can be returned to the upstream side of the first reference filter from the downstream side of the first reference filter. The filtering device according to the present embodiment is not limited to the above, and may have a return flow path in which the filter 103 (filter A) is adopted as a first reference filter and through which the liquid to be purified can be returned to a position that is on the downstream side of the filter 104 and on the upstream side of the filter 103 from the downstream side of the filter 103.

In FIG. 7, the return flow path R7 is formed only of piping. However, the return flow path R7 may be formed of one or plural tanks and pipings described above.

FIG. 8 is a schematic view illustrating a modification example of the filtering device according to the fifth embodiment of the present invention.

The filtering device 800 has an inlet portion 101, tanks 401(a) and 401 (b), an outlet portion 102, a filter 103 as a filter A, and a filter 104 as a filter BD. The tank 401(a), filter 104, the filter 103, and the tank 401(b) are arranged in series between the inlet portion 101 and the outlet portion 102, and the inlet portion 101, the tank 401(a), a piping 802, the filter 104, a piping 803, the filter 103, a piping 804, the tank 401(b), and the outlet portion 102 form a flow path S8.

In the filtering device 800, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 800, a return flow path R8 is formed which is capable of returning the liquid to be purified to the upstream side of the tank 401(a) disposed on the upstream side of the filter 103 on the flow path S8 from the downstream side of the tank 401(b) disposed on the downstream side of the filter 103 on the flow path S8. One end of a piping 801 is connected to the flow path S8 on the downstream side of the tank 401(b), and the other end thereof is connected to the flow path S8 on the upstream side of the tank 401(a). On the return flow path R8, a pump, a damper, a valve, and the like not shown in the drawing may be arranged.

In the filtering device according to the present embodiment, the starting point of the return flow path R8 is disposed on the downstream side of the tank 401(b) on the flow path, and the end point of the return flow path R8 is disposed on the upstream side of the tank 401(a) on the flow path. In a case where the return flow path is constituted as described above, during circulation filtration, the liquid to be purified can be returned after being retained or can flow again after being retained. As a result, a chemical liquid having further improved defect inhibition performance can be obtained. The filtering device according to the present embodiment may be in the form of a filtering device in which the tank 401(b) and the piping 801 are directly connected to each other, in the form of a filtering device in which the tank 401(a) and the piping 801 are directly connected to each other, or in the form of a filtering device as a combination of these.

Sixth Embodiment

Figure 9:
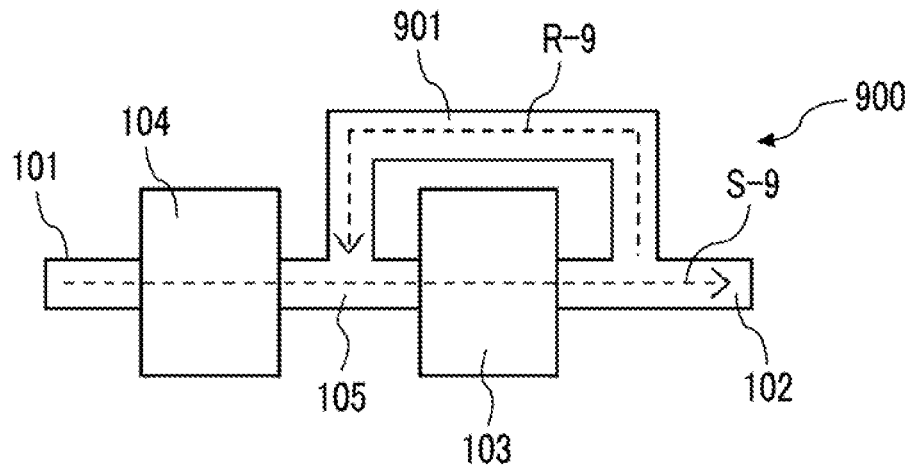
FIG. 9 is a schematic view illustrating a filtering device according to a sixth embodiment of the present invention.

FIG. 9 is a schematic view of a filtering device according to a sixth embodiment of the present invention. A filtering device 900 includes an inlet portion 101, an outlet portion 102, a filter 104 as a filter BU, and a filter 103 as a filter A, in which the filter 104 and the filter 103 are arranged in series between the inlet portion 101 and the outlet portion 102, and a flow path S9 extending from the inlet portion 101 to the outlet portion 102 is formed.

In the filtering device 900, the inlet portion 101, the filter 103, a piping 105, the filter 104, and the outlet portion 102 form the flow path S9.

In the filtering device 900, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 900, a return flow path R9 is formed which is capable of returning the liquid to be purified to a position that is on the downstream side of the filter 104 and on the upstream side of the filter 103 on the flow path S9 from the downstream side of the filter 103 on the flow path S9. Specifically, the filtering device 900 has a piping 901 for return, and the piping 901 forms a return flow path R9. One end of the piping 901 is connected to the flow path S9 on the downstream side of the filter 103, and the other end thereof is connected to the flow path S9 at a position which is on the upstream side of the filter 103 and on the downstream side of the filter 104. On the return flow path R9, a pump, a damper, a valve, and the like not shown in the drawing may be arranged.

The liquid to be purified that has flowed through the return flow path R9 and has been returned to a position, which is on the downstream side of the filter 104 and on the upstream side of the filter 103, is filtered through the filter 103 in the process of flowing again through the flow path S9. Particularly, in a case where the filter 104 is a filter containing a resin having ion exchange groups as a material component, it is possible to remove particle-like impurities from the liquid to be purified filtered through the filter 104 by using the filter 103 by means of circulation filtration. As a result, a chemical liquid having further improved defect inhibition performance can be easily obtained.

In FIG. 9, the piping 901 is disposed such that the liquid to be purified can be returned to a position, which is on the downstream side of the filter BU and on the upstream side of the filter A on the flow path S9, from the downstream side of the filter 103 (filter A: first reference filter) on the flow path S9. However, in the filtering device according to the present embodiment, in a case where the filter A and the filter BD are arranged in series in this order on the flow path, the flow path may be formed such that the liquid to be purified can be returned to a position, which is on the upstream side of the filter BD or on the upstream side of the filter A on the flow path, from the downstream side of the filter BD (second reference filter).

Figure 10:
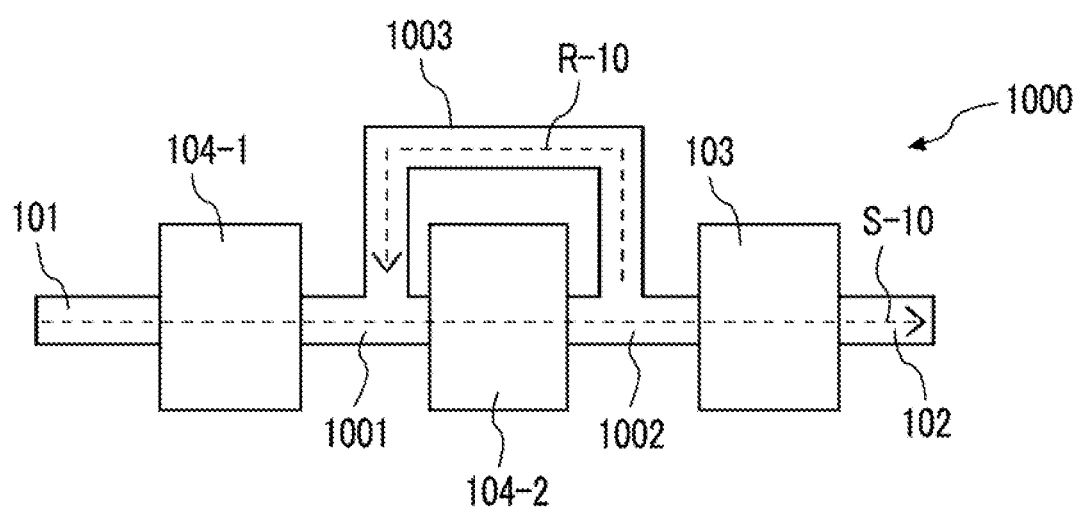
FIG. 10 is a schematic view illustrating a modification example of the filtering device according to the sixth embodiment of the present invention.

FIG. 10 is a schematic view illustrating a modification example of the filtering device according to the present embodiment. A filtering device 1000 includes an inlet portion 101, an outlet portion 102, a filter 104-1 as a filter BU, a filter 104-2 (first reference filter) as a filter BD, and a filter 103, in which the filter 104-1, the filter 104-2, and the filter 103 are arranged in series between the inlet portion 101 and the outlet portion 102, and a flow path S10 extending from the inlet portion 101 to the outlet portion 102 is formed.

In the filtering device 1000, the inlet portion 101, the filter 104-1, a piping 1001, the filter 104-2, a piping 1002, the filter 103, and the outlet portion 102 form the flow path S10.

In the filtering device 1000, the form of each filter, piping, and the like are the same as those of the filtering device according to the first embodiment described above. In the following section, only the parts different from the first embodiment will be described. Therefore, the matters that are not described below are the same as those of the filtering device according to the first embodiment.

In the filtering device 1000, a return flow path R10 is formed which is capable of returning the liquid to be purified to a position, which is the downstream of the filter 104-1 and the upstream of the filter 104-2 (first reference filter), from the downstream of the filter 104-2 (first reference filter) on the flow path S10. Specifically, the filtering device 1000 has a piping 1003 for return, and the piping 1003 forms a return flow path R10. One end of the piping 1003 is connected to the flow path S10 at a position which is on the upstream side of the filter 103 and on the downstream side of the filter 104-2, and the other end thereof is connected to the flow path S10 at a position which is on the downstream side of the filter 104-1 and on the upstream side of the filter 104-2. On the return flow path R10, a pump, a damper, a valve, and the like not shown in the drawing may be arranged.

The liquid to be purified that has been returned to a position, which is on the downstream side of the filter 104-1 and on the upstream side of the filter 104-2 on the flow path S10, through the return flow path R10 is filtered through the filter 104-2 in the process of flowing again through the flow path S10. The filtering device 1000 can perform circulation filtration. As a result, a chemical liquid having further improved defect inhibition performance can be easily obtained.

In the filtering device shown in FIG. 10, the return flow path R10 is formed which is capable of returning the liquid to be purified to the upstream side of the filter 104-2 from the downstream side of the filter 104-2 on the flow path S10, that is, from the upstream side of the filter 103. However, the filtering device according to the present embodiment is not limited thereto, and may be a filtering device in which a return flow path capable of returning the liquid to be purified to the upstream side of the filter 104-1 from the downstream of the filter 104-2 is formed, or the like.

Furthermore, a filtering device, in which the filter A, the filter BD (referred to as filter BD-1), and the filter BD (referred to as filter BD-2) are arranged in series in this order, may have a return flow path capable of returning the liquid to be purified to the upstream side of the filter BD-1 (the upstream side may be a position which is on the upstream side of the filter BD-2 and on either the downstream side or the upstream side of the filter A) from the downstream side of the filter BD-1 (second reference filter) (the downstream side may be a position which is on the upstream side of the filter BD-2 and on either the downstream side or the upstream side of the filter BD-2).

Method for Manufacturing Chemical Liquid (First Embodiment)

The method for manufacturing a chemical liquid according to an embodiment of the present invention is a chemical liquid manufacturing method for obtaining a chemical liquid by purifying a liquid to be purified. The method has a filtration step of filtering a liquid to be purified by using the filtering device described above so as to obtain a chemical liquid.

[Liquid to be Purified]

The liquid to be purified to which the method for manufacturing a chemical liquid according to the embodiment of the present invention can be applied is not particularly limited. However, it is preferable that the liquid to be purified contains a solvent. Examples of the solvent include an organic solvent, and water, and the like. It is preferable that the liquid to be purified contains an organic solvent. In the following description, the liquid to be purified will be divided into an organic solvent-based liquid to be purified in which the content of an organic solvent (total content in a case where the liquid to be purified contains a plurality of organic solvents) with respect to the total mass of solvents contained in the liquid to be purified is greater than 50% by mass, and an aqueous liquid to be purified in which the content of water with respect to the total mass of solvents contained in the liquid to be purified is greater than 50% by mass.

<Organic Solvent-Based Liquid to be Purified>

(Organic Solvent)

The organic solvent-based liquid to be purified contains a solvent, in which the content of the organic solvent is greater than 50% by mass with respect to the total mass of solvents contained in the liquid to be purified.

The organic solvent-based liquid to be purified contains an organic solvent. The content of the organic solvent in the organic solvent-based liquid to be purified is not particularly limited, but is preferably equal to or greater than 99.0% by mass with respect to the total mass of the organic solvent-based liquid to be purified in general. The upper limit thereof is not particularly limited, but is preferably equal to or smaller than 99.99999% by mass in general.

One kind of organic solvent may be used singly, or two or more kinds of organic solvents may be used in combination. In a case where two or more kinds of organic solvents are used in combination, the total content thereof is preferably within the above range.

In the present specification, an organic solvent means one liquid organic compound which is contained in the liquid to be purified in an amount greater than 10,000 ppm by mass with respect to the total mass of the liquid to be purified. That is, in the present specification, a liquid organic compound contained in the liquid to be purified in an amount greater than 10,000 ppm by mass with respect to the total mass of the liquid to be purified corresponds to an organic solvent.

In the present specification, "liquid" means that the compound stays in liquid form at 25° C. under atmospheric pressure.

The type of the organic solvent is not particularly limited, and known organic solvents can be used. Examples of the organic solvent include alkylene glycol monoalkyl ether carboxylate, alkylene glycol monoalkyl ether, a lactic acid alkyl ester, alkyl alkoxypropionate, cyclic lactone (preferably having 4 to 10 carbon atoms), a monoketone compound which may have a ring (preferably having 4 to 10 carbon atoms), alkylene carbonate, alkoxyalkyl acetate, alkyl pyruvate, and the like.

Furthermore, as the organic solvent, for example, those described in JP2016-057614A, JP2014-219664A, JP2016-138219A, and JP2015-135379A may also be used.

As the organic solvent, at least one kind of compound is preferable which is selected from the group consisting of propylene glycol monomethyl ether (PGMM), propylene glycol monoethyl ether (PGME), propylene glycol monopropyl ether (PGMP), propylene glycol monomethyl ether acetate (PGMEA), ethyl lactate (EL), methyl methoxypropionate (MPM), cyclopentanone (CyPn), cyclohexanone (CyHe), γ-butyrolactone (γBL), diisoamyl ether (DIAE), butyl acetate (nBA), isoamyl acetate (iAA), isopropanol (IPA), 4-methyl-2-pentanol (MIBC), dimethylsulfoxide (DMSO), n-methyl-2-pyrrolidone (NMP), diethylene glycol (DEG), ethylene glycol (EG), dipropylene glycol (DPG), propylene glycol (PG), ethylene carbonate (EC), propylene carbonate (PC), sulfolane, cycloheptanone, and 2-heptanone (MAK).

The type and content of the organic solvent in the liquid to be purified can be measured using a gas chromatography mass spectrometer.

(Other Components)

The liquid to be purified may contain other components in addition to the above components. Examples of those other components include an inorganic substance (such as metal ions, metal particles, and metal oxide particles), a resin, an organic substance other than a resin, water, and the like.

Inorganic Substance

The liquid to be purified may contain an inorganic substance. The inorganic substance is not particularly limited, and examples thereof include metal ions, metal-containing particles, and the like.

The form of the metal-containing particles is not particularly limited as long as the particles contain metal atoms. For example, the metal-containing particles are in the form of simple metal atoms, compounds containing metal atoms (hereinafter, also referred to as "metal compound"), a complex of these, and the like. Furthermore, the metal-containing particles may contain a plurality of metal atoms.

The complex is not particularly limited, and examples thereof include a so-called core-shell type particle having a simple metal atom and a metal compound covering at least a portion of the simple metal atom, a solid solution particle including a metal atom and another atom, a eutectic particle including a metal atom and another atom, an aggregate particle of a simple metal atom and a metal compound, an aggregate particle of different kinds of metal compounds, a metal compound in which the composition thereof continuously or intermittently changes toward the center of the particle from the surface of the particle, and the like.

The atom other than the metal atom contained in the metal compound is not particularly limited, and examples thereof include a carbon atom, an oxygen atom, a nitrogen atom, a hydrogen atom, a sulfur atom, a phosphorus atom, and the like.

The metal atom is not particularly limited, and examples thereof include a Fe atom, an Al atom, a Cr atom, a Ni atom, a Pb atom, a Zn atom, a Ti atom, and the like. The metal-containing particles may contain one kind of each of the aforementioned metal atoms singly or may contain two or more kinds of the aforementioned metal atoms in combination.

The particle size of the metal-containing particles is not particularly limited, but is generally 1 to 100 nm in many cases.

The inorganic substance may be added to the liquid to be purified, or may be unintentionally mixed into the liquid to be purified in the manufacturing process. Examples of the case where the inorganic substance is unintentionally mixed into the liquid to be purified in the manufacturing process of the chemical liquid include, but are not limited to, a case where the inorganic substance is contained in a raw material (for example, an organic solvent) used for manufacturing the chemical liquid, a case where the inorganic substance is mixed into the liquid to be purified in the manufacturing process of the chemical liquid (for example, contamination), and the like.

(Resin)

The liquid to be purified may contain a resin.

The chemical liquid may further contain a resin. As the resin, a resin P having a group which is decomposed by the action of an acid and generates a polar group is more preferable. As such a resin, a resin having a repeating unit represented by Formula (AI) that will be described later is more preferable, which is a resin whose solubility in a developer containing an organic solvent as a main component is reduced by the action of an acid. The resin having a repeating unit represented by Formula (AI), which will be described later, has a group that is decomposed by the action of an acid and generates an alkali-soluble group (hereinafter, also referred to as an "acid-decomposable group").

Examples of the polar group include an alkali-soluble group. Examples of the alkali-soluble group include a carboxy group, a fluorinated alcohol group (preferably a hexafluoroisopropanol group), a phenolic hydroxyl group, and a sulfo group.

In the acid-decomposable group, the polar group is protected by a group leaving by an acid (acid leaving group). Examples of the acid leaving group include —C($R_{36}$)($R_{37}$)($R_{38}$), —C($R_{36}$)($R_{37}$)(O$R_{39}$), —C($R_{01}$)($R_{02}$)(O$R_{39}$), and the like.

In the formulas, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

Hereinafter, the resin P whose solubility in a developer containing an organic solvent as a main component is reduced by the action of an acid will be specifically described.

(Formula (AI): Repeating Unit Having Acid-Decomposable Group)

It is preferable that the resin P has a repeating unit represented by Formula (AI).

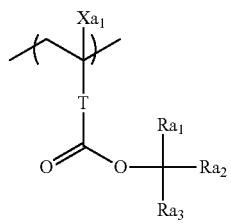

(AI)

In Formula (AI), $Xa_1$ represents a hydrogen atom or an alkyl group which may have a substituent.

T represents a single bond or a divalent linking group.

$Ra_1$ to $Ra_3$ each independently represent an alkyl group (linear or branched) or a cycloalkyl group (monocyclic or polycyclic).

Two out of $Ra_1$ to $Ra_3$ may be bonded to each other to form a cycloalkyl group (monocyclic or polycyclic).

Examples of the alkyl group which is represented by $Xa_1$ and may have a substituent include a methyl group and a group represented by —$CH_2$—$R_{11}$. $R_{11}$ represents a halogen atom (such as a fluorine atom), a hydroxyl group, or a monovalent organic group.

$Xa_1$ is preferably a hydrogen atom, a methyl group, a trifluoromethyl group, or a hydroxymethyl group.

Examples of the divalent linking group represented by T include an alkylene group, a —COO-Rt- group, a —O-Rt- group, and the like. In the formulas, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

The alkyl group represented by $Ra_1$ to $Ra_3$ preferably has 1 to 4 carbon atoms.

The cycloalkyl group represented by $Ra_1$ to $Ra_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group.

The cycloalkyl group formed by the bonding of two out of $Ra_1$ to $Ra_3$ is preferably a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group. Among these, a monocyclic cycloalkyl group having 5 or 6 carbon atoms is more preferable.

In the cycloalkyl group formed by the bonding of two out of $Ra_1$ to $Ra_3$, for example, one of the methylene groups constituting a ring may be substituted with a hetero atom such as an oxygen atom or with a group having a hetero atom such as a carbonyl group.

As the repeating unit represented by Formula (AI), for example, an embodiment is preferable in which Ra$_1$ is a methyl group or an ethyl group, and Ra$_2$ and Ra$_3$ are bonded to each other to form the cycloalkyl group described above.

Each of the above groups may have a substituent. Examples of the substituent include an alkyl group (having 1 to 4 carbon atoms), a halogen atom, a hydroxyl group, an alkoxy group (having 1 to 4 carbon atoms), a carboxy group, an alkoxycarbonyl group (having 2 to 6 carbon atoms), and the like. The number of carbon atoms in the substituent is preferably equal to or smaller than 8.

The content of the repeating unit represented by Formula (AI) with respect to all the repeating units in the resin P is preferably from 20 to 90 mol %, more preferably from 25 to 85 mol %, and even more preferably from 30 to 80 mol %.

(Repeating Unit Having Lactone Structure)

Furthermore, it is preferable that the resin P contains a repeating unit Q having a lactone structure.

The repeating unit Q having a lactone structure preferably has a lactone structure on a side chain. The repeating unit Q is more preferably a repeating unit derived from a (meth) acrylic acid derivative monomer.

One kind of repeating unit Q having a lactone structure may be used singly, or two or more kinds of repeating units Q may be used in combination. However, it is preferable to use one kind of repeating unit Q singly.

The content of the repeating unit Q having a lactone structure with respect to all the repeating units in the resin P is preferably 3 to 80 mol %, and more preferably 3 to 60 mol %.

The lactone structure is preferably a 5- to 7-membered lactone structure, and more preferably a structure in which another ring structure is fused with a 5- to 7-membered lactone structure by forming a bicyclo structure or a spiro structure.

It is preferable that the lactone structure has a repeating unit having a lactone structure represented by any of Formulas (LC1-1) to (LC1-17). The lactone structure is preferably a lactone structure represented by Formula (LC1-1), Formula (LC1-4), Formula (LC1-5), or Formula (LC1-8), and is more preferably a lactone structure represented by Formula (LC1-4).

LC1-1

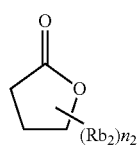

LC1-2

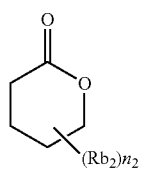

LC1-3

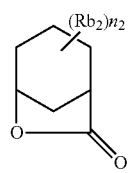

LC1-4

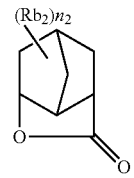

LC1-5

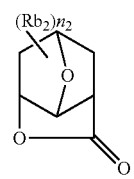

LC1-6

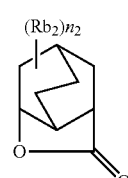

LC1-7

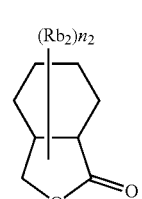

LC1-8

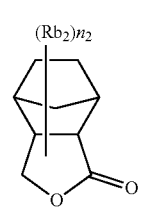

LC1-9

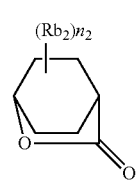

LC1-10

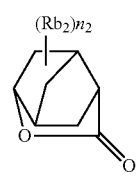

LC1-11

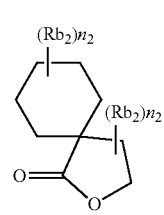

LC1-12

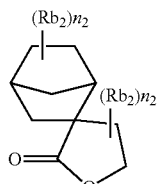

LC1-13

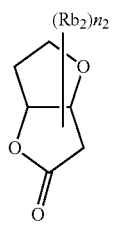

LC1-14

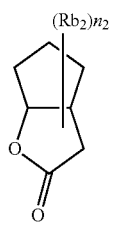

LC1-15

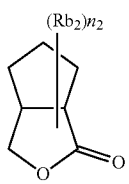

LC1-16

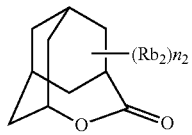

LC1-17

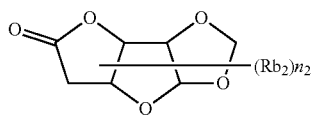

The lactone structure portion may have a substituent (Rb₂). As the substituent (Rb₂), for example, an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxy group, a halogen atom, a hydroxyl group, a cyano group, an acid-decomposable group, and the like are preferable. $n_2$ represents an integer of 0 to 4. In a case where $n_2$ is equal to or greater than 2, a plurality of substituents (Rb₂) may be the same as or different from each other, and the plurality of substituents (Rb₂) may be bonded to each other to form a ring.

(Repeating Unit Having Phenolic Hydroxyl Group)

The resin P may also contain a repeating unit having a phenolic hydroxyl group.

Examples of the repeating unit having a phenolic hydroxyl group include a repeating unit represented by General Formula (I).

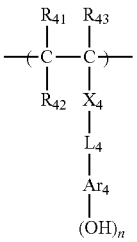

(I)

In the formula, $R_{41}$, $R_{42}$ and $R_{43}$ each independently represent a hydrogen atom, an alkyl group, a halogen atom, a cyano group, or an alkoxycarbonyl group. Here, $R_{42}$ may be bonded to $Ar_4$ to form a ring, and in this case, $R_{42}$ represents a single bond or an alkylene group.

$X_4$ represents a single bond, —COO—, or —CONR₆₄—, and $R_{64}$ represents a hydrogen atom or an alkyl group.

$L_4$ represents a single bond or an alkylene group.

$Ar_4$ represents an (n+1)-valent aromatic ring group. In a case where $Ar_4$ is bonded to $R_{42}$ to form a ring, $Ar_4$ represents an (n+2)-valent aromatic ring group.

n represents an integer of 1 to 5.

As the alkyl group represented by $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, or a dodecyl group which may have a substituent, is preferable, an alkyl group having 8 or less carbon atoms is more preferable, and an alkyl group having 3 or less carbon atoms is even more preferable.

The cycloalkyl group represented by $R_{41}$, $R_{42}$, and $R_{43}$ in General Formula (I) may be monocyclic or polycyclic. The cycloalkyl group is preferably a monocyclic cycloalkyl group having 3 to 8 carbon atoms such as a cyclopropyl group, a cyclopentyl group, or a cyclohexyl group which may have a substituent.

Examples of the halogen atom represented by $R_{41}$, $R_{42}$, and $R_{43}$ in General Formula (I) include a fluorine atom, a chlorine atom, a bromine atom, and an iodine atom. Among these, a fluorine atom is preferable.

As the alkyl group included in the alkoxycarbonyl group represented by $R_{41}$, $R_{42}$, and $R_{43}$ in General Formula (I), the same alkyl group as the alkyl group represented by $R_{41}$, $R_{42}$, and $R_{43}$ described above is preferable.

Examples of the substituent in each of the above groups include an alkyl group, a cycloalkyl group, an aryl group, an amino group, an amide group, a ureido group, a urethane group, a hydroxy group, a carboxy group, a halogen atom, an alkoxy group, a thioether group, an acyl group, an acyloxy group, an alkoxycarbonyl group, a cyano group, a nitro group, and the like. The number of carbon atoms in the substituent is preferably equal to or smaller than 8.

$Ar_4$ represents an (n+1)-valent aromatic ring group. In a case where n is 1, the divalent aromatic ring group may have a substituent, and examples thereof include arylene groups having 6 to 18 carbon atoms, such as a phenylene group, a tolylene group, a naphthylene group, and an anthracenylene group, and aromatic ring groups having a hetero ring such as thiophene, furan, pyrrole, benzothiophene, benzofuran, benzopyrrole, triazine, imidazole, benzimidazole, triazole, thiadiazole, and thiazole.

In a case where n is an integer equal to or greater than 2, specific examples of the (n+1)-valent aromatic ring group include groups obtained by removing (n−1) pieces of any hydrogen atom from the aforementioned specific examples of the divalent aromatic ring group.

The (n+1)-valent aromatic ring group may further have a substituent.

Examples of the substituent that the aforementioned alkyl group, cycloalkyl group, alkoxycarbonyl group, alkylene group, and (n+1)-valent aromatic ring group can have include the alkyl group exemplified above as $R_{41}$, $R_{42}$, and $R_{43}$ in General Formula (I); an alkoxy group such as a methoxy group, an ethoxy group, a hydroxyethoxy group, a propoxy group, a hydroxypropoxy group, and a butoxy group; and an aryl group such as a phenyl group.

Examples of the alkyl group represented by $R_{64}$ in —$CONR_{64}$— ($R_{64}$ represents a hydrogen atom or an alkyl group) represented by $X_4$ include an alkyl group having 20 to or less carbon atoms, such as a methyl group, an ethyl group, a propyl group, an isopropyl group, a n-butyl group, a sec-butyl group, a hexyl group, a 2-ethylhexyl group, an octyl group, and a dodecyl group which may have a substituent. Among these, an alkyl group having 8 or less carbon atoms is more preferable.

$X_4$ is preferably a single bond, —COO— or —CONH—, and more preferably a single bond or —COO—.

The alkylene group represented by $L_4$ is preferably an alkylene group having 1 to 8 carbon atoms such as a methylene group, an ethylene group, a propylene group, a butylene group, a hexylene group, and an octylene group which may have a substituent.

$Ar_4$ is preferably an aromatic ring group having 6 to 18 carbon atoms that may have a substituent, and more preferably a benzene ring group, a naphthalene ring group, or a biphenylene ring group.

It is preferable that the repeating unit represented by General Formula (I) comprises a hydroxystyrene structure. That is, $Ar_4$ is preferably a benzene ring group.

The content of the repeating unit having a phenolic hydroxyl group with respect to all the repeating units in the resin P is preferably 0 to 50 mol %, more preferably 0 to 45 mol %, and even more preferably 0 to 40 mol %.

(Repeating Unit Containing Organic Group Having Polar Group)

The resin P may further contain a repeating unit containing an organic group having a polar group, particularly, a repeating unit having an alicyclic hydrocarbon structure substituted with a polar group. In a case where the resin P further contains such a repeating unit, the substrate adhesion and the affinity with a developer are improved.

The alicyclic hydrocarbon structure substituted with a polar group is preferably an adamantyl group, a diamantyl group, or a norbornane group. As the polar group, a hydroxyl group or a cyano group is preferable.

In a case where the resin P contains a repeating unit containing an organic group having a polar group, the content of such a repeating unit with respect to all the repeating units in the resin P is preferably 1 to 50 mol %, more preferably 1 to 30 mol %, even more preferably 5 to 25 mol %, and particularly preferably 5 to 20 mol %.

(Repeating Unit Represented by General Formula (VI))

The resin P may also contain a repeating unit represented by General Formula (VI).

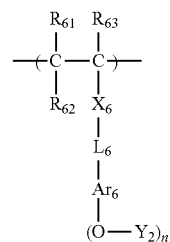

(VI)

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. Here, $R_{62}$ may be bonded to $Ar_6$ to form a ring, and in this case, $R_{62}$ represents a single bond or an alkylene group.

$X_6$ represents a single bond, —COO—, or —$CONR_{64}$—. $R_{64}$ represents a hydrogen atom or an alkyl group.

$L_6$ represents a single bond or an alkylene group.

$Ar_6$ represents an (n+1)-valent aromatic ring group. In a case where $Ar_6$ is bonded to $R_{62}$ to form a ring, $Ar_6$ represents an (n+2)-valent aromatic ring group.

In a case where n≥2, $Y_2$ each independently represents a hydrogen atom or a group which leaves by the action of an acid. Here, at least one of $Y_2$s represents a group which leaves by the action of an acid.

n represents an integer of 1 to 4.

As the group $Y_2$ which leaves by the action of an acid, a structure represented by General Formula (VI-A) is preferable.

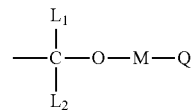

(VI-A)

$L_1$ and $L_2$ each independently represent a hydrogen atom, an alkyl group, a cycloalkyl group, an aryl group, or a group obtained by combining an alkylene group with an aryl group.

M represents a single bond or a divalent linking group.

Q represents an alkyl group, a cycloalkyl group which may have a hetero atom, an aryl group which may have a hetero atom, an amino group, an ammonium group, a mercapto group, a cyano group, or an aldehyde group.

At least two out of Q, M and $L_1$ may be bonded to each other to form a ring (preferably a 5- or 6-membered ring).

The repeating unit represented by General Formula (VI) is preferably a repeating unit represented by General Formula (3).

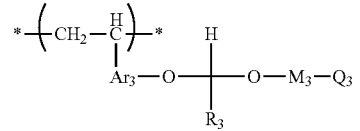

(3)

In General Formula (3),

Ar$_3$ represents an aromatic ring group.

R$_3$ represents a hydrogen atom, an alkyl group, a cycloalkyl group, an aryl group, an aralkyl group, an alkoxy group, an acyl group, or a heterocyclic group.

M$_3$ represents a single bond or a divalent linking group.

Q$_3$ represents an alkyl group, a cycloalkyl group, an aryl group, or a heterocyclic group.

At least two out of Q$_3$, M$_3$, and R$_3$ may be bonded to each other to form a ring.

The aromatic ring group represented by Ar$_3$ is the same as Ar$_6$ in General Formula (VI) in which n is 1. The aromatic ring group is preferably a phenylene group or a naphthylene group, and more preferably a phenylene group.

(Repeating Unit Having Silicon Atom on Side Chain)

The resin P may further contain a repeating unit having a silicon atom on a side chain. Examples of the repeating unit having a silicon atom on a side chain include a (meth)acrylate-based repeating unit having a silicon atom, a vinyl-based repeating unit having a silicon atom, and the like. The repeating unit having a silicon atom on a side chain is typically a repeating unit having a group, which has a silicon atom, on a side chain. Examples of the group having a silicon atom include a trimethylsilyl group, a triethylsilyl group, a triphenylsilyl group, a tricyclohexylsilyl group, a tristrimethylsiloxysilyl group, a tristrimethylsilyl silyl group, a methyl bistrimethylsilyl silyl group, a methyl bistrimethylsiloxysilyl group, a dimethyltrimethylsilyl silyl group, a dimethyl trimethylsiloxysilyl group, cyclic or linear polysiloxane shown below, a cage-like, ladder-like, or random silsesquioxane structure, and the like. In the formula, R and R$^1$ each independently represent a monovalent substituent. * represents a bond.

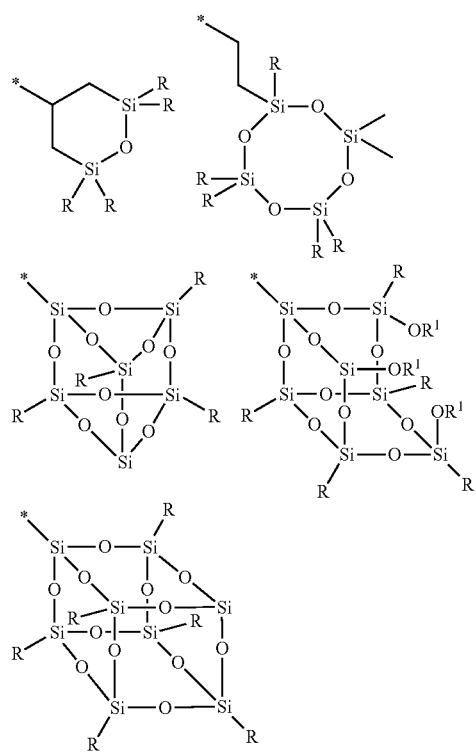

-continued

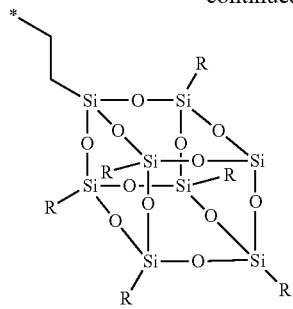

As the repeating unit having the aforementioned group, for example, a repeating unit derived from an acrylate or methacrylate compound having the aforementioned group or a repeating unit derived from a compound having the aforementioned group and a vinyl group is preferable.

In a case where the resin P has the repeating unit having a silicon atom on a side chain, the content of such a repeating unit with respect to all the repeating units in the resin P is preferably 1 to 30 mol %, more preferably 5 to 25 mol %, and even more preferably 5 to 20 mol %.

The weight-average molecular weight of the resin P that is measured by a gel permeation chromatography (GPC) method and expressed in terms of polystyrene is preferably 1,000 to 200,000, more preferably 3,000 to 20,000, and even more preferably 5,000 to 15,000. In a case where the weight-average molecular weight is 1,000 to 200,000, it is possible to prevent the deterioration of heat resistance and dry etching resistance, to prevent the deterioration of developability, and to prevent film forming properties from deteriorating due to the increase in viscosity.

The dispersity (molecular weight distribution) is generally 1 to 5, preferably 1 to 3, more preferably 1.2 to 3.0, and even more preferably 1.2 to 2.0.

As other components (for example, an acid generator, a basic compound, a quencher, a hydrophobic resin, a surfactant, a solvent, and the like) to be contained in the chemical liquid, any known components can be used.

<Aqueous Liquid to be Purified>

The aqueous liquid to be purified contains water in an amount greater than 50% by mass with respect to the total mass of solvents contained in the aqueous liquid to be purified. The content of water is preferably 51% to 95% by mass.

The water is not particularly limited, but it is preferable to use ultrapure water used for manufacturing semiconductors. The ultrapure water is more preferably used after being further purified such that the inorganic anions, metal ions, and the like are reduced. The purification method is not particularly limited, but is preferably purification using a filtration membrane or an ion-exchange membrane and purification by distillation. Furthermore, for example, it is preferable to perform purification by the method described in JP2007-254168A.

(Oxidant)

The aqueous liquid to be purified may contain an oxidant. As the oxidant, known oxidants can be used without particular limitation. Examples of the oxidant include hydrogen peroxide, a peroxide, nitric acid, nitrate, iodate, periodate, hypochlorite, chlorite, chlorate, perchlorate, persulfate, dichromate, permanganate, aqueous ozone, a silver (II) salt, an iron (III) salt, and the like.

The content of the oxidant is not particularly limited, but is preferably equal to or greater than 0.1% by mass and equal to or smaller than 99.0% by mass with respect to the total mass of the aqueous liquid to be purified. One kind of oxidant may be used singly, or two or more kinds of oxidants may be used in combination. In a case where two or more kinds of oxidants are used in combination, the total content thereof is preferably within the above range.

(Inorganic Acid)

The aqueous liquid to be purified may contain an inorganic acid. As the inorganic acid, known inorganic acids can be used without particular limitation. Examples of the inorganic acid include sulfuric acid, phosphoric acid, hydrochloric acid, and the like. The inorganic acid is not included in the oxidant described above.

The content of the inorganic acid in the aqueous liquid to be purified is not particularly limited, but is preferably equal to or greater than 0.01% by mass and equal to or smaller than 99.0% by mass with respect to the total mass of the aqueous liquid to be purified.

One kind of inorganic acid may be used singly, or two or more kinds of inorganic acids may be used in combination. In a case where two or more kinds of inorganic acids are used in combination, the total content thereof is preferably within the above range.

(Anticorrosive)

The aqueous liquid to be purified may contain an anticorrosive. As the anticorrosive, known anticorrosives can be used without particular limitation. Examples of the anticorrosive include 1,2,4-triazole (TAZ), 5-aminotetrazole (ATA), 5-amino-1,3,4-thiadiazole-2-thiol, 3-amino-1H-1,2,4-triazole, 3,5-diamino-1,2,4-triazole, tolyl triazole, 3-amino-5-mercapto-1,2,4-triazole, 1-amino-1,2,4-triazole, 1-amino-1,2,3-triazole, 1-amino-5-methyl-1,2,3-triazole, 3-mercapto-1,2,4-triazole, 3-isopropyl-1,2,4-triazole, naphthotriazole, 1H-tetrazole-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, thiazole, imidazole, benzimidazole, triazine, methyl tetrazole, bismuthiol I, 1,3-dimethyl-2-imidazolidinone, 1,5-pentamethylene tetrazole, 1-phenyl-5-mercaptotetrazole, diaminomethyltriazine, imidazolinethion, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, a phosphate inhibitor, amines, pyrazoles, propanethiol, silanes, secondary amines, benzohydroxamic acids, a heterocyclic nitrogen inhibitor, thiourea, 1,1,3,3-tetramethylurea, urea, urea derivatives, uric acid, potassium ethylxanthate, glycine, dodecyl phosphate, iminodiacetic acid, boric acid, malonic acid, succinic acid, nitrilotriacetic acid, sulfolane, 2,3,5-trimethylpyrazine, 2-ethyl-3,5-dimethylpyrazine, quinoxaline, acetylpyrrole, pyridazine, histadine, pyrazine, glutathione (reduced), cysteine, cystine, thiophene, mercaptopyridine N-oxide, thiamine HCl, tetraethylthiuram disulfide, 2,5-dimercapto-1,3-thiadiazole, catechol, t-butyl catechol, phenol, and pyrogallol.

As the anticorrosive, it is also possible to use aliphatic carboxylic acids such as dodecanoic acid, palmitic acid, 2-ethylhexanoic acid, and cyclohexanoic acid; carboxylic acids having a chelating ability such as citric acid, malic acid, oxalic acid, malonic acid, succinic acid, itaconic acid, maleic acid, glycolic acid, mercaptoacetic acid, thioglycolic acid, salicylic acid, sulfosalicylic acid, anthranilic acid, N-methylanthranilic acid, 3-amino-2-naphthoic acid, 1-amino-2-naphthoic acid, 2-amino-1-naphthoic acid, 1-aminoanthraquinone-2-carboxylic acid, tannic acid, and gallic acid; and the like.

Examples of the anticorrosive also include anionic surfactants such as a palm fatty acid salt, a sulfonated castor oil salt, a lauryl sulfate salt, a polyoxyalkylene allyl phenyl ether sulfate salt, alkylbenzene sulfonic acid, alkylbenzene sulfonate, alkyl diphenyl ether disulfonate, alkyl naphthalene sulfonate, a dialkylsulfosuccinate salt, isopropyl phosphate salt, a polyoxyethylene alkyl ether phosphate salt, and a polyoxyethylene allyl phenyl ether phosphate salt; cationic surfactants such as oleyl aminoacetate, laurylpyridinium chloride, cetylpyridinium chloride, lauryltrimethylammonium chloride, stearyltrimethylammonium chloride, behenyltrimethylammonium chloride, and didecyldimethylammonium chloride; amphoteric surfactants such as palm alkyldimethylamine oxide, fatty acid amidopropyldimethylamine oxide, alkylpolyaminoethyl glycine hydrochloride, an amidobetaine-type activator, an alanine-type activator, and lauryl iminodipropionic acid; nonionic surfactants of a polyoxyalkylene primary alkyl ether or a polyoxyalkylene secondary alkyl ether, such as polyoxyethylene octyl ether, polyoxyethylene decyl ether, polyoxyethylene lauryl ether, polyoxyethylene lauryl amine, polyoxyethylene oleyl amine, polyoxyethylene polystyryl phenyl ether, and polyoxyalkylene polystyryl phenyl ether and other polyoxyalkylene-based nonionic surfactants such as polyoxyethylene dilaurate, polyoxyethylene laurate, polyoxyethylated castor oil, polyoxyethylated hydrogenated castor oil, a sorbitan lauric acid ester, a polyoxyethylene sorbitan lauric acid ester, and fatty acid diethanolamide; fatty acid alkyl esters such as octyl stearate and trimethylolpropane tridecanoate; and polyether polyols such as polyoxyalkylene butyl ether, polyoxyalkylene oleyl ether, and trimethylolpropane tris (polyoxyalkylene) ether.

Examples of commercial products of the above anticorrosives include NEWCALGEN FS-3PG (manufactured by TAKEMOTO OIL & FAT Co., Ltd.), PHOSTEN HLP-1 (manufactured by Nikko Chemicals Co., Ltd.), and the like.

As the anticorrosive, a hydrophilic polymer can also be used.

Examples of the hydrophilic polymer include polyglycols such as polyethylene glycol, an alkyl ether of polyglycols, polyvinyl alcohol, polyvinyl pyrrolidone, polysaccharides such as alginic acid, carboxylic acid-containing polymers such as polymethacrylic acid and polyacrylic acid, polyacrylamide, polymethacrylamide, polyethyleneimine, and the like. Specific examples of these hydrophilic polymers include the water-soluble polymers described in paragraphs "0042" to "0044" in JP2009-088243A and paragraph "0026" in JP2007-194261A.

As the anticorrosive, a cerium salt can also be used.

As the cerium salt, known cerium salts can be used without particular limitation.

Examples of the cerium salt include trivalent cerium salts such as cerium acetate, cerium nitrate, cerium chloride, cerium carbonate, cerium oxalate, and cerium sulfate and tetravalent cerium salts such as cerium sulfate, cerium ammonium sulfate, cerium ammonium nitrate, diammonium cerium nitrate, cerium hydroxide, and the like.

The anticorrosive may include substituted or unsubstituted benzotriazole. Suitable substituted benzotriazole includes, but is not limited to, benzotriazole substituted with an alkyl group, an aryl group, a halogen group, an amino group, a nitro group, an alkoxy group, or a hydroxyl group. The substituted benzotriazole also includes compounds fused by one or more aryl (for example, phenyl) or heteroaryl groups.

It is preferable that the content of the anticorrosive in the aqueous liquid to be purified is adjusted such that the content of the anticorrosive is 0.01% to 5% by mass with respect to the total mass of the chemical liquid. One kind of anticorrosive may be used singly, or two or more kinds of anticorrosives may be used in combination. In a case where two or more kinds of anticorrosives are used in combination, the total content thereof is preferably within the above range.

(Organic Solvent)

The aqueous liquid to be purified may contain an organic solvent. The organic solvent is not particularly limited, and is the same as the aforementioned organic solvent contained in the organic solvent-based liquid to be purified. In a case where the aqueous liquid to be purified contains an organic solvent, the content of the organic solvent is preferably 5% to 35% by mass with respect to the total mass of solvents contained in the aqueous liquid to be purified.

<Relationship Between Liquid to be Purified and Filtering Device>

The relationship between the liquid to be purified and the filtering device (arrangement of filters) is not particularly limited. Regarding the relationship with the solubility parameter (SP value) of the liquid to be purified, in a case where the SP value is equal to or lower than 20 $(MPa)^{1/2}$, the filtering device preferably has the filter BU and the filter A described above, and the filter BU more preferably contains a resin having an ion exchange group as a material component. The lower limit of the SP value is not particularly limited, but is preferably equal to or higher than 14 $(MPa)^{1/2}$.

In other words, the filtering device according to an embodiment of the present invention is more preferably used for purifying a liquid to be purified having an SP value equal to or lower than 20 $(MPa)^{1/2}$. That is, the filtering device according to the embodiment of the present invention can be preferably used for purifying a liquid to be purified having an SP value of 14 to 20 $(MPa)^{1/2}$.

According to the examination of the inventors of the present invention, it has been found that in a case where the SP value of the liquid to be purified is equal to or lower than 20 $(MPa)^{1/2}$, and the liquid to be purified is passed through the filter BU containing a resin having an ion exchange group as a material component, although the detailed mechanism is unclear, due to the swelling of the filter BU or the like, sometimes particle-like impurities in the form of microgel migrate to the liquid to be purified from the filter BU.

In this case, the filter BU has a strong interaction with ionic components (typically, impurities such as metal ions) in the liquid to be purified, and thus can remove the impurities from the liquid to be purified. On the other hand, as described above, in a case where the SP value of the liquid to be purified is equal to or lower than a predetermined range, sometimes a trace of impurities (including a gel-like substance) are mixed into the liquid to be purified.

Conventionally, in order to remove such a gel-like substance from the liquid to be purified, adsorption by a nylon filter has been exploited. However, in a case where the SP value of the liquid to be purified is 20 $(MPa)^{1/2}$, the durability of the nylon filter is insufficient, and sometimes the nylon filter becomes a new source of defects.

In the filtering device according to the embodiment described above, the filter A is disposed after the filter BU. Accordingly, the filtering device is preferable because the aforementioned particle-like impurities including the gel-like substance can be removed.

The filter A exhibits sufficient durability even for a liquid to be purified having an SP value equal to or lower than 20 $(MPa)^{1/2}$, and has a hydrophilic surface. Presumably, for this reason, in a case where the liquid to be purified is passed through the filter A, a coat may be formed on the surface of the membrane by a hydrophilic liquid, and the gel-like impurities in the liquid to be purified could be efficiently removed by the coat.

In the present specification, the SP value means "value of the solubility parameter". The SP value mentioned in the present invention is a Hansen solubility parameter determined by the equation explained in "Hansen Solubility Parameters: A User's Handbook, Second Edition, C. M. Hansen (2007), Taylor and Francis Group, LLC (HSPiP manual). As the SP value, a value calculated by the following equation by using "Hansen Solubility Parameters in Practice HSPiP, 3rd Edition" (software version 4. 0. 05) is used.

$(SP\ value)^2 = (\delta Hd)^2 + (\delta Hp)^2 + (\delta Hh)^2$

Hd: dispersion element

Hp: polarity element

Hh: hydrogen bond element

In the case where the liquid to be purified is a mixture of two or more kinds of solvents, the SP value of the liquid to be purified is determined by the sum of the products of the SP value of each of the solvents and the volume fraction of each of the solvents. That is, the SP value of the liquid to be purified it is represented by the following equation.

(SP value of liquid to be purified)=$\Sigma\{$(SP value of each solvent)×(volume fraction of each solvent)$\}$ For example, in a case where the solvent contained in the liquid to be purified is a 7:3 (based on volume) mixture of PGMEA and PGME, the SP value thereof is calculated by 17.8×0.7+23.05×0.3, which equals 19.375 $(MPa)^{1/2}$. In the present specification, in a case where an SP value is expressed by the unit of $(MPa)^{1/2}$, the SP value is determined by rounding off the numbers to two decimal points. In the case described above, the SP value is 19.4 $(MPa)^{1/2}$.

[Filtration Step]

The method for manufacturing a chemical liquid according to the present embodiment includes a filtration step of filtering the liquid to be purified by using the filtering device described above so as to obtain a chemical liquid.

The filtering device has a flow path formed by arranging the filter A and the filter B in series. The feed pressure of the liquid to be purified supplied to each filter is not particularly limited, but is preferably 0.00010 to 1.0 MPa in general.

Particularly, in view of obtaining a chemical liquid having further improved defect inhibition performance, a feed pressure $P_2$ is preferably 0.00050 to 0.090 MPa, more preferably 0.0010 to 0.050 MPa, and even more preferably 0.0050 to 0.040 MPa.

The filtration pressure affects the filtration accuracy. Therefore, it is preferable that the pulsation of pressure during filtration is as low as possible.

The filtration speed is not particularly limited. However, in view of easily obtaining a chemical liquid having further improved defect inhibition performance, the filtration speed is preferably equal to or higher than 1.0 $L/min/m^2$, more preferably equal to or higher than 0.75 $L/min/m^2$, and even more preferably equal to or higher than 0.6 $L/min/m^2$.

For the filter, an endurable differential pressure for assuring the filter performance (assuring that the filter will not be broken) is set. In a case where the endurable differential pressure is high, by increasing the filtration pressure, the filtration speed can be increased. That is, it is preferable that the upper limit of the filtration speed is generally equal to or lower than 10.0 $L/min/m^2$ although the upper limit usually depends on the endurable differential pressure of the filter.

The temperature at which the liquid to be purified passes through the filter is not particularly limited, but is preferably less than room temperature in general.

The filtration step is preferably performed in a clean environment. Specifically, the filtration step is preferably performed in a clean room that satisfies Class 1000 (Class 6 in ISO14644-1:2015) of Federal Standard (Fed. Std. 209E), more preferably performed in a clean room that satisfies Class 100 (Class 5 in ISO14644-1:2015), even more preferably performed in a clean room that satisfies Class 10 (Class 14 in ISO14644-1: 2015), and particularly preferably performed in a clean room that has a cleanliness (Class 2 or Class 1) equal to or higher than Class 1 (Class 3 in ISO14644-1: 2015).

It is preferable that each step which will be described later is also performed in the clean environment described above.

in a case where the filtering device has a return flow path, the filtration step may be a circulation filtration step. The circulation filtration step is a step of filtering the liquid to be purified by at least the filter A, returning the liquid to be purified having been filtered through the filter A to the upstream of the filter A in the flow path, and filtering again the liquid to be purified through the filter A.

The number of times of the circulation filtration is not particularly limited, but is preferably 2 to 10 in general. During the circulation filtration, the liquid to be purified may be returned to the upstream of the filter A such that the filtration by the filter A is repeated. In this case, the return flow path may be adjusted such that the filtration by at least one filter B is also repeated in addition to the filtration by the filter A.

[Other Steps]

The method for manufacturing a chemical liquid according to the present embodiment may include steps other than the above step. Examples of the steps other than the above step include a filter washing step, a device washing step, an electricity removing step, a step of preparing a liquid to be purified, and the like. Hereinafter, each of the steps will be specifically described.

<Filter Washing Step>

The filter washing step is a step of washing the filter A and the filter B before the filtration step. The method of washing the filter is not particularly limited, and examples thereof include a method of immersing the filter in an immersion solution, a method of washing the filter by passing a washing solution through the filter, a combination of these, and the like.

(Method of Immersing Filter in Immersion Solution)

Examples of the method of immersing the filter in the immersion solution include a method of filling a container for immersion with the immersion solution and immersing the filter in the immersion solution.

Immersion Solution

As the immersion solution, known immersion solutions can be used without particular limitation. Particularly, in view of obtaining further improved effects of the present invention, the immersion solution preferably contains water or an organic solvent as a main component, and more preferably contains an organic solvent as a main component. In the present specification, the main component means a component of which the content is equal to or greater than 99.9% by mass with respect to the total mass of the immersion solution. The content of the main component is more preferably equal to or greater than 99.99% by mass.

The organic solvent is not particularly limited, and it is possible to use the organic solvent described above as the organic solvent contained in the liquid to be purified. Particularly, in view of obtaining further improved effects of the present invention, it is preferable that the immersion solution contains at least one kind of organic solvent selected from the group consisting of an ester-based solvent and a ketone-based solvent. Furthermore, these may be used in combination.

Examples of the ester-based solvent include, but are not limited to, ethyl acetate, methyl acetate, butyl acetate, sec-butyl acetate, methoxybutyl acetate, amyl acetate, normal propyl acetate, isopropyl acetate, ethyl lactate, methyl lactate, butyl lactate, and the like.

Examples of the ketone-based solvent include, but are not limited to, acetone, 2-heptanone (MAK), methyl ethyl ketone (MEK), methyl isobutyl ketone, diisobutyl ketone, cyclohexanone, diacetone alcohol, and the like.

The time for which the filter is immersed in the immersion solution is not particularly limited. However, in view of obtaining further improved effects of the present invention, it is preferable that the filter is immersed in the immersion solution for 7 days to 1 year.

The temperature of the immersion solution is not particularly limited. However, in view of obtaining further improved effects of the present invention, the temperature of the immersion solution is preferably equal to or higher than 20° C.

Examples of the method of immersing the filter in the immersion solution include a method of filling a container for immersion with the immersion solution and immersing the filter in the immersion solution.

As the container for immersion, it is possible to use the housing that the filter unit in the aforementioned filtering device has. That is, for example, it is possible to use a method of filling the housing with the immersion solution in a state where the filter (typically, a filter cartridge) is stored in the housing that the filtering device has and leaving the filter to stand still as it is.

In addition to the above method, for example, it is possible to use a method of preparing a container for immersion in addition to the housing that the filtering device has (that is, preparing a container for immersion on the outside of the filtering device), filling the additionally prepared container for immersion with the immersion solution, and immersing the filter in the immersion solution.

Particularly, it is preferable to use a method of filling the container for immersion prepared on the outside of the filtering device with the immersion solution and immersing the filter in the immersion solution, because then the impurities eluted from the filter are not mixed into the filtering device.

The shape and size of the container for immersion are not particularly limited and can be appropriately selected according to the number and size of the filters to be immersed, and the like.

The material component of the container for immersion is not particularly limited, and it is preferable that at least a liquid contact portion of the container is formed of the anticorrosive material described above.

The material component of the container for immersion preferably contains at least one kind of material selected from the group consisting of polyfluorocarbon (such as PTFE, PFA: perfluoroalkoxyalkane and PCTFE: polychlorotrifluoroethylene), PPS (polyphenylene sulfide), POM (polyoxymethylene), and polyolefin (PP and PE, etc.), more preferably contains at least one kind of material selected from the group consisting of polyfluorocarbon, PPS, and POM, even more preferably contains polyfluorocarbon, particularly preferably contains at least one kind of material selected from the group consisting of PTFE, PFA, and PCTFE, and most preferably contains PTFE.

Furthermore, it is preferable that the container for immersion is washed before use. During washing, it is preferable to perform washing (so-called pre-washing) by using the immersion solution.

(Method of Washing by Passing Washing Solution Through Filter)

The method of washing the filter by passing the washing solution through the filter is not particularly limited. For example, by storing the filter (typically, a filter cartridge) in the filter housing of the filter unit of the filtering device described above and introducing the washing solution into the filter housing, the washing solution is passed through the filter.

During washing, the impurities having adhered to the filter migrate to (typically, dissolve in) the washing solution, and thus the content of impurities in the washing solution increases. Therefore, it is preferable that the washing solution once passed through the filter is discharged out of the filtering device without being reused for washing. In other words, it is preferable not to perform circulation washing.

As another form of the method of washing the filter by passing the washing solution through the filter, for example, there is a method of washing the filter by using a washing device. In the present specification, the washing device means a device different from the filtering device that is provided on the outside of the filtering device. Although the form of the washing device is not particularly limited, it is possible to use a device having the same constitution as that of the filtering device.

Washing Solution

As the washing solution which is used in a case where the filter is washed by passing the washing solution through the filter, known washing solutions can be used without particular limitation. Particularly, in view of obtaining further improved effects of the present invention, the form of the washing solution is preferably the same as that of the immersion solution described above.

<Device Washing Step>

The device washing step is a step of washing the liquid contact portion of the filtering device before the filtration step. The method of washing the liquid contact portion of the filtering device before the filtration step is not particularly limited. Hereinafter, the method will be described by taking a filtering device, in which the filter is a cartridge filter that is stored in a housing disposed on a flow path, as an example.

It is preferable that the device washing step includes a step A of washing the liquid contact portion of the filtering device by using a washing solution in a state where the cartridge filter is detached from the housing, and a step B of storing the cartridge filter in the housing after the step A and washing the liquid contact portion of the filtering device by using a washing solution.

Step A

The step A is a step of washing the liquid contact portion of the filtering device by using a washing solution in a state where the cartridge filter is detached from the housing. "In a state where the filter is detached from the housing" means that the liquid contact portion of the filtering device is washed using a washing solution after the filter cartridge is detached from the housing or before the filter cartridge is stored in the housing.

There is no particular limitation on the method of washing the liquid contact portion of the filtering device by using a washing solution in a state where the filter is detached from the housing (hereinafter, also described as "filtering device not storing the filter"). Examples thereof include a method of introducing the washing solution from the inlet portion and collecting the washing solution from the outlet portion.

Particularly, in view of obtaining further improved effects of the present invention, examples of the method of washing the liquid contact portion of the filtering device not storing the filter by using a washing solution include a method of filling the filtering device not storing the filter with a washing solution. In a case where the filtering device not storing the filter is filled with a washing solution, the liquid contact portion of the filtering device not storing a filter contacts the washing solution. As a result, impurities having adhered to the liquid contact portion of the filtering device migrate to (typically, eluted in) the washing solution. After washing, the washing solution may be discharged out of the filtering device (typically, the washing solution may be discharged from the outlet portion).

Washing Solution

As the washing solution, known washing solutions can be used without particular limitation. Particularly, in view of obtaining further improved effects of the present invention, the washing solution preferably contains water or an organic solvent as a main component, and more preferably contains an organic solvent as a main component. In the present specification, the main component means a component of which the content is equal to or greater than 99.9% by mass with respect to the total mass of the washing solution. The content of the main component is more preferably equal to or greater than 99.99% by mass.

The organic solvent is not particularly limited, and it is possible to use water and the organic solvent described above as the organic solvent that the chemical liquid contains. As the organic solvent, in view of obtaining further improved effects of the present invention, at least one kind of compound is preferable which is selected from the group consisting of PGMEA, cyclohexanone, ethyl lactate, butyl acetate, MIBC, MMP (3-methylmethoxypropionate), MAK, n-pentyl acetate, ethylene glycol, isopentyl acetate, PGME, methyl ethyl ketone (MEK), 1-hexanol, and decane.

Step B

The step B is a method of washing the filtering device by using a washing solution in a state where a filter is stored in the housing.

As the method of washing the filtering device by using a washing solution, in addition to the washing method in the step A described above, a method of passing a washing solution through the filtering device can also be used. The method of passing the washing solution through the filtering device is not particularly limited. The washing solution may be introduced from the inlet portion and discharged from the outlet portion. As the washing solution usable in this step, the washing solution used in the step A can be used without particular limitation.

<Electricity Removing Step>

The electricity removing step is a step of removing electricity from the liquid to be purified such that the charge potential of the liquid to be purified is reduced. As the electricity removing method, known electricity removing methods can be used without particular limitation. Examples of the electricity removing method include a method of bringing the liquid to be purified into contact with a conductive material.

The contact time for which the liquid to be purified is brought into contact with a conductive material is preferably 0.001 to 60 seconds, more preferably 0.001 to 1 second, and even more preferably 0.01 to 0.1 seconds. Examples of the conductive material include stainless steel, gold, platinum, diamond, glassy carbon, and the like.

Examples of the method of bringing the liquid to be purified into contact with a conductive material include a method of disposing a grounded mesh consisting of a conductive material such that the mesh crosses the flow path and passing the liquid to be purified through the mesh.

<Step of Preparing Liquid to be Purified>

The step of preparing a liquid to be purified is a step of preparing a liquid to be purified that will be caused to flow into the filtering device from the inlet portion of the filtering device. The method of preparing the liquid to be purified is not particularly limited. Typically, examples thereof include a method of purchasing commercial products (for example, those called "high-purity grade products"), a method of reacting one kind or two or more kinds of raw materials so as to obtain a liquid to be purified, a method of dissolving components in a solvent, and the like.

As the method of obtaining a liquid to be purified (typically, a liquid to be purified containing an organic solvent) by reacting the raw materials, known methods can be used without particular limitation. For example, it is possible to use a method of reacting one or two or more raw materials in the presence of a catalyst so as to obtain a liquid to be purified containing an organic solvent.

More specifically, examples thereof include a method of obtaining butyl acetate by reacting acetic acid and n-butanol in the presence of sulfuric acid; a method of obtaining 1-hexanol by reacting ethylene, oxygen, and water in the presence of $Al(C_2H_5)_3$; a method of obtaining 4-methyl-2-pentanol by reacting cis-4-methyl-2-pentene in the presence of Diisopinocampheyl borane (Ipc2BH); a method for obtaining propylene glycol 1-monomethyl ether 2-acetate (PGMEA) by reacting propylene oxide, methanol and acetic acid in the presence of sulfuric acid; a method of obtaining isopropyl alcohol (IPA) by reacting acetone and hydrogen in the presence of copper oxide-zinc oxide-aluminum oxide; a method of obtaining ethyl lactate by reacting lactic acid and ethanol; and the like.

In addition, this step may have a pre-purification step of purifying the liquid to be purified in advance before the liquid is caused to flow into the filtering device. The pre-purification step is not particularly limited, and examples thereof include a method of purifying the liquid to be purified by using a distillation device.

In the pre-purification step, the method of purifying the liquid to be purified by using a distillation device is not particularly limited. Examples thereof include a method of purifying the liquid to be purified in advance by using a distillation device prepared separately from the filtering device so as to obtain a distilled liquid to be purified, storing the liquid in a portable tank, and transporting the tank to the filtering device so as to introduce the liquid into the filtering device, and a method of using a purification device which will be described later.

First, by using FIG. 11, a method (pre-purification step) of purifying the liquid to be purified in advance by using a distillation device prepared separately from the filtering device will be described.

Figure 11:
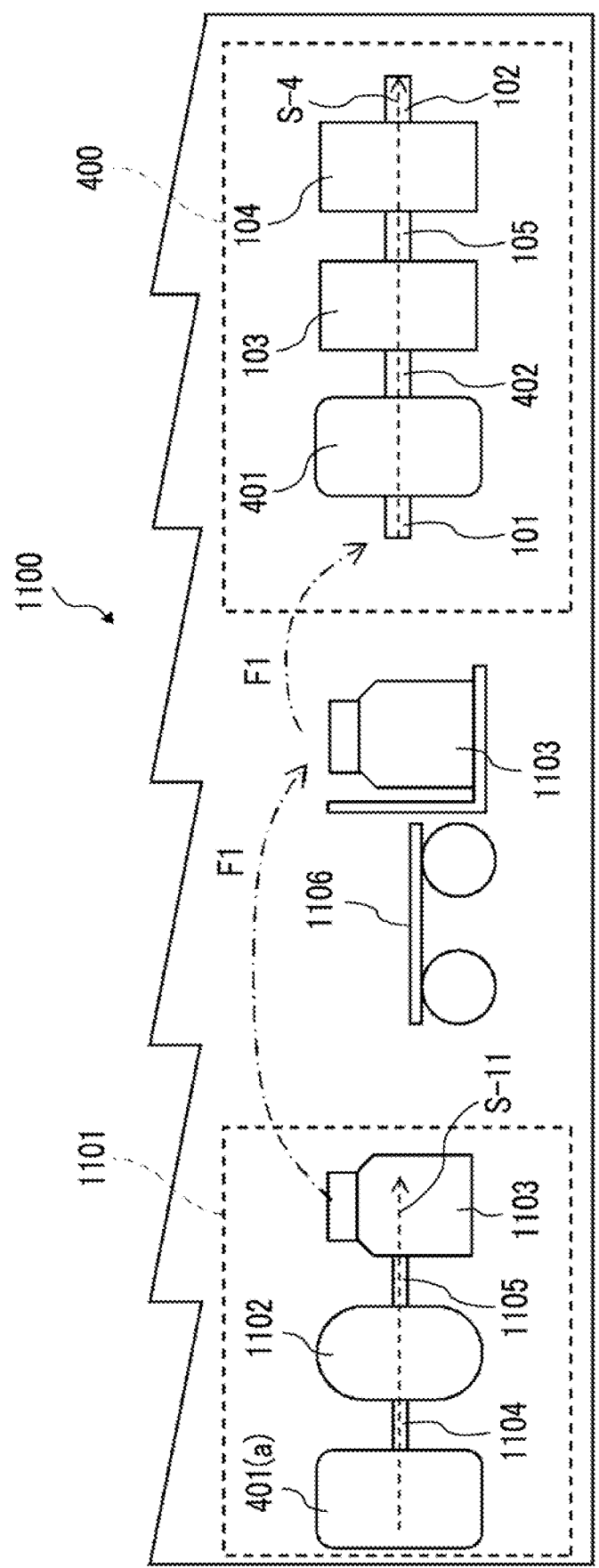
FIG. 11 is a schematic view showing a procedure of a pre-purification step performed in a case where a distillation device and a filtering device are arranged in the same manufacturing plant.

FIG. 11 is a schematic view showing the relationship between the devices in a case where a chemical liquid is manufactured using a distilled liquid to be purified that is purified in advance by a distiller.

In FIG. 11, the form of a filtering device 400 is the same as that of the filtering device according to the third embodiment of the present invention described above. Therefore, the filtering device 400 will not be described.

In a chemical liquid manufacturing plant 1100, a filtering device 400 and a distillation device 1101 are arranged. The distillation device 1101 has a tank 401(a), a distiller 1102, and a portable tank 1103, which are connected to one another through a piping 1104 and a piping 1105. The tank 401(a), the piping 1104, the distiller 1102, the piping 1105, and the portable tank 1103 form a flow path S11.

The form of the tank 401(a) and each piping is not particularly limited, and it is possible to use the tank and piping of the same form as described above as the tank and the piping included in the filtering device according to an embodiment of the present invention. As the distiller 1102, it is possible to use the same distiller as the distiller included in the purification device according to an embodiment of the present invention. The form of the distiller 1102 will be described later.

In the distillation device 1101, a liquid to be purified introduced into the tank 401(a) is distilled by the distiller 1102, and the obtained distilled liquid to be purified is stored in the portable tank 1103. Although the form of the portable tank is not particularly limited, it is preferable that at least a portion of the liquid contact portion of the tank (preferably 90% or more of the surface area of the liquid contact portion and more preferably 99% or more of the surface area of the liquid contact portion) consists of the anticorrosive material which will be described later.

The distilled liquid to be purified stored in the portable tank 1103 is transported by a transporting unit 1106 (the flow of F1 in FIG. 9). Then, the distilled liquid to be purified is introduced into the filtering device 400 from the inlet portion 101 of the filtering device.

In FIG. 11, an embodiment is described in which a distillation device and a filtering device are arranged in the same manufacturing plant. However, the distillation device and the filtering device may be arranged in different manufacturing plants.

Next, a pre-purification step using a purification device having a distiller and a filtering device will be described. First, the purification device used in this step will be described.

(Purification Device)

The purification device used in this step has the filtering device described above. The purification device according to an embodiment of the present invention has the filtering device described above, a second inlet portion, a second outlet portion, and at least one distiller disposed between the second inlet portion and the second outlet portion, in which the second outlet portion is connected to an inlet portion of the filtering device described above, and a flow path extending from the second inlet portion to the outlet portion of the filtering device is formed. Hereinafter, the purification device will be described with reference to drawings.

In the following section, the details relating to the constitution of the filtering device will not be described because they are the same as those described above.

First Embodiment of Purification Device

Figure 12:
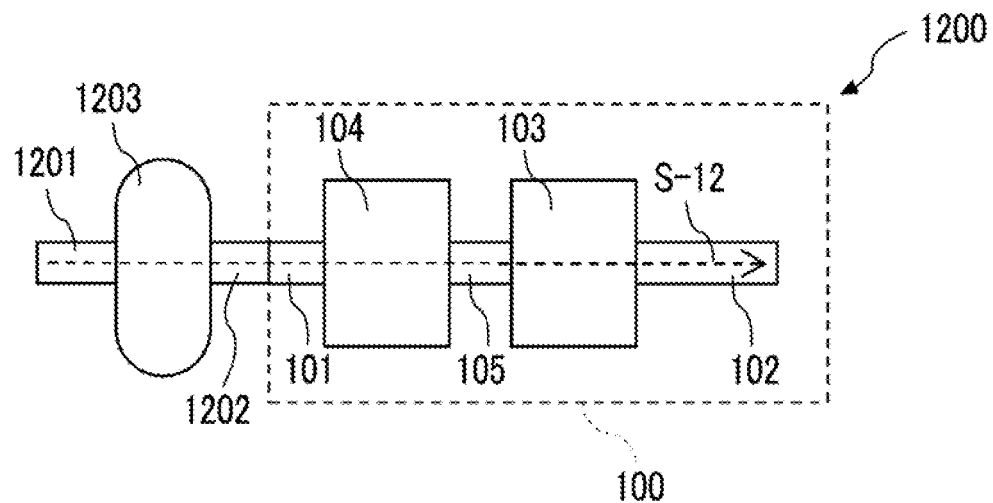
FIG. 12 is a schematic view illustrating a purification device according to the first embodiment of the present invention.

FIG. 12 is a schematic view illustrating a first embodiment of the purification device of the present invention. A purification device 1200 has a second inlet portion 1201, a second outlet portion 1202, and a distiller 1203 disposed between the second inlet portion 1201 and the second outlet portion 1202, in which the second outlet portion 1202 is connected to an inlet portion 101 of the filtering device. Therefore, in the purification device 1200, by the second inlet portion 1201, the distiller 1203, the second outlet portion 1202, the inlet portion 101, the filter 104 (filter BU), a piping 105, the filter 103 (filter A), and the outlet portion 102, a flow path S12 is formed.

That is, the distiller 1203 is connected to the inlet portion 101 of the filtering device 100.

The liquid to be purified having flowed into the purification device 1200 from the second inlet portion 1201 is distilled in the distiller 1203, and then is introduced into the filtering device 100 from the inlet portion 101 through the second outlet portion 1202. In a case where the pre-purification step is performed using the present purification device, the next step (filtration step) can be performed without discharging the distilled liquid to be purified outside the device. Therefore, a chemical liquid having further improved defect inhibition performance can be obtained.

The form of the distiller 1203 is not particularly limited, and known distillers (for example, a distillation column) can be used. As the material of the distiller 1203, it is possible to use the same material as that of the housing described above. Particularly, it is preferable that at least a portion of the liquid contact portion of the distiller 1203 consists of the anticorrosive material which will be described later. It is preferable that 90% or more of the area of the liquid contact portion consists of the anticorrosive material. It is more preferable that 99% of the area of the liquid contact portion consists of the anticorrosive material.

As the distiller, known distillers can be used without particular limitation. The distiller may be a batch type or a continuous type, but is preferably a continuous type. Furthermore, the distiller may be filled with a filler. Although the form of the filler is not particularly limited, it is preferable that at least a part of the liquid contact portion of the distiller consists of the anticorrosive material which will be described later. It is preferable that 90% or more of the area of the liquid contact portion consists of the anticorrosive material. It is more preferable that 99% of the area of the liquid contact portion consists of the anticorrosive material.

In FIG. 12, the purification device 1200 has a filtering device of an embodiment (for example, the first embodiment of the filtering device) in which the filter BU and the filter A are arranged in series in this order between the inlet portion and the outlet portion. However, instead of this, the purification device may have a filtering device of an embodiment (for example, the second embodiment) in which the filter A and the filter BD are arranged in series in this order between the inlet portion and the outlet portion, and a filtering device of an embodiment (for example, a modification example of the second embodiment) in which the filter BU, the filter A, and the filter BD are arranged in series in this order between the inlet portion and the outlet portion.

Furthermore, in the purification device, on the flow path S12 formed of the second inlet portion 1201, the distiller 1203, the second outlet portion 1202, the inlet portion 101, the filter 104, the piping 105, the filter 103, and the outlet portion 102, a return flow path may be formed which is capable of returning the liquid to be purified to the upstream of the filter 103 (filter A) on the flow path S12 from the downstream side of the filter 103 (filter A). The form of the return flow path is not particularly limited, but is the same as that described in the fifth embodiment of the filtering device. In addition, the form of the return flow path may be the same as that described in the sixth embodiment of the filtering device.

Furthermore, the purification device according to the present embodiment may have a tank on the upstream side and/or the downstream side of the filter 103 on the flow path S12. The form of the tank is not particularly limited, and the same tank as that described above can be used.

Second Embodiment of Purification Device

Figure 13:
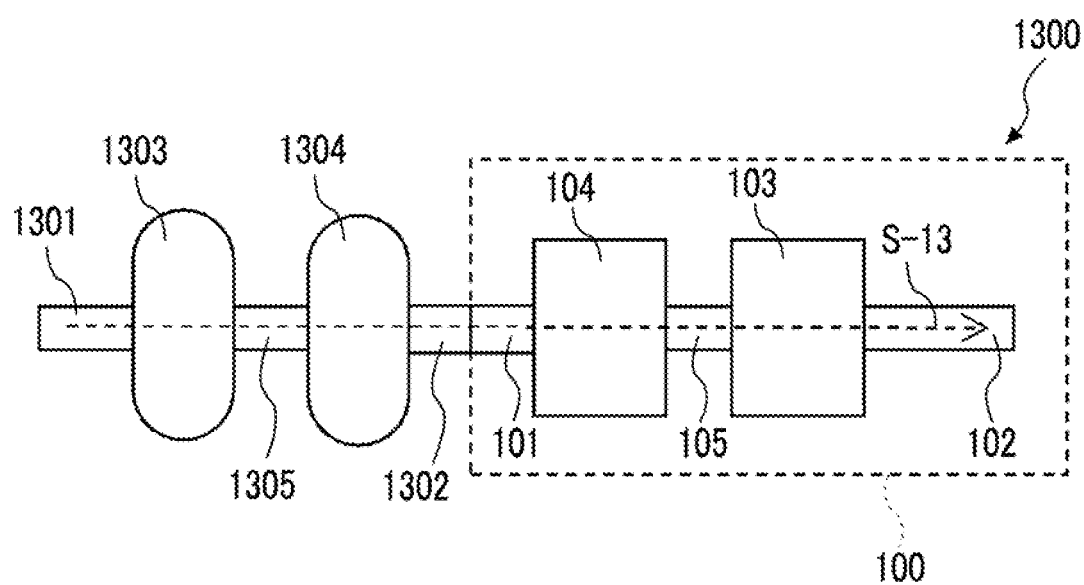
FIG. 13 is a schematic view illustrating a purification device according to the second embodiment of the present invention.

FIG. 13 is a schematic view illustrating a second embodiment of the purification device. A purification device 1300 has a second inlet portion 1301, a second outlet portion 1302, and a distiller 1303 and a distiller 1304 arranged in series between the second inlet portion 1301 and the second outlet portion 1302, in which the second outlet portion 1302 is connected to an inlet portion 101 of the filtering device. Therefore, in the purification device 1300, by the second inlet portion 1301, the distiller 1303, a piping 1305, the distiller 1304, the second outlet portion 1302, the inlet portion 101, the filter 104 (filter BU), the piping 105, the filter 103 (filter A), and the outlet portion 102, a flow path S13 is formed.

That is, the purification device according to the present embodiment includes a plurality of distillers connected in series. In a case where the purification device includes three or more distillers connected in series, the last distiller is connected to the filtering device.

In the purification device 1300, the liquid to be purified flowing from the second inlet portion 1301 is distilled by the distiller 1303, flows through the piping 1305, and is introduced into the distiller 1304. FIG. 13 shows an embodiment in which the distiller 1303 and the distiller 1304 are connected to each other through the piping 1305. However, the purification device according to the present embodiment is not limited thereto, and may additionally have a piping capable of returning the condensate of the distiller 1304 to the distiller 1303.

The purification device according to the present embodiment has two distillers. Therefore, in a case where the operating conditions of the two distillers and the like are appropriately controlled, even though the liquid to be purified contains two or more kinds of compounds having different boiling points, the target compound (chemical liquid) can be purified to higher purity.

[Anticorrosive Material]

Next, an anticorrosive material will be described. In the filtering device and the purification device according to the embodiment of the present invention described so far, it is preferable that at least a portion of the liquid contact portion of the devices is formed of an anticorrosive material. It is preferable that 90% or more of the liquid contact portion is formed of an anticorrosive material. It is more preferable that 99% or more of the liquid contact portion is formed of an anticorrosive material.

The state where the liquid contact portion is formed of an anticorrosive material is not particularly limited. Typically, for example, each member (for example, the tank described so far or the like) is formed of an anticorrosive material, or each member has a base material and a coating layer which is disposed on the base material and formed of an anticorrosive material.

The anticorrosive material is a nonmetallic material or an elecltropolished metallic material. Examples of the nonmetallic material include, but are not particularly limited to, a polyethylene resin, a polypropylene resin, a polyethylene-polypropylene resin, a tetrafluoroethylene resin, a tetrafluoroethylene-perfluoroalkyl vinyl ether copolymer resin, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, a vinyl fluoride resin, and the like.

The metallic material is not particularly limited, and examples thereof include a metallic material in which the total content of Cr and Ni is greater than 25% by mass with respect to the total mass of the metallic material. The total content of Cr and Ni is particularly preferably equal to or greater than 30% by mass. The upper limit of the total content of Cr and Ni in the metallic material is not particularly limited, but is preferably equal to or smaller than 90% by mass in general.

Examples of the metallic material include stainless steel, a Ni—Cr alloy, and the like.

As the stainless steel, known stainless steel can be used without particular limitation. Particularly, an alloy with a nickel content equal to or greater than 8% by mass is preferable, and austenite-based stainless steel with a nickel content equal to or greater than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the Ni—Cr alloy, known Ni—Cr alloys can be used without particular limitation. Particularly, a Ni—Cr alloy with a Ni content of 40% to 75% by mass and a Cr content of 1% to 30% by mass is preferable.

Examples of the Ni—Cr alloy include HASTELLOY (trade name, the same will be applied hereinafter), MONEL (trade name, the same will be applied hereinafter), INCONEL (trade name, the same will be applied hereinafter), and the like. More specifically, examples thereof include HASTELLOY C-276 (Ni content: 63% by mass, Cr content: 16% by mass), HASTELLOY C (Ni content: 60% by mass, Cr content: 17% by mass), HASTELLOY C-22 (Ni content: 61% by mass, Cr content: 22% by mass), and the like.

Furthermore, optionally, the Ni—Cr alloy may further contain B, Si, W, Mo, Cu, Co, and the like in addition to the aforementioned alloy.

As the method for electropolishing the metallic material, known methods can be used without particular limitation. For example, it is possible to use the methods described in paragraphs "0011" to "0014" in JP2015-227501A, paragraphs "0036" to "0042" in JP2008-264929A, and the like.

Presumably, in a case where the metallic material is electropolished, the Cr content in a passive layer on the surface thereof may be higher than the Cr content in the parent phase. Therefore, presumably, in a case where a purification device having a liquid contact portion formed of the elecltropolished metallic material is used, metal impurities containing metal atoms may be hardly eluted into the liquid to be purified.

The metallic material may have undergone buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material. The buffing is preferably performed before the electropolishing.

Method for Manufacturing Chemical Liquid (Second Embodiment)

The method for manufacturing a chemical liquid according to a second embodiment of the present invention is a chemical liquid manufacturing method for obtaining a chemical liquid by purifying a liquid to be purified, the method having a step of filtering a liquid to be purified by using a filter A having a porous base material made of polyfluorocarbon and a coating layer which is disposed to cover the base material and contains a resin having a hydrophilic group and a filter B different from the filter A so as to obtain a chemical liquid.

Hereinafter, the method for manufacturing a chemical liquid according to the second embodiment will be described. In the following section, the materials, methods, conditions, and the like which are not described are the same as those in the method for manufacturing a chemical liquid according to the first embodiment.

In the method for manufacturing a chemical liquid according to the present embodiment, the liquid to be purified is filtered using the filter A and the filter B different from the filter A. In a case where the liquid to be purified is filtered, the liquid may be passed through the filter A and the filter B in this order, or may be passed through the filter B and the filter A in this order.

The method for manufacturing a chemical liquid according to the present embodiment is not particularly limited as long as the filter A and the filter B are used. In this method, the liquid to be purified may be filtered by sequentially using a plurality of filters A and/or a plurality of filters B.

In a case where the filter B and the filter A are used in this order, the form of the filter B is not particularly limited, but it is preferable to use the filter described above as the filter BU. In a case where filter A and the filter B are used in this order, the form of the filter B is not particularly limited, but it is preferable to use the filter described above as the filter BD.

[Chemical Liquid]

It is preferable that the chemical liquid manufactured using the aforementioned filtering device is used for manufacturing a semiconductor substrate. Particularly, it is more preferable to use the chemical liquid for forming a fine pattern at a node equal to or smaller than 10 nm (for example, a step including pattern formation using extreme ultraviolet).

In other words, the filtering device is preferably used for manufacturing a chemical liquid for manufacturing a semiconductor substrate. Specifically, the filtering device is preferably used for manufacturing a chemical liquid used for treating an inorganic substance and/or an organic substance after each step is finished or before the next step is started in a semiconductor device manufacturing process including a lithography step, an etching step, an ion implantation step, a peeling step, and the like.

Specifically, the filtering device is preferably used for manufacturing at least one kind of chemical liquid (chemical liquid obtained by purifying an organic liquid to be purified) selected from the group consisting of a developer, a rinsing solution, a wafer washing solution, a line washing solution, a prewet solution, a wafer rinsing solution, a resist solution, a solution for forming an underlayer film, a solution for forming an overlayer film, and a solution for forming a hardcoat. In another embodiment, the filtering device is preferably used for manufacturing at least one kind of chemical liquid (chemical liquid obtained by purifying an aqueous liquid to be purified) selected from the group consisting of an aqueous developer, an aqueous rinsing solution, a peeling solution, a remover, an etching solution, an acidic washing solution, phosphoric acid, and a sulfuric acid-aqueous hydrogen peroxide mixture (Sulfuric acid-Hydrogen Peroxide Mixture (SPM)).

In addition, the aforementioned filtering device can also be used for manufacturing a chemical liquid used for rinsing the edge line of a semiconductor substrate before and after the coating with resist.

Furthermore, the aforementioned filtering device can also be used for manufacturing a diluted solution of a resin contained in a resist solution and for manufacturing a solvent contained in a resist solution.

In addition, the aforementioned filtering device can be used for manufacturing a chemical liquid used for purposes other than the manufacturing of a semiconductor substrate. The filtering device can also be used for manufacturing a developer for polyimide, a resist for sensor, and a resist for lens, a rinsing solution, and the like.

In addition, the filtering device can be used for manufacturing a solvent for medical uses or for washing. Particularly, the filtering device can be used for manufacturing a chemical liquid used for washing containers, piping, base substrates (for example, a wafer and glass), and the like.

Especially, the filtering device is preferably used for manufacturing at least one kind of chemical liquid selected from the group consisting of a prewet solution, a developer, and a rinsing solution for forming a pattern by using extreme ultraviolet (EUV).

[Chemical Liquid Storage Body]

The chemical liquid manufactured by the filtering device may be stored in a container and preserved until the chemical liquid is used. The container and the chemical liquid stored in the container are collectively referred to as chemical liquid storage body. The preserved chemical liquid is used after being taken out of the chemical liquid storage body.

As a container for preserving the chemical liquid, it is preferable to use a container for semiconductor substrate manufacturing, which has a high internal cleanliness and hardly causes the elution of impurities into the chemical liquid during the preservation of the chemical liquid.

Examples of usable containers include, but are not limited to, a "CLEAN BOTTLE" series manufactured by AICELLO CORPORATION, "PURE BOTTLE" manufactured by KODAMA PLASTICS Co., Ltd., and the like.

As the container, for the purpose of preventing mixing of impurities into the chemical liquid (contamination), it is also preferable to use a multilayer bottle in which the inner wall of the container has a 6-layer structure formed of 6 kinds of resins or a multilayer bottle having a 7-layer structure formed of 6 kinds of resins. Examples of these containers include the containers described in JP2015-123351A.

It is preferable that at least a portion of the liquid contact portion of the container consists of the anticorrosive material described above. In view of obtaining further improved effects of the present invention, it is preferable that 90% or more of the area of the liquid contact portion consists of the material component described above.

EXAMPLES

Hereinafter, the present invention will be more specifically described based on examples. The material components, the amount and proportion thereof used, the details of treatments, the procedure of treatments, and the like shown in the following examples can be appropriately modified as long as the gist of the present invention is maintained. Accordingly, the scope of the present invention is not limited to the following examples.

For preparing chemical liquids of examples and comparative examples, the handling of containers, the preparation of chemical liquids, filling, preservation, and analytical measurement were all performed in a clean room of a level satisfying ISO class 2 or 1. In order to improve the measurement accuracy, in the process of measuring the content of the organic impurities and the content of metal atoms, in a case where the content of the organic impurities or metal atoms was found to be equal to or smaller than a detection limit by general measurement, the chemical liquid was concentrated by $1/100$ in terms of volume for performing the measurement, and the content was calculated by converting the concentration into the concentration of the chemical liquid not yet being concentrated. The tools such as a device or a filter used for purification and a container were used after the surface contacting the chemical liquid was thoroughly washed with a chemical liquid purified in advance by the same method.

Test Example 1: Purification of Organic Solvent-Based Liquid to be Purified and Performance Evaluation of Chemical Liquid

[Manufacture of Chemical Liquid 1]

Figure 14:
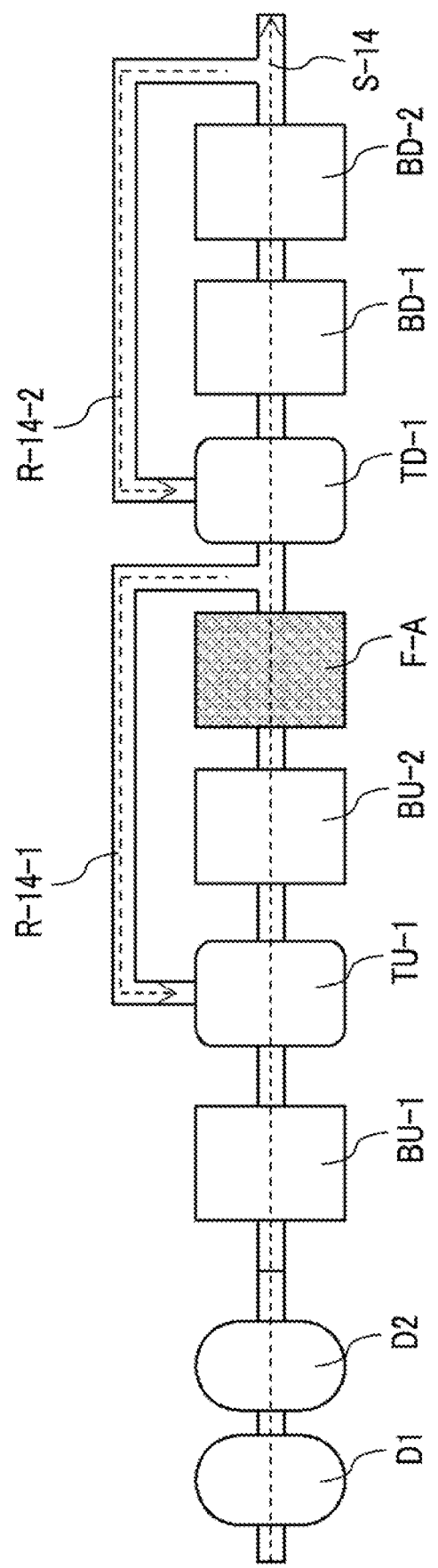
FIG. 14 is a schematic view illustrating a purification device according to an embodiment of the present invention.

A chemical liquid 1 was manufactured using the purification device shown in FIG. 14. The purification device in FIG. 14 has, between an inlet portion and an outlet portion, a filtering device including a filter BU-1, a tank TU-1, a filter BU-2, a filter F-A, a tank TD-1, a filter BD-1, and a filter BD-2 that are connected in series and a distiller connected to the front portion of the filtering device (duplex distiller consisting of D1 and D2, described as "duplex" in Table 1). Each of the units forms a flow path S-14 together with the piping. In the flow path S-14, a return flow path R-14-1 capable of returning the liquid to be purified to the upstream side of a filter F-A from the downstream side of the filter F-A and a return flow path R-14-2 capable of returning the liquid to be purified to the downstream side of the filter F-A from the downstream side of the filter BD-2 are formed.

Table 1 shows the material components contained in the filters used for manufacturing the chemical liquid 1 and the pore size of the filters. The filters were used after being immersed in PGMEA for one day.

Abbreviations for the material components of each filter in Table 1 are as follows.

A1

A1 means a filter created by the following method.

First, by using a bis-olefin represented by Formula $CH_2CH$—$C_6F_{12}$—$CHCH_2$ as a pre-crosslinker, I—$C_4F_8$—I as a chain transfer agent, and potassium persulfate as a radical initiator, emulsion polymerization was performed on TFE and vinyl ether represented by Formula $CF_2$=$CF$—$O$—$CF_2CF_2$—$SO_2F$.

Emulsion polymerization was performed under the conditions described in Table 2 of paragraph "0121" of JP2012-522882A, thereby synthesizing a copolymer C1 shown in Table 2.

Then, a fluorocarbon composition S1 described in paragraphs "0123" to "0125" (particularly, Table 3 of paragraph "0123") of JP2012-522882A was prepared.

Thereafter, the content of the ionomer was adjusted such that it becomes 1.3% by mass with respect to the fluorocarbon composition. The fluorocarbon composition prepared in this way contains a crosslinker and a radical initiator. By using the prepared fluorocarbon composition, a coating layer is formed on the surface of a porous base material made of PTFE. A1 is the filter obtained in this way.

A2

With reference to the description in paragraph "0058" of JP2015-061727A, a hollow fiber of a tetrafluoroethylene-perfluoro(alkyl vinyl ether) copolymer is prepared. A2 is the filter created using the fiber.

A3

A3 is a filter including first layer which has a porous base material made of polytetrafluoroethylene and a sulfonic acid group bonded to the surface of the porous base material, and a second layer which is disposed on the first layer and has a porous base material made of polytetrafluoroethylene and an amide group bonded to the surface of the porous base material.

PP: polypropylene
IEX: obtained by introducing a cation exchange group into a PTFE base material
Nylon: nylon
UPE: ultra-high-molecular-weight polyethylene
PTFE: polytetrafluoroethylene Abbreviations relating to the liquid to be purified in Table 1 are as follows.

CHN: cyclohexanone
PGMEA/PGME (7:3): a mixture of PGMEA and PGME at a ratio of 7:3 (based on volume)
NBA: butyl acetate
PC/PGMEA (1:9): a mixture of PC and PGMEA at a ratio of 1:9 (based on volume)
EL: ethyl lactate
MIBC: 4-methyl-2-pentanol
PGME: propylene glycol monoethyl ether
PGMEA: propylene glycol monomethyl ether acetate
PC: propylene carbonate
iAA: isoamyl acetate
IPA: isopropanol A commercial high-purity grade "cyclohexanone" was purchased as the liquid to be purified, and purified using the purification device described above. During the purification, circulation filtration was performed three times through each of the return flow paths R-14-1 and R-14-2, thereby obtaining the chemical liquid 1.

[Manufacturing of Chemical Liquids 2 to 50]

Each of the liquids to be purified described in Table 1 was purified using a purification device (or a filtering device) described in Table 1, thereby obtaining chemical liquids. The purification devices (or filtering devices) are shown in FIGS. 14 to 24. The material components contained in the filter FA, the filters BU-1 to BU-3, and the filters BD-1 to BD-2, and the pore sizes of the filters are as shown in Table 1. During the purification of the liquid to be purified, a liquid that was filtered using a filtering device, in which a return flow path represented by R-(number) was formed, and described as "performed" in the column of "Circulation" in Table 1 was subjected to circulation filtration three times through each return flow path.

In the table, "-" means that the filter was not used. The same is true of other tables in the present specification.

In the column of "Pre-washing of filter" in Table 1, the conditions of pre-washing for each filter are described. "PGMEA 1 day immersion" means that the filter was used after being immersed for 1 day in high-purity grade PGMEA. In addition, "-" in the same column shows that the filter was not pre-washed.

[Evaluation 1: Evaluation of Residue Defect Inhibition Performance and Stain-Like Defect Inhibition Performance of Chemical Liquid]

A silicon wafer (Bare-Si) having a diameter of about 300 mm was coated with the chemical liquid 1, thereby obtaining a wafer coated with a chemical liquid. The used device was Lithius ProZ, and the coating conditions were as follows.

Amount of chemical liquid used for coating: 2 ml
Rotation speed of silicon wafer during coating: 2,200 rpm, 60 sec Then, by using a wafer inspection device "SP-5" manufactured by KLA-Tencor Corporation. and a fully automatic defect review/classification device "SEMVision G6" manufactured by Applied Materials, Inc, the number of defects having a size equal to or greater than 19 nm existing on the entire surface of the wafer and the composition of the defects were investigated.

The total number of defects measured using SP-5 was counted as the number of residue defects, and the shape of the defects was observed using G6. The (stain-like) defects that were not in the form of particles were counted as stain-like defects. The results were evaluated based on the following standard. The evaluation results are shown in Table 1.

The smaller the number of defects present on the wafer, the better the defect inhibition performance of the chemical liquid. In the following evaluation, "number of defects" means the total number of residue defects and stain-like defects. The chemical liquids 2 to 48 were evaluated by the same method as the above method. The results are shown in Table 1.

AA The number of defects was equal to or smaller than 30/wafer.

A The number of defects was greater than 30/wafer and equal to or smaller than 50/wafer.

B The number of defects was greater than 50/wafer and equal to or smaller than 100/wafer.

C The number of defects was greater than 100/wafer and equal to or smaller than 200/wafer.

D The number of defects was greater than 200/wafer and equal to or smaller than 500/wafer.

E The number of defects was greater than 500/wafer.

[Evaluation 2: Bridge Defect Inhibition Performance]

By using the chemical liquid 1 as a prewet solution, the bridge defect inhibition performance of the chemical liquid was evaluated. First, a resist resin composition 1 used will be described.

Resist Resin Composition 1

The resist resin composition 1 was obtained by mixing together the following components.

Acid-decomposable resin (resin represented by the following formula (weight-average molecular weight (Mw) 7500): the numerical value described in each repeating unit means mol %): 100 parts by mass

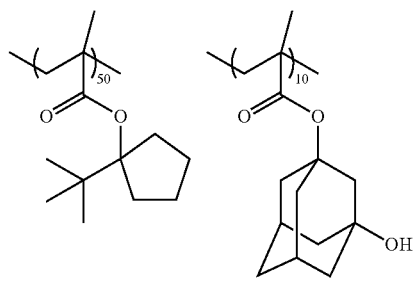

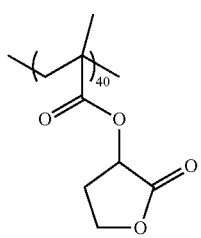

The following photoacid generator: 8 parts by mass

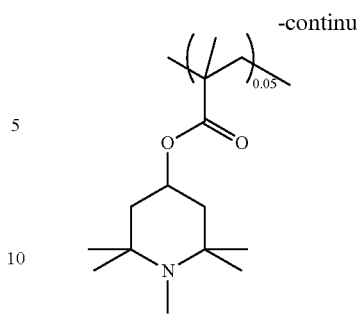

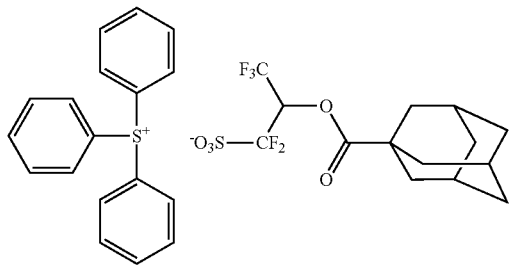

The following quencher: 5 parts by mass (the mass ratio was 0.1:0.3:0.3:0.2 in this order from the left). Among the following quenchers, a polymer-type quencher has a weight-average molecular weight (Mw) of 5,000. The numerical value described in each repeating unit means molar ratio.

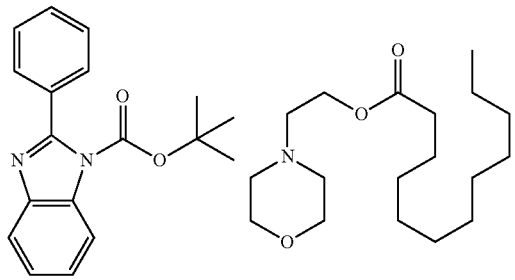

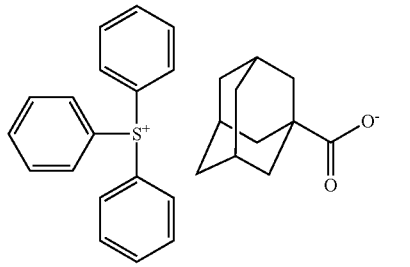

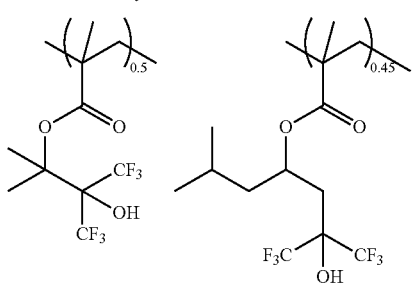

Hydrophobic resins shown below: 4 parts by mass (mass ratio: (1):(2)=0.5:0.5). Among the following hydrophobic resins, the hydrophobic resin represented by Formula (1) has a weight-average molecular weight (Mw) of 7,000, and the hydrophobic resin represented by Formula (2) has a weight-average molecular weight (Mw) of 8,000. In each of the hydrophobic resins, the numerical value described in each repeating unit means molar ratio.

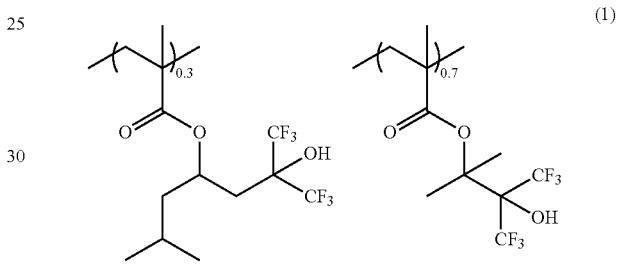

(1)

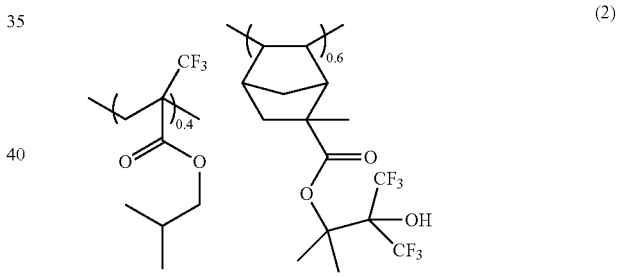

(2)

Solvent:
PGMEA (propylene glycol monomethyl ether acetate): 3 parts by mass Cyclohexanone: 600 parts by mass
γ-BL (γ-butyrolactone): 100 parts by mass Test Method Next, the test method will be described. First, a silicon wafer having a diameter of about 300 mm was pre-wet with the chemical liquid 1, and then the pre-wet silicon wafer was spin-coated with the resist resin composition described above. Thereafter, the wafer was heated and dried at 150° C. for 90 seconds on a hot plate, thereby forming a resist film having a thickness of 9 μm.

For the resist film, in order that a pattern having a line width of 30 nm and a space width of 30 nm was formed after reduction projection exposure and development, by using an ArF excimer laser scanner (manufactured by ASML, PAS5500/850C, wavelength: 248 nm), pattern exposure was performed under the exposure conditions of NA=0.60 and σ=0.75 through a mask having a line-and-space pattern. After being irradiated, the resist film was baked for 60 seconds at 120° C. Subsequently, the resist film was developed, rinsed, and then baked for 60 seconds at 110° C., thereby forming a resist pattern having a line width of 30 nm and a space width of 30 nm.

By using a critical dimension SEM (CG4600, manufactured by Hitachi High-Technologies Corporation), 100 shots of the resist pattern were captured. The number of defects in the form of a crosslink between patterns (bridge defects) was counted, and the number of defects per unit area was determined. The results were evaluated based on the following standard. The evaluation results are shown in Table 1. Note that the smaller the number of defects in the form of a crosslink between patterns, the better the bridge defect inhibition performance of the chemical liquid.

For the chemical liquids 2 to 48, those described as "pre-wetting" in the column of "Evaluation method" in Table 1 were evaluated in terms of the bridge defect inhibition performance by the same method as that used for the chemical liquid 1. The chemical liquids described as "Developer" in the column of "Evaluation method" in Table 1 were evaluated in terms of the bridge defect inhibition performance according to the same procedure as that used for evaluating the chemical liquid 1, except that the chemical liquids were not subjected to pre-wetting described in the procedure for evaluating the chemical liquid 1, and the chemical liquids described in Table 1 were used as a developer. The chemical liquids described as "Rinsing solution" in the column of "Evaluation method" in Table 1 were evaluated in terms of the bridge defect inhibition performance according to the same procedure as that used for evaluating the chemical liquid 1, except that the chemical liquids were not subjected to pre-wetting described in the procedure for evaluating the chemical liquid 1, and the chemical liquids described in Table 1 were used as a rinsing solution. The results are shown in Table 1.

AA The number of bridge defects was less than $1/cm^2$.

A The number of bridge defects was equal to or greater than $1/cm^2$ and less than $2/cm^2$.

B The number of bridge defects was equal to or greater than $2/cm^2$ and less than $5/cm^2$.

C The number of bridge defects was equal to or greater than $5/cm^2$ and less than $10/cm^2$.

D The number of bridge defects was equal to or greater than $10/cm^2$ and less than $15/cm^2$.

E The number of bridge defects was equal to or greater than $15/cm^2$.

[Evaluation 3: Uniformity of Pattern Width]

By using a critical dimension SEM (CG4600, manufactured by Hitachi High-Technologies Corporation), 100 shots of the resist pattern were captured, and a difference between an average Line Width Roughness (LWR) and a maximum (or minimum) line width was determined. The results were evaluated based on the following standard. The evaluation results are shown in Table 1. Note that the smaller the difference, the better the uniformity of the pattern width formed using the chemical liquid. "Difference from the maximum (or minimum) line width" means that between the difference between the average LWR and the maximum line width and the difference between the average LWR and the minimum line width, the larger one in terms of absolute value was used to evaluate the pattern width uniformity. In the evaluation, the chemical liquids were graded such that the range of the corresponding ones became the narrowest with respect to the average. For example, a chemical liquid corresponding to "AA" was evaluated as "AA", a chemical liquid corresponding not to "AA" but to "A" is evaluated as "A", and a chemical liquid corresponding not to "AA" and "A" but to "B" was evaluated as "B". The same is true of the evaluation standards "C" to "E".

AA The difference between the average line width and the maximum (minimum) line width was less than ±2% with respect to the average.

BB The difference between the average line width and the maximum (minimum) line width was less than ±5% with respect to the average.

B The difference between the average line width and the maximum (minimum) line width was less than ±10% with respect to the average.

C The difference between the average line width and the maximum (minimum) line width was less than ±20% with respect to the average.

D The difference between the average line width and the maximum (minimum) line width was equal to or greater than ±20% with respect to the average.

E The line width could not be measured in some of the shots.

[Evaluation 4: Evaluation of Pot Life of Filter]

Figure 24:
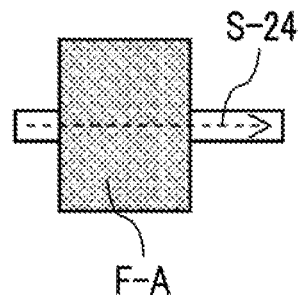
FIG. 24 is a schematic view illustrating a filtering device according to a conventional technique.

The liquid to be purified was continuously purified using each of the purification devices (or filtering devices) described in Table 1. After the liquid to be purified was passed and the purification device (or filtering device) was stabilized, the obtained chemical liquid was immediately collected for test (initial sample). Then, whenever the amount of the liquid passing through the device became 10,000 kg, a chemical liquid obtained after purification was collected for test (temporal sample). The chemical liquid collected for test was evaluated by the method for evaluating the residue defect inhibition performance of a chemical liquid described in "Evaluation 1", and the number of defects per unit area was compared with that of the initial sample. The amount of the chemical liquid passing the device that was determined at a point in time when the number of defects in the temporal sample doubled was adopted as "pot life" of the filter. The pot life determined in a case (chemical liquid 34) where the filtering device described in FIG. 24 was used was regarded as 1, and the pot life of the filter of each device was evaluated based on a ratio to 1. The results were evaluated based on the following standard. The evaluation results are shown in Table 1. The evaluation result obtained using the device in FIG. 24 is described as "Standard".

AA The pot life was equal to or longer than 10.

A The pot life was equal to or longer than 5 and less than 10.

B The pot life was equal to or longer than 2 and less than 5.

C The pot life was longer than 1 and less than 2.

D The pot life was equal to or shorter than 1.

Test Example 2: Purification of Aqueous Liquid to be Purified and Evaluation of Performance of Chemical Liquid

[Manufacture of Chemical Liquid 101 and Chemical Liquid 102]

Sulfuric acid-Hydrogen Peroxide Mixture (SPM) and an aqueous phosphoric acid solution (phosphoric acid content: 85% by mass) were purchased and prepared as a liquid to be purified. SPM is a solution obtained by mixing sulfuric acid with hydrogen peroxide at a ratio of 4:1 based on volume.

Figure 18:
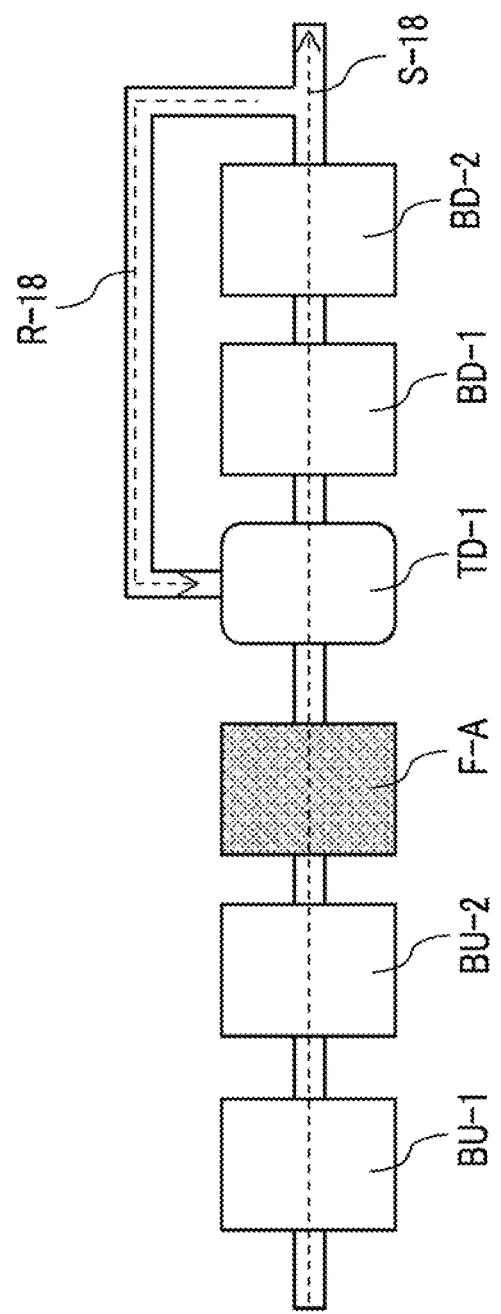
FIG. 18 is a schematic view illustrating a filtering device according to an embodiment of the present invention.

Then, a chemical liquid 101 and a chemical liquid 102 were manufactured using the filtering device shown in FIG. 18. In the filtering device shown In FIG. 18, a filter BU-1, a filter BU-2, a filter F-A, a tank TD-1, a filter BD-1, and a filter BD-2 are connected in series between an inlet portion and an outlet portion so as to form a flow path S-18. Furthermore, in the filtering device shown in FIG. 18, a return flow path R-18 was formed which is capable of returning a liquid to be purified to the downstream side of the filter F-A from the downstream side of the filter BD-2, and circulation filtration of the liquid to be purified was performed three times.

The abbreviations relating to the material components of the filters in Table 2 will not be described because they are the same as those in Table 1.

[Manufacture of Chemical Liquid 103 and Chemical Liquid 104]

A chemical liquid 103 and a chemical liquid 104 were manufactured by the same method as that used for manufacturing the chemical liquid 101 and the chemical liquid 102, except that a filtering device (with a filter F-A and a flow path S-24) illustrated in FIG. 24 was used instead of the filtering device illustrated in FIG. 18. Table 2 shows the material components of the filter F-A and the like. During the manufacturing of the chemical liquids, circulation filtration was not performed.

[Evaluation 1: Evaluation of Defect Inhibition Performance of Chemical Liquid (Particle Defects and Stain-Like Defects)]

A bare silicon wafer having a diameter of about 300 mm was prepared, and 100 ml of each chemical liquid was jetted at a jetting frequency of 5 ml/s for 20 seconds to the wafer that was rotating under the condition of 500 rpm. Thereafter, the wafer was rotated at 2,000 rpm for 30 seconds to perform a spin dry treatment. The resulting wafer was used as a wafer for evaluation. Then, by using a wafer inspection device "SP-5" manufactured by KLA-Tencor Corporation. and a fully automatic defect review/classification device "SEMVision G6" manufactured by Applied Materials, Inc, the number of defects having a size equal to or greater than 26 nm existing on the entire surface of the wafer and the composition of the defects were investigated.

Among the measured defects, particle-like foreign substances were counted as particle defects, and others are counted as stain-like defects. The defect inhibition performance was evaluated based on the following standard. The results are shown in the columns of "particle defect inhibition performance" and "Stain-like defect inhibition performance" in Table 2. "Number of defects" means the total number of particle defects and stain-like defects.

A The number of defects was equal to or smaller than 50/wafer.

B The number of defects was greater than 50/wafer and equal to or smaller than 300/wafer.

C The number of defects was greater than 300/wafer.

[Evaluation 2: Evaluation of Pot Life of Filter]

The liquid to be purified was continuously purified using each of the filtering devices described in Table 2. After the liquid to be purified was passed and the filtering device was stabilized, the obtained chemical liquid was immediately collected for test (initial sample). Then, whenever the amount of the liquid passing through the device became 10,000 kg, a chemical liquid obtained after purification was collected for test (temporal sample). The chemical liquid collected for test was evaluated by the method for evaluating the particle defect inhibition performance of a chemical liquid described in "Evaluation 1", and the number of defects per unit area was compared with that of the initial sample. The amount of the chemical liquid passing the device that was determined at a point in time when the number of defects in the temporal sample doubled was adopted as "pot life" of the filter. The pot life determined in a case (chemical liquid 103) where the filtering device described in FIG. 24 was used was regarded as 1, and the pot life of the filter of each device was evaluated based on a ratio to 1. The results were evaluated based on the following standard. The evaluation results are shown in Table 1. The evaluation result obtained using the device in FIG. 24 is described as "Standard".

A The pot life was equal to or longer than 10.

B The pot life was equal to or longer than 5 and less than 10.

C The pot life was equal to or longer than 1 and less than 5.

D The pot life was less than 1.

Test Example 3: Manufacturing of Chemical Liquid as Resist Resin Composition and Evaluation of Performance of Chemical Liquid

[Manufacturing of Chemical Liquid 201]

A resist resin composition 2 containing the following components was prepared as a liquid to be purified.

Resin A-2 synthesized by the following method: 0.79 g

<Resin (A-2)>

Synthesis of Resin (A-2)

A 2 L flask was filled with 600 g of cyclohexanone and then subjected to nitrogen purging for 1 hour at a flow rate of 100 mL/min. Thereafter, 0.02 mol of a polymerization initiator V-601 (manufactured by Wako Pure Chemical Industries, Ltd.) was added thereto, and the flask was heated until the internal temperature became 80° C. Subsequently, the following monomers 1 to 3 and 0.02 mol of a polymerization initiator V-601 (manufactured by Wako Pure Chemical Industries, Ltd.) were dissolved in 200 g of cyclohexanone, thereby preparing a monomer solution. The monomer solution was added dropwise for 6 hours to the flask heated to 80° C. After the dropwise addition ended, the reaction was further performed at 80° C. for 2 hours.

Monomer 1: 0.3 mol
Monomer 2: 0.6 mol
Monomer 3: 0.1 mol

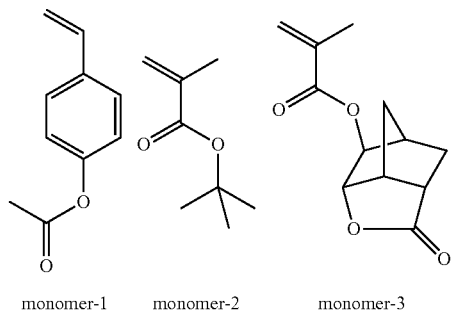

monomer-1    monomer-2    monomer-3

The reaction solution was cooled to room temperature and added dropwise to 3 L of hexane so as to precipitate a polymer. The filtered solids were dissolved in 500 mL of acetone, added dropwise again to 3 L of hexane, and the filtered solids were dried under reduced pressure, thereby obtaining a copolymer (A-2) of the monomers 1 to 3.

A reaction container was filled with 10 g of the polymer obtained as above, 40 mL of methanol, 200 mL of 1-methoxy-2-propanol, and 1.5 mL of concentrated hydrochloric acid, and the mixture was heated to 80° C. and stirred for 5 hours. The reaction solution was left to cool to room temperature and added dropwise to 3 L of distilled water. The filtered solids were dissolved in 200 mL of acetone, added dropwise again to 3 L of distilled water, and the filtered solids were dried under reduced pressure, thereby obtaining a resin (A-2) (8.5 g). The weight-average molecular weight (Mw) of the resin measured by gel permeation chromatography (GPC) (solvent: THF (tetrahydrofuran)) and expressed in terms of standard polystyrene was 12,300, and the molecular weight dispersity (Mw/Mn) of the resin was 1.51.

The composition (molar ratio) of the resin was calculated by $^1$H-NMR (nuclear magnetic resonance) measurement. The weight-average molecular weight (Mw: in terms of polystyrene) and the dispersity (Mw/Mn) of the resin were calculated by GPC (solvent: THF) spectroscopy.

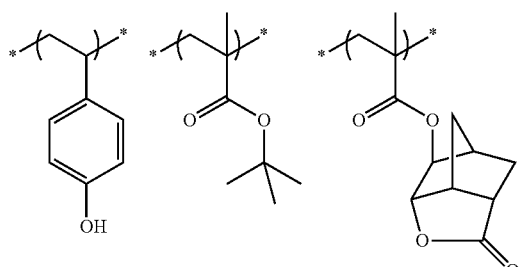

The composition of the resin A-2 was 30/60/10 (molar ratio) in this order from the constitutional unit at the very left. The resin A-2 had a weight-average molecular weight (Mw) of 12,300 and Mw/Mn of 1.51.

The following aid generator (B-2): 0.18 g

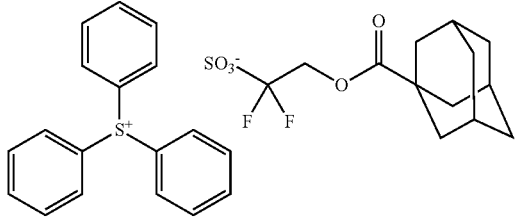

(B-2)

The following basic compound (E-1): 0.03 g

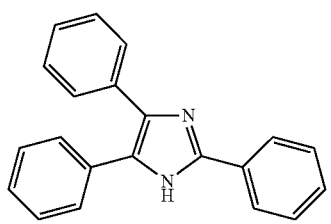

(E-1)

Propylene glycol monomethyl ether acetate: 45 g

Propylene glycol monomethyl ether: 30 g

Figure 25:
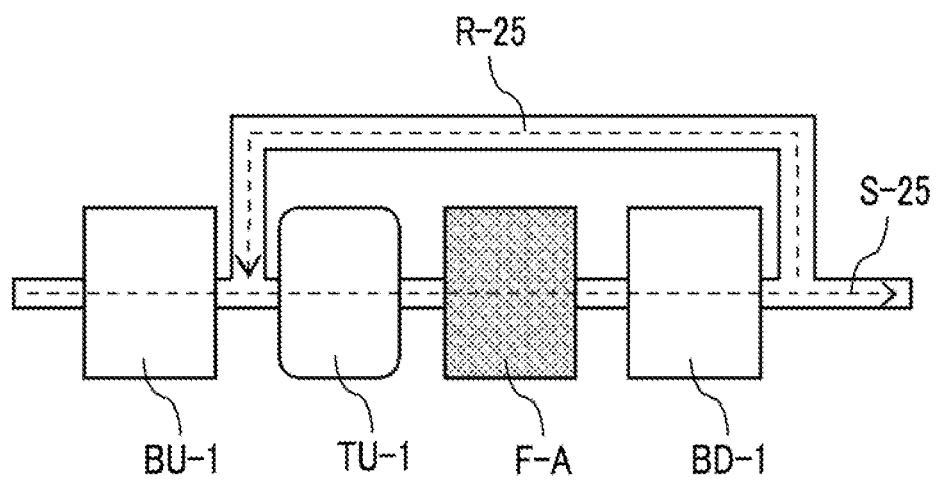
FIG. 25 is a schematic view illustrating a filtering device according to an embodiment of the present invention.

A chemical liquid 201 was manufactured using the filtering device illustrated in FIG. 25. In the filtering device in FIG. 25, a filter BU-1, a tank TU-1, a filter F-A, and a filter BD-1 are connected in series between an inlet portion and an outlet portion. The units form a flow path S-25 together with piping. Furthermore, a return flow path R-25 is formed which is capable of returning a liquid to be purified to a position, which is on the downstream side of the filter BU-1 and on the upstream side of the tank TA-1, from the downstream side of the filter BD-1. The liquid to be purified was returned by the return flow path R-25 and then subjected to circulation filtration three times.

Table 3 shows the material components contained in the filters used for purification and the pore sizes of the filters.

[Manufacture of Chemical Liquid 202 and Chemical Liquid 203]

A chemical liquid 202 and a chemical liquid 203 were manufactured by the same method as that used for manufacturing the chemical liquid 201, except that the filtering device described in Table 3 was used. During the manufacturing of the chemical liquid 203, circulation filtration was not performed.

[Manufacturing of Chemical Liquid 204]

A resist resin composition 3 containing the following components was prepared as a liquid to be purified.

Resin A-14 Synthesized by the Following Method: 0.785 g

<Resin (A-14)>

Synthesis of Resin (A-14)

A resin (A-14) having the following structure was obtained by the same method as that used for synthesizing the resin (A-2), except that the used monomer was changed.

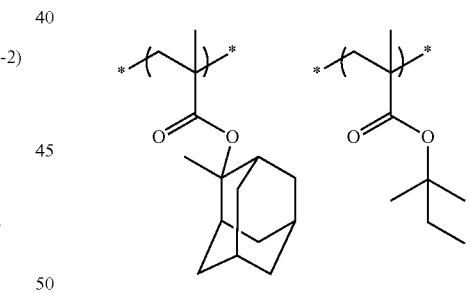

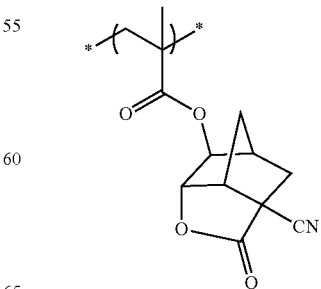

The composition of the resin A-14 was 20/40/40 (molar ratio) in this order from the constitutional unit at the very left. The resin A-14 had a weight-average molecular weight (Mw) of 11,000 and Mw/Mn of 1.45.

The following acid generator (B-9): 0.18 g (B-9)

The following basic compound (E-2): 0.03 g (E-2)

Propylene glycol monomethyl ether acetate: 45 g
Cyclohexanone: 30 g
The following hydrophobic resin (3b) shown below: 0.005 g (3b)

A chemical liquid 204 was manufactured using the filtering device illustrated in FIG. 25. The liquid to be purified was returned by the return flow path R-25 and then subjected to circulation filtration three times.

Table 3 shows the material components contained in the filters used for purification and the pore sizes of the filters.

[Manufacture of Chemical Liquid 205 and Chemical Liquid 206]

A chemical liquid 205 and a chemical liquid 206 were manufactured by the same method as that used for manufacturing the chemical liquid 204, except that the filtering device described in Table 3 was used. During the manufacturing of the chemical liquid 206, circulation filtration was not performed.

[Manufacturing of Chemical Liquid 207]

A resist resin composition 4 containing the following components was prepared as a liquid to be purified.

Resin (A-1)-3 Synthesized by the Following Method: 97% by Mass

<Resin (A-1)-3>

The resin (A-1)-3 was synthesized with reference to the description in paragraphs "0131" to "0134" of JP2009-265609A. The repeating units of the resin (A-1)-3 are represented by the following formulas, and the composition (molar ratio) thereof is 50/40/10 from the left. The resin (A-1)-3 had a weight-average molecular weight of 20,000 and a dispersity represented by Mw/Mn of 1.57.

(A-1)

The following acid generator (B-35): 2.5% by mass (B35)

C-1 dicyclohexylmethylamine: 0.4% by mass
D-1 fluorine-based surfactant, MEGAFACE F-176 (manufactured by DIC Corporation): 0.1% by mass Here, the content of (A-1)-3 to D-1 means the content in the solid contents of the resist resin composition 4 based on mass.

Solvent

Propylene glycol monomethyl ether acetate: 80% by mass
Propylene glycol monomethyl ether: 20% by mass Here, the content of the solvent means the content of each solvent in the solvents contained in the resist resin composition 4 (content determined by regarding the total mass of the solvents as 100% by mass). The solid contents of the resist resin composition 4 were adjusted to 10% by mass.

A chemical liquid 207 was manufactured using the filtering device illustrated in FIG. 25. The liquid to be purified was returned by the return flow path R-25 and then subjected to circulation filtration three times.

Table 3 shows the material components contained in the filters used for purification and the pore sizes of the filters.

[Manufacture of Chemical Liquid 208 and Chemical Liquid 209]

A chemical liquid 208 and a chemical liquid 209 were manufactured by the same method as that used for manufacturing the chemical liquid 207, except that the filtering device described in Table 3 was used. During the manufacturing of the chemical liquid 209, circulation filtration was not performed.

[Evaluation of Defect Inhibition Performance of Chemical Liquid: Defect Inhibition Performance During EUV Exposure]

By using the chemical liquids 201 to 203, the defect inhibition performance (post-development defect inhibition performance and bridge defect inhibition performance) of the chemical liquids was evaluated by the following operation. EUV exposure refers to a pattern forming method by exposure using EUV.

A 12-inch silicon wafer was coated with each of the chemical liquids 201 to 203 and baked for 60 seconds under the condition of 120° C., thereby forming a resist film thickness of 40 nm.

(Exposure Conditions for Evaluating Post-Development Defect Inhibition Performance)

The wafer prepared as above was subjected to EUV exposure using a dipole lighting (Dipole 60x, outer sigma 0.81, inner sigma 0.43) at a lens numerical aperture (NA) of 0.25. Specifically, the entire surface of the negative resist was exposed at an exposure amount of 1 mJ/cm$^2$ without using a mask.

(Exposure Conditions for Evaluating Bridge Defect Inhibition Performance)

The wafer prepared as above was subjected to EUV exposure using Quasar lighting (Quasar 45, outer sigma 0.81, inner sigma 0.51) at a lens numerical aperture (NA) of 0.25. More specifically, through a mask including a pattern (for evaluating C/H removability) for forming a contact hole pattern with dimensions of a pitch of 60 nm and a hole size of 30 nm on a wafer and a line-and-space (LS) pattern with a line width of 22 nm and a pitch of 50 nm, the exposure amount was adjusted, and then the entire surface of the wafer was subjected to EUV expose at an exposure amount yielding a line width of 22 nm.

(Common Development Conditions)

Immediately after the exposure was performed under the above conditions, the wafer was baked for 60 seconds under the condition of 100° C.

Thereafter, by using a shower-type developing machine (ADE3000S manufactured by ActesKyosan inc.), the developer (23° C.) was sprayed and jetted to the wafer, which was rotating at 50 rpm, for 30 seconds at a flow rate of 200 mL/min so as to perform development, thereby obtaining a sample for evaluation.

(Evaluation of Bridge Defect Inhibition Performance)

The resolution of the exposed LS pattern was observed using a scanning electron microscope (CG4600, manufactured by Hitachi, Ltd.) at 200k magnification in visual fields (n=300). The number of bridges occurring in the LS pattern in one visual field observed was evaluated and adopted as the number of bridge defects in the LS pattern. The smaller the number of bridge defects, the better the bridge defect inhibition performance of the chemical liquid. The results were evaluated according to the following standard. The evaluation results are shown in Table 3.

A: The number of defects was equal to or smaller than 10 (number/visual field).

B: The number of defects was greater than 10 (number/visual field) and equal to or smaller than 30 (number/visual field).

C: The number of defects was greater than 30 (number/visual field) and equal to or smaller than 100 (number/visual field).

D: The number of defects was greater than 100 (number/visual field) and equal to or smaller than 300 (number/visual field).

E: The number of defects was greater than 300 (number/visual field).

(Evaluation of Post-Development Defect Inhibition Performance)

For the obtained sample, by using a wafer inspection device "SP-5" manufactured by KLA-Tencor Corporation, the total number of defects having a size equal to or greater than 19 nm existing on the entire surface of the wafer was measured. The results were evaluated according to the following standard. The evaluation results are shown in Table 3.

A: The number of defects was equal to or smaller than 200/wafer.

B: The number of defects was greater than 200/wafer and equal to or smaller than 500/wafer.

C: The number of defects was greater than 500/wafer and equal to or smaller than 1,000/wafer.

D: The number of defects was greater than 1,000/wafer and equal to or smaller than 1,500/wafer.

E: The number of defects was greater than 1,500/wafer.

[Evaluation of Defect Inhibition Performance of Chemical Liquid: Defect Inhibition Performance During ArF Expose]

By using the chemical liquids 204 to 206, the defect inhibition performance (post-development defect inhibition performance and bridge defect inhibition performance) of the chemical liquids was evaluated by the following operation. The ArF exposure means a pattern forming method by exposure using an ArF excimer laser.

A 12-inch silicon wafer was coated with each of the chemical liquids 204 to 206 and baked for 60 seconds under the condition of 90° C. to 120° C., thereby forming a resist film thickness of 40 nm.

Before being coated with the resist film, the silicon wafer was coated with an organic antireflection film ARC29SR (manufactured by Brewer Science Inc.) and baked for 60 seconds at 205° C. so as to form an antireflection film having a film thickness of 86 nm.

(Exposure Conditions for Evaluating Post-Development Defect Inhibition Performance)

The wafer prepared as above was subjected to ArF exposure using an ArF excimer laser immersion scanner (XT1700i manufactured by ASML, NA1.20, Dipole, outer sigma 0.900, inner sigma 0.700, Y polarization). Specifically, the entire surface of the negative resist was exposed at an exposure amount of 1 mJ/cm$^2$ without using a mask.

(Exposure Conditions for Evaluating Bridge Defect Inhibition Performance)

The obtained wafer was subjected to pattern exposure using an ArF excimer laser immersion scanner (XT1700i manufactured by ASML, NA1.20, Dipole, outer sigma 0.900, inner sigma 0.700, Y polarization). As a reticle, a 6% halftone mask having a line size=50 nm and a line:space=1:1 was used. Ultrapure water was used as an immersion solution.

The conditions were adjusted so as to obtain a line-and-space pattern having a pitch of 100 nm, a space width of 35 nm, and a line width of 65 nm.

(Common Development Conditions)

Thereafter, the wafer was baked (Post Exposure Bake; PEB) at 100° C. and then subjected to puddle development in a developer for 30 seconds, thereby creating a wafer in which a pattern was formed. In a case where a rinsing treatment was performed, the wafer was developed by puddling for 30 seconds in a developer, then rinsed by puddling in a rinsing solution before being dried, and then rotated for 30 seconds at a rotation speed of 4,000 rpm. In this way, a sample for evaluation was obtained.

(Evaluation of Bridge Defect Inhibition Performance)

The resolution of the exposed LS pattern was observed using a scanning electron microscope (CG4600, manufactured by Hitachi, Ltd.) at 200k magnification in visual fields (n=300). The number of bridges occurring in the LS pattern in one visual field observed was evaluated and adopted as the number of bridge defects in the LS pattern. The smaller the number of bridge defects, the better the bridge defect inhibition performance of the chemical liquid. The results were evaluated according to the following standard. The evaluation results are shown in Table 3.

A: The number of defects was equal to or smaller than 10 (number/visual field).

B: The number of defects was greater than 10 (number/visual field) and equal to or smaller than 30 (number/visual field).

C: The number of defects was greater than 30 (number/visual field) and equal to or smaller than 100 (number/visual field).

D: The number of defects was greater than 100 (number/visual field) and equal to or smaller than 300 (number/visual field).

E: The number of defects was greater than 300 (number/visual field).

(Evaluation of Post-Development Defect Inhibition Performance)

For the obtained sample, by using a wafer inspection device "SP-5" manufactured by KLA-Tencor Corporation, the total number of defects having a size equal to or greater than 19 nm existing on the entire surface of the wafer was measured. The results were evaluated according to the following standard. The evaluation results are shown in Table 3.

A: The number of defects was equal to or smaller than 200/wafer.

B: The number of defects was greater than 200/wafer and equal to or smaller than 500/wafer.

C: The number of defects was greater than 500/wafer and equal to or smaller than 1,000/wafer.

D: The number of defects was greater than 1,000/wafer and equal to or smaller than 1,500/wafer.

E: The number of defects was greater than 1,500/wafer.

[Evaluation of Defect Inhibition Performance of Chemical Liquid: Defect Inhibition Performance During KRF Expose]

By using the chemical liquids 207 to 209, the defect inhibition performance (post-development defect inhibition performance and bridge defect inhibition performance) of the chemical liquids was evaluated by the following operation. KrF means a pattern forming method by exposure using a KrF excimer laser.

The silicon wafer was treated with hexamethyldisilazane (HMDS) (110° C. for 35 seconds), and by using the chemical liquids 207 to 209, a resist film having a thickness of 100 nm was formed on the wafer. Before the coating with the chemical liquids, an oxide film having a thickness of 100 nm was formed on the silicon wafer.

(Exposure Conditions for Evaluating Post-Development Defect Inhibition Performance)

By using a KrF excimer laser scanner (PAS5500/850 manufactured by ASML) (NA 0.80), KrF expose was performed on the wafer prepared as above. Specifically, the entire surface of the negative resist was exposed at an exposure amount of 1 mJ/cm$^2$ without using a mask.

(Exposure Conditions for Evaluating Bridge Defect Inhibition Performance)

The obtained wafer was subjected to pattern exposure using a KrF excimer laser scanner (PAS5500/850, manufactured by ASML) (NA 0.80). As a reticle, a binary mask was used which had a line-and-space pattern with a line size of 175 nm and a space size of 263 nm. The conditions were adjusted so as to obtain a line-and-space pattern having a pitch of 438 nm, a space width of 130 nm, and a line width of 308 nm.

(Common Development Conditions)

Then, after baking (Post Exposure Bake; PEB) under the condition of 100° C. for 60 seconds, puddle development with a developer was performed for 30 seconds, puddle rinsing with a rinsing solution was performed in a case where a rinsing process was carried out, and then the wafer was rotated for 30 seconds at a rotation speed of 4000 rpm, thereby obtaining a sample for evaluation.

As the developer, FHD-5 manufactured by Fuji Film Electronics Materials Co., Ltd. was used.

(Evaluation of Bridge Defect Inhibition Performance)

The resolution of the exposed LS pattern was observed using a scanning electron microscope (CG4600, manufactured by Hitachi, Ltd.) at 200k magnification in visual fields (n=300). The number of bridges occurring in the LS pattern in one visual field observed was evaluated and adopted as the number of bridge defects in the LS pattern. The smaller the number of bridge defects, the better the bridge defect inhibition performance of the chemical liquid. The results were evaluated according to the following standard. The evaluation results are shown in Table 3.

A: The number of defects was equal to or smaller than 10 (number/visual field).

B: The number of defects was greater than 10 (number/visual field) and equal to or smaller than 30 (number/visual field).

C: The number of defects was greater than 30 (number/visual field) and equal to or smaller than 100 (number/visual field).

D: The number of defects was greater than 100 (number/visual field) and equal to or smaller than 300 (number/visual field).

E: The number of defects was greater than 300 (number/visual field).

(Evaluation of Post-Development Defect Inhibition Performance)

For the obtained sample, by using a wafer inspection device "SP-5" manufactured by KLA-Tencor Corporation, the total number of defects having a size equal to or greater than 19 nm existing on the entire surface of the wafer was measured. The results were evaluated according to the following standard. The evaluation results are shown in Table 3.

A: The number of defects was equal to or smaller than 200/wafer.

B: The number of defects was greater than 200/wafer and equal to or smaller than 500/wafer.

C: The number of defects was greater than 500/wafer and equal to or smaller than 1,000/wafer.

D: The number of defects was greater than 1,000/wafer and equal to or smaller than 1,500/wafer.

E: The number of defects was greater than 1,500/wafer.

[Evaluation 3: Evaluation of Pot Life of Filter]

The liquid to be purified was continuously purified using each of the filtering devices described in Table 3. After the liquid to be purified was passed and the filtering device was stabilized, the obtained chemical liquid was immediately collected for test (initial sample). Then, whenever the amount of the liquid passing through the device became 10,000 kg, a chemical liquid obtained after purification was collected for test (temporal sample). The chemical liquid collected for test was evaluated by the method for evaluating the bridge defect inhibition performance of a chemical liquid described in "Evaluation 1", and the number of defects per unit area was compared with that of the initial sample. The amount of the chemical liquid passing the device that was determined at a point in time when the number of defects in the temporal sample doubled was adopted as "pot life" of the filter. The pot life determined in a case (chemical liquid 203) where the filtering device described in FIG. 24 was used was regarded as 1, and the pot life of the filter of each device was evaluated based on a ratio to 1. The results were evaluated based on the following standard. The evaluation results are shown in Table 3. The evaluation result obtained using the device in FIG. 24 is described as "Standard".

For the chemical liquids 1 to 28, the chemical liquids 29 to 33, the chemical liquids 35 to 48, the chemical liquids 101 and 102, the chemical liquids 201 and 202, the chemical liquids 204 and 205, and the chemical liquids 207 to 208, chemical liquids were prepared using the same filtering device (purification device) as that described in the tables. In this case, circulation filtration was not performed. The obtained chemical liquids were evaluated in terms of the items described in the tables. As a result, the obtained chemical liquids were found to have excellent defect inhibition performance. Furthermore, it has been confirmed that the pot life of the filter is also excellent as described above.

TABLE 1

(1-1)

Figure 15:
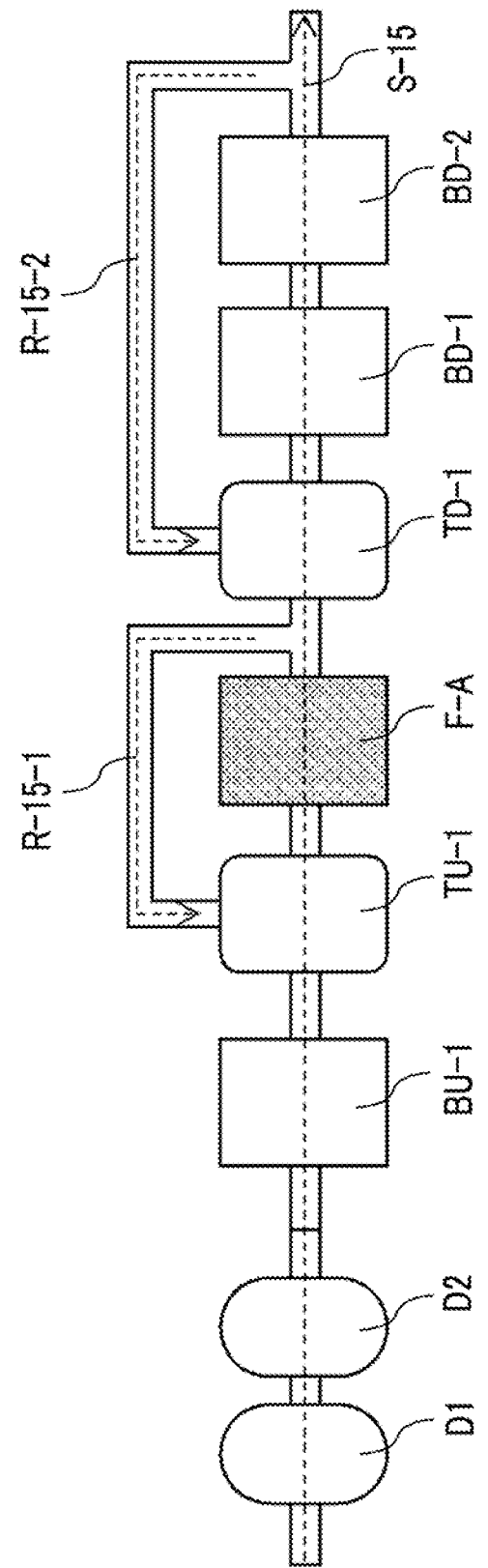
FIG. 15 is a schematic view illustrating a purification device according to an embodiment of the present invention.
Figure 16:
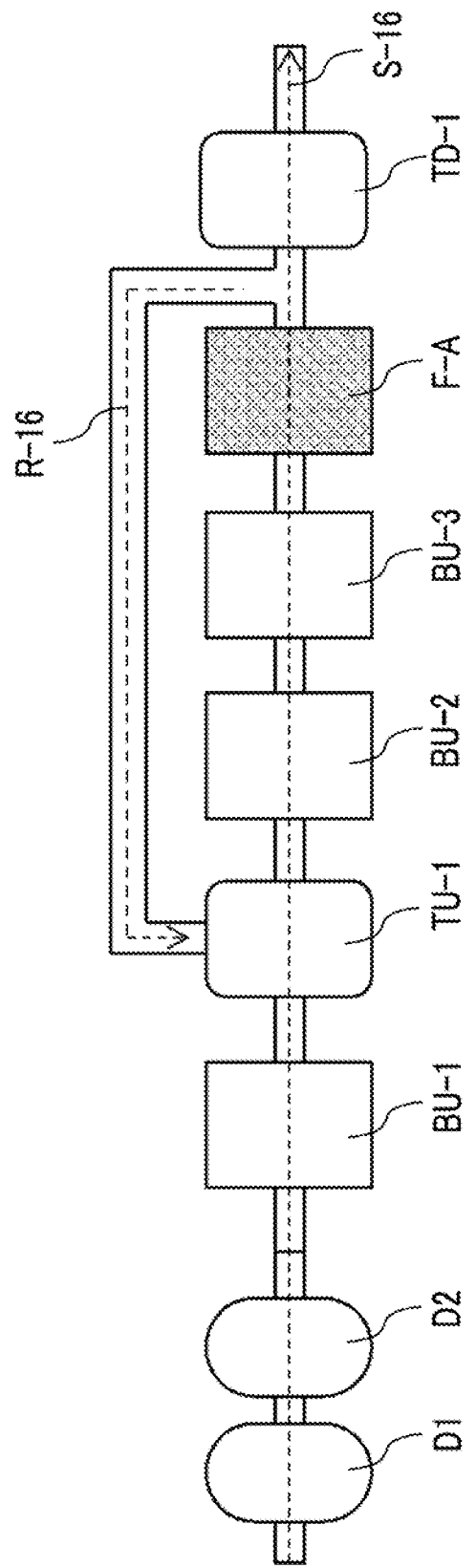
FIG. 16 is a schematic view illustrating a purification device according to an embodiment of the present invention.
Figure 17:
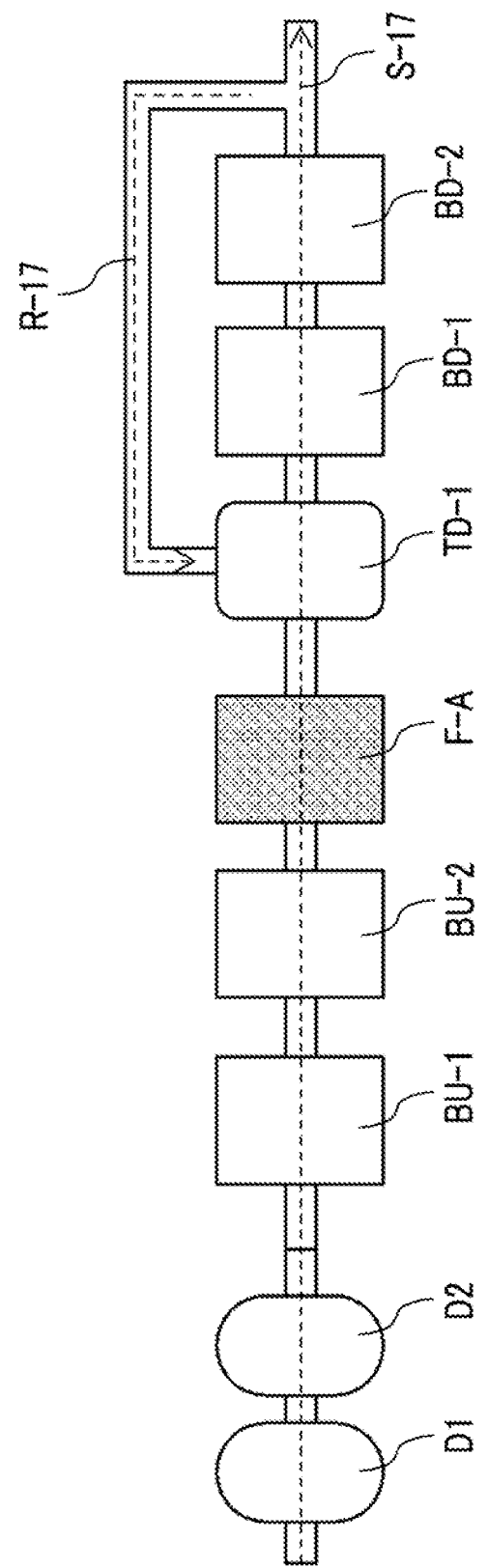
FIG. 17 is a schematic view illustrating a purification device according to an embodiment of the present invention.
Figure 19:
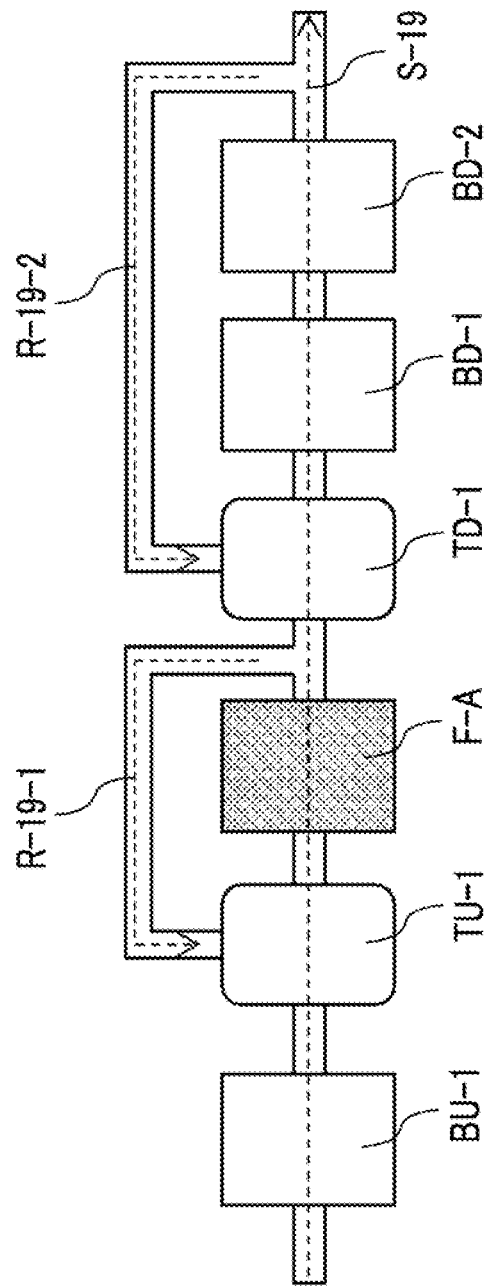
FIG. 19 is a schematic view illustrating a filtering device according to an embodiment of the present invention.
Figure 20:
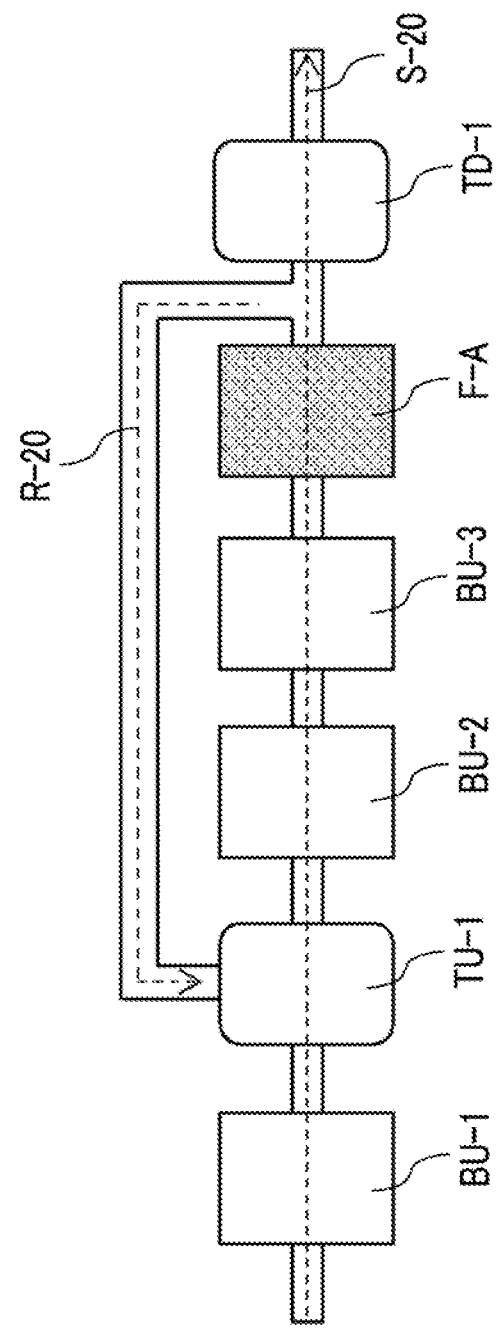
FIG. 20 is a schematic view illustrating a filtering device according to an embodiment of the present invention.
Figure 21:
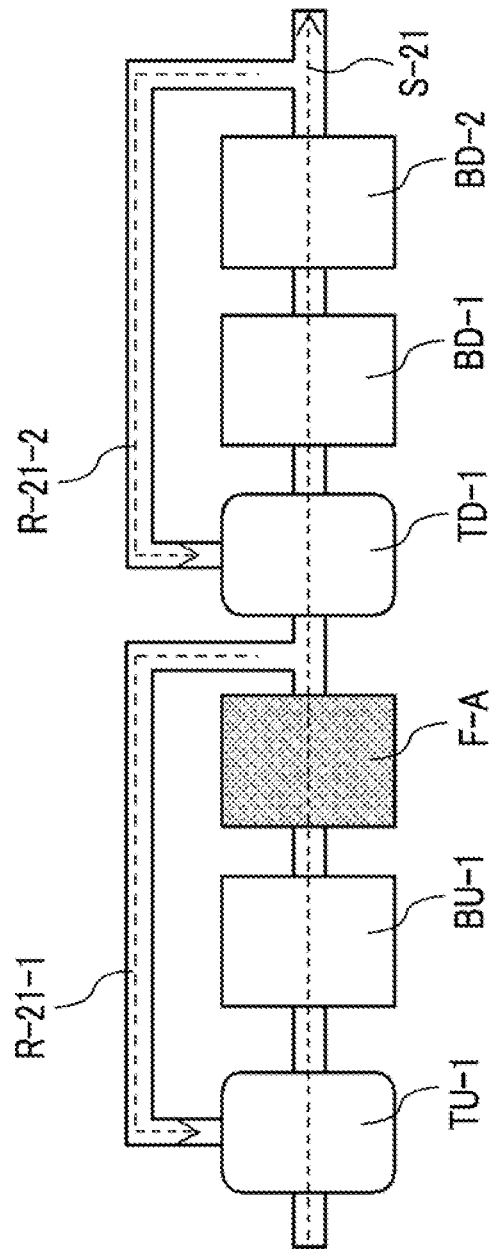
FIG. 21 is a schematic view illustrating a filtering device according to an embodiment of the present invention.
Figure 22:
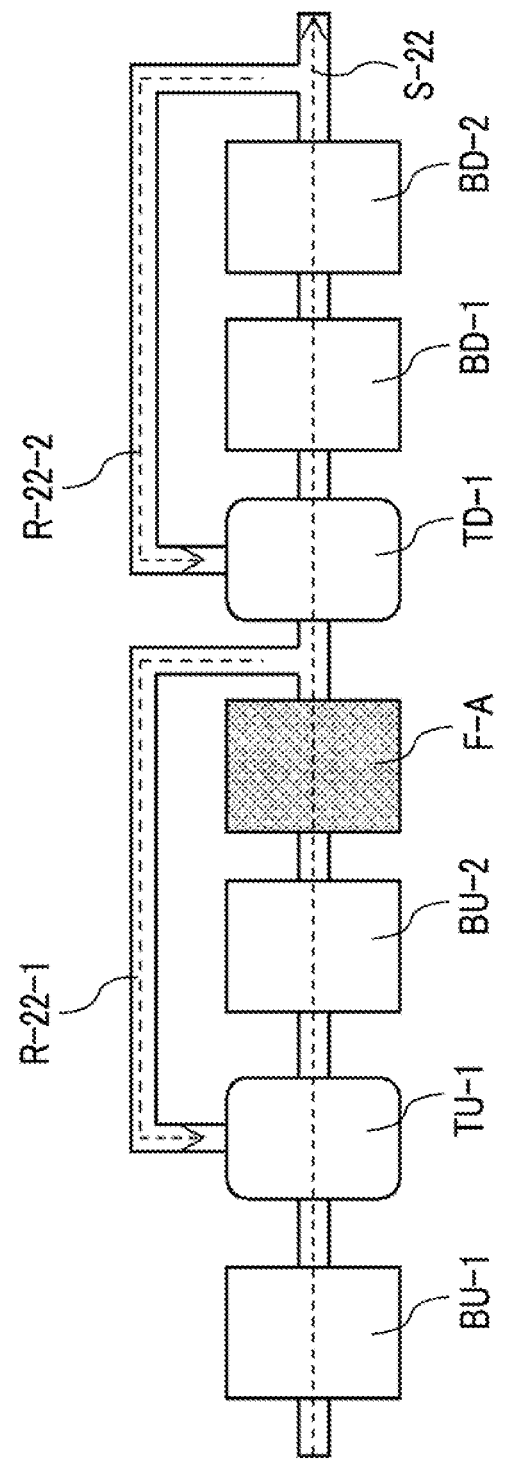
FIG. 22 is a schematic view illustrating a filtering device according to an embodiment of the present invention.

|  | Filtering device (purification device) | Liquid to be purified | Pre-washing of filter | Distiller |
|---|---|---|---|---|
| Chemical liquid 1 | FIG. 14 | CHN | PGMEA 1 day immersion | Duplex |
| Chemical liquid 2 | FIG. 15 | CHN | PGMEA 1 day immersion | Duplex |
| Chemical liquid 3 | FIG. 16 | CHN | PGMEA 1 day immersion | Duplex |
| Chemical liquid 4 | FIG. 14 | CHN | PGMEA 1 day immersion | Duplex |
| Chemical liquid 5 | FIG. 17 | CHN | PGMEA 1 day immersion | Duplex |
| Chemical liquid 6 | FIG. 14 | CHN | PGMEA 1 day immersion | Duplex |
| Chemical liquid 7 | FIG. 14 | CHN | PGMEA 1 day immersion | Duplex |
| Chemical liquid 8 | FIG. 14 | CHN | PGMEA 1 day immersion | Duplex |
| Chemical liquid 9 | FIG. 14 | CHN | PGMEA 1 day immersion | Duplex |
| Chemical liquid 10 | FIG. 14 | CHN | PGMEA 1 day immersion | Duplex |
| Chemical liquid 11 | FIG. 14 | CHN | PGMEA 1 day immersion | Duplex |
| Chemical liquid 12 | FIG. 15 | CHN | PGMEA 1 day immersion | Duplex |
| Chemical liquid 13 | FIG. 14 | CHN | PGMEA 1 day immersion | Duplex |
| Chemical liquid 14 | FIG. 17 | CHN | PGMEA 1 day immersion | Duplex |
| Chemical liquid 15 | FIG. 14 | CHN | — | Duplex |
| Chemical liquid 16 | FIG. 18 | CHN | PGMEA 1 day immersion | — |
| Chemical liquid 17 | FIG. 19 | CHN | PGMEA 1 day immersion | — |
| Chemical liquid 18 | FIG. 20 | CHN | PGMEA 1 day immersion | — |
| Chemical liquid 19 | FIG. 18 | CHN | PGMEA 1 day immersion | — |
| Chemical liquid 20 | FIG. 21 | CHN | PGMEA 1 day immersion | — |
| Chemical liquid 21 | FIG. 22 | CHN | PGMEA 1 day immersion | — |
| Chemical liquid 22 | FIG. 22 | CHN | PGMEA 1 day immersion | — |
| Chemical liquid 23 | FIG. 22 | CHN | PGMEA 1 day immersion | — |
| Chemical liquid 24 | FIG. 22 | CHN | PGMEA 1 day immersion | — |
| Chemical liquid 25 | FIG. 22 | CHN | PGMEA 1 day immersion | — |
| Chemical liquid 26 | FIG. 22 | CHN | PGMEA 1 day immersion | — |

TABLE 1-continued

(1-2)

| | BU-1 | | BU-2 | | BU-3 | | |
|---|---|---|---|---|---|---|---|
| | Material component | Pore size (nm) | Material component | Pore size (nm) | Material component | Pore size (nm) | Tank TU-1 |
| Chemical liquid 1 | PP | 200 | IEX | 10 | — | — | Present |
| Chemical liquid 2 | IEX | 10 | — | — | — | — | Present |
| Chemical liquid 3 | PP | 200 | IEX | 10 | Nylon | 10 | Present |
| Chemical liquid 4 | PP | 200 | IEX | 20 | — | — | Present |
| Chemical liquid 5 | PP | 200 | IEX | 10 | — | — | — |
| Chemical liquid 6 | PTFE | 10 | IEX | 10 | — | — | Present |
| Chemical liquid 7 | PP | 200 | IEX | 10 | — | — | Present |
| Chemical liquid 8 | PP | 200 | IEX | 10 | — | — | Present |
| Chemical liquid 9 | PP | 200 | IEX | 10 | — | — | Present |
| Chemical liquid 10 | PP | 200 | IEX | 10 | — | — | Present |
| Chemical liquid 11 | PP | 200 | IEX | 10 | — | — | Present |
| Chemical liquid 12 | PP | 200 | — | — | — | — | Present |
| Chemical liquid 13 | PP | 200 | IEX | 10 | — | — | Present |
| Chemical liquid 14 | PP | 200 | IEX | 10 | — | — | — |
| Chemical liquid 15 | PP | 200 | IEX | 10 | — | — | Present |
| Chemical liquid 16 | PP | 200 | IEX | 10 | — | — | — |
| Chemical liquid 17 | IEX | 10 | — | — | — | — | Present |
| Chemical liquid 18 | PP | 200 | IEX | 10 | Nylon | 10 | Present |
| Chemical liquid 19 | PP | 200 | IEX | 20 | — | — | — |
| Chemical liquid 20 | IEX | 10 | — | — | — | — | Present |
| Chemical liquid 21 | PTFE | 10 | IEX | 10 | — | — | Present |
| Chemical liquid 22 | PP | 200 | IEX | 10 | — | — | Present |
| Chemical liquid 23 | PP | 200 | IEX | 10 | — | — | Present |
| Chemical liquid 24 | PP | 200 | IEX | 10 | — | — | Present |
| Chemical liquid 25 | PP | 200 | IEX | 10 | — | — | Present |
| Chemical liquid 26 | PP | 200 | IEX | 10 | — | — | Present |

(1-3)

| | F-A | | BD-1 | | BD-2 | | |
|---|---|---|---|---|---|---|---|
| | Material component | Pore size (nm) | Material component | Pore size (nm) | Material component | Pore size (nm) | Tank TD-1 |
| Chemical liquid 1 | A2 | 10 | Nylon | 10 | UPE | 3 | Present |
| Chemical liquid 2 | A2 | 10 | Nylon | 10 | UPE | 3 | Present |
| Chemical liquid 3 | A2 | 10 | — | — | — | — | Present |
| Chemical liquid 4 | A2 | 10 | Nylon | 10 | UPE | 3 | Present |
| Chemical liquid 5 | A2 | 10 | Nylon | 10 | UPE | 3 | Present |

TABLE 1-continued

| | | | | | | | | |
|---|---|---|---|---|---|---|---|---|
| Chemical liquid 6 | A2 | 10 | Nylon | 10 | UPE | 3 | Present | |
| Chemical liquid 7 | A2 | 10 | Nylon | 10 | PTFE | 20 | Present | |
| Chemical liquid 8 | A2 | 10 | Nylon | 10 | PTFE | 7 | Present | |
| Chemical liquid 9 | A2 | 10 | Nylon | 10 | Nylon | 5 | Present | |
| Chemical liquid 10 | A2 | 10 | Nylon | 10 | UPE | 5 | Present | |
| Chemical liquid 11 | A2 | 10 | Nylon | 10 | UPE | 1 | Present | |
| Chemical liquid 12 | A2 | 10 | Nylon | 10 | UPE | 3 | Present | |
| Chemical liquid 13 | A2 | 10 | PTFE | 10 | UPE | 3 | Present | |
| Chemical liquid 14 | A2 | 10 | Nylon | 10 | UPE | 3 | Present | |
| Chemical liquid 15 | A2 | 10 | Nylon | 10 | UPE | 3 | Present | |
| Chemical liquid 16 | A2 | 10 | Nylon | 10 | UPE | 3 | Present | |
| Chemical liquid 17 | A2 | 10 | Nylon | 10 | UPE | 3 | Present | |
| Chemical liquid 18 | A2 | 10 | — | — | — | — | Present | |
| Chemical liquid 19 | A2 | 10 | Nylon | 10 | UPE | 3 | Present | |
| Chemical liquid 20 | A2 | 10 | Nylon | 10 | UPE | 3 | Present | |
| Chemical liquid 21 | A2 | 10 | Nylon | 10 | UPE | 3 | Present | |
| Chemical liquid 22 | A2 | 10 | Nylon | 10 | PTFE | 20 | Present | |
| Chemical liquid 23 | A2 | 10 | Nylon | 10 | PTFE | 7 | Present | |
| Chemical liquid 24 | A2 | 10 | Nylon | 10 | Nylon | 5 | Present | |
| Chemical liquid 25 | A2 | 10 | Nylon | 10 | UPE | 3 | Present | |
| Chemical liquid 26 | A2 | 10 | Nylon | 10 | UPE | 1 | Present | |

(1-4)

| | | Evaluation 1 | | Evaluation 2 | Evaluation 3 | Evaluation 4 |
|---|---|---|---|---|---|---|
| | Evaluation method | Residue defect inhibition performance | Stain-like defect inhibition performance | Bridge defect inhibition performance | Pattern width uniformity | Pot life |
| Chemical liquid 1 | Pre-wetting | AA | A | AA | AA | AA |
| Chemical liquid 2 | Pre-wetting | A | A | A | AA | B |
| Chemical liquid 3 | Pre-wetting | B | A | B | AA | AA |
| Chemical liquid 4 | Pre-wetting | A | A | A | A | AA |
| Chemical liquid 5 | Pre-wetting | A | A | A | AA | AA |
| Chemical liquid 6 | Pre-wetting | A | A | A | AA | A |
| Chemical liquid 7 | Pre-wetting | B | A | B | AA | AA |
| Chemical liquid 8 | Pre-wetting | A | A | A | AA | AA |
| Chemical liquid 9 | Pre-wetting | A | AA | A | AA | AA |
| Chemical liquid 10 | Pre-wetting | A | A | A | AA | AA |
| Chemical liquid 11 | Pre-wetting | AA | A | AA | AA | AA |
| Chemical liquid 12 | Pre-wetting | A | A | A | B | AA |
| Chemical liquid 13 | Pre-wetting | A | B | A | B | AA |
| Chemical liquid 14 | Pre-wetting | A | A | A | AA | AA |

TABLE 1-continued

| | | | | | | |
|---|---|---|---|---|---|---|
| Chemical liquid 15 | Pre-wetting | B | B | B | B | AA |
| Chemical liquid 16 | Pre-wetting | B | B | B | A | AA |
| Chemical liquid 17 | Pre-wetting | B | B | B | A | C |
| Chemical liquid 18 | Pre-wetting | C | B | C | A | AA |
| Chemical liquid 19 | Pre-wetting | B | B | B | B | AA |
| Chemical liquid 20 | Pre-wetting | B | B | B | A | AA |
| Chemical liquid 21 | Pre-wetting | B | B | B | A | AA |
| Chemical liquid 22 | Pre-wetting | C | B | C | A | AA |
| Chemical liquid 23 | Pre-wetting | D | B | D | A | AA |
| Chemical liquid 24 | Pre-wetting | B | A | B | A | AA |
| Chemical liquid 25 | Pre-wetting | B | B | B | A | AA |
| Chemical liquid 26 | Pre-wetting | A | B | A | A | AA |

(2-1)

Figure 23:
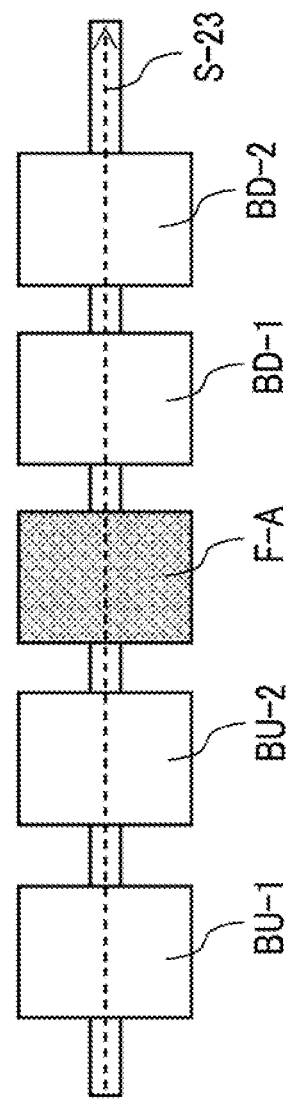
FIG. 23 is a schematic view illustrating a filtering device according to an embodiment of the present invention.

| | Filtering device (Purification device) | Liquid to be purified | Pre-washing of filter | Distiller |
|---|---|---|---|---|
| Chemical liquid 27 | FIG. 19 | CHN | PGMEA 1 day immersion | — |
| Chemical liquid 28 | FIG. 22 | CHN | PGMEA 1 day immersion | — |
| Chemical liquid 29 | FIG. 23 | CHN | PGMEA 1 day immersion | — |
| Chemical liquid 30 | FIG. 22 | CHN | — | — |
| Chemical liquid 31 | FIG. 14 | PGMEA/PGME(7:3) | PGMEA 1 day immersion | Duplex |
| Chemical liquid 32 | FIG. 14 | nBA | PGMEA 1 day immersion | Duplex |
| Chemical liquid 33 | FIG. 14 | PC/PGMEA(1:9) | PGMEA 1 day immersion | Duplex |
| Chemical liquid 34 | FIG. 24 | CHN | PGMEA 1 day immersion | — |
| Chemical liquid 35 | FIG. 14 | CHN | PGMEA 1 day immersion | Duplex |
| Chemical liquid 36 | FIG. 14 | PGMEA/PGME(7:3) | PGMEA 1 day immersion | Duplex |
| Chemical liquid 37 | FIG. 14 | nBA | PGMEA 1 day immersion | Duplex |
| Chemical liquid 38 | FIG. 14 | PC/PGMEA(1:9) | PGMEA 1 day immersion | Duplex |
| Chemical liquid 39 | FIG. 14 | CHN | PGMEA 1 day immersion | Duplex |
| Chemical liquid 40 | FIG. 14 | PGMEA/PGME(7:3) | PGMEA 1 day immersion | Duplex |
| Chemical liquid 41 | FIG. 14 | nBA | PGMEA 1 day immersion | Duplex |
| Chemical liquid 42 | FIG. 14 | PC/PGMEA(1:9) | PGMEA 1 day immersion | Duplex |
| Chemical liquid 43 | FIG. 14 | EL | PGMEA 1 day immersion | Duplex |
| Chemical liquid 44 | FIG. 14 | MIBC | PGMEA 1 day immersion | Duplex |
| Chemical liquid 45 | FIG. 14 | PGMEA | PGMEA 1 day immersion | Duplex |
| Chemical liquid 46 | FIG. 14 | PC | PGMEA 1 day immersion | Duplex |
| Chemical liquid 47 | FIG. 14 | iAA | PGMEA 1 day immersion | Duplex |
| Chemical liquid 48 | FIG. 14 | IPA | PGMEA 1 day immersion | Duplex |
| Chemical liquid 49 | FIG. 24 | CHN | PGMEA 1 day immersion | — |
| Chemical liquid 50 | FIG. 24 | CHN | PGMEA 1 day immersion | — |

TABLE 1-continued

(2-2)

| | BU-1 | | BU-2 | | BU-3 | | Tank TU-1 |
|---|---|---|---|---|---|---|---|
| | Material component | Pore size (nm) | Material component | Pore size (nm) | Material component | Pore size (nm) | |
| Chemical liquid 27 | PP | 200 | — | — | — | — | Present |
| Chemical liquid 28 | PP | 200 | IEX | 10 | — | — | Present |
| Chemical liquid 29 | PP | 200 | IEX | 10 | — | — | — |
| Chemical liquid 30 | PP | 200 | IEX | 10 | — | — | Present |
| Chemical liquid 31 | PP | 200 | IEX | 10 | — | — | Present |
| Chemical liquid 32 | PP | 200 | IEX | 10 | — | — | Present |
| Chemical liquid 33 | PP | 200 | IEX | 10 | — | — | Present |
| Chemical liquid 34 | — | — | — | — | — | — | — |
| Chemical liquid 35 | PP | 200 | IEX | 10 | — | — | Present |
| Chemical liquid 36 | PP | 200 | IEX | 10 | — | — | Present |
| Chemical liquid 37 | PP | 200 | IEX | 10 | — | — | Present |
| Chemical liquid 38 | PP | 200 | IEX | 10 | — | — | Present |
| Chemical liquid 39 | PP | 200 | IEX | 10 | — | — | Present |
| Chemical liquid 40 | PP | 200 | IEX | 10 | — | — | Present |
| Chemical liquid 41 | PP | 200 | IEX | 10 | — | — | Present |
| Chemical liquid 42 | PP | 200 | IEX | 10 | — | — | Present |
| Chemical liquid 43 | PP | 200 | IEX | 10 | — | — | Present |
| Chemical liquid 44 | PP | 200 | IEX | 10 | — | — | Present |
| Chemical liquid 45 | PP | 200 | IEX | 10 | — | — | Present |
| Chemical liquid 46 | PP | 200 | IEX | 10 | — | — | Present |
| Chemical liquid 47 | PP | 200 | IEX | 10 | — | — | Present |
| Chemical liquid 48 | PP | 200 | IEX | 10 | — | — | Present |
| Chemical liquid 49 | — | — | — | — | — | — | — |
| Chemical liquid 50 | — | — | — | — | — | — | — |

(2-3)

| | F-A | | BD-1 | | BD-2 | | Tank TD-1 |
|---|---|---|---|---|---|---|---|
| | Material component | Pore size (nm) | Material component | Pore size (nm) | Material component | Pore size (nm) | |
| Chemical liquid 27 | A2 | 10 | Nylon | 10 | UPE | 3 | Present |
| Chemical liquid 28 | A2 | 10 | PTFE | 10 | UPE | 3 | Present |
| Chemical liquid 29 | A2 | 10 | Nylon | 10 | UPE | 3 | — |
| Chemical liquid 30 | A2 | 10 | Nylon | 10 | UPE | 3 | Present |
| Chemical liquid 31 | A2 | 10 | Nylon | 10 | UPE | 3 | Present |
| Chemical liquid 32 | A2 | 10 | Nylon | 10 | UPE | 3 | Present |
| Chemical liquid 33 | A2 | 10 | Nylon | 10 | UPE | 3 | Present |

TABLE 1-continued

| | | | | | | | |
|---|---|---|---|---|---|---|---|
| Chemical liquid 34 | A2 | 10 | — | — | — | — | — |
| Chemical liquid 35 | A1 | 10 | Nylon | 10 | UPE | 3 | Present |
| Chemical liquid 36 | A1 | 10 | Nylon | 10 | UPE | 3 | Present |
| Chemical liquid 37 | A1 | 10 | Nylon | 10 | UPE | 3 | Present |
| Chemical liquid 38 | A1 | 10 | Nylon | 10 | UPE | 3 | Present |
| Chemical liquid 39 | A3 | 10 | Nylon | 10 | UPE | 3 | Present |
| Chemical liquid 40 | A3 | 10 | Nylon | 10 | UPE | 3 | Present |
| Chemical liquid 41 | A3 | 10 | Nylon | 10 | UPE | 3 | Present |
| Chemical liquid 42 | A3 | 10 | Nylon | 10 | UPE | 3 | Present |
| Chemical liquid 43 | A2 | 10 | Nylon | 10 | UPE | 3 | Present |
| Chemical liquid 44 | A2 | 10 | Nylon | 10 | UPE | 3 | Present |
| Chemical liquid 45 | A2 | 10 | Nylon | 10 | UPE | 3 | Present |
| Chemical liquid 46 | A2 | 10 | Nylon | 10 | UPE | 3 | Present |
| Chemical liquid 47 | A2 | 10 | Nylon | 10 | UPE | 3 | Present |
| Chemical liquid 48 | A2 | 10 | Nylon | 10 | UPE | 3 | Present |
| Chemical liquid 49 | A1 | 10 | — | — | — | — | — |
| Chemical liquid 50 | A3 | 10 | — | — | — | — | — |

(2-4)

| | | Evaluation 1 | | Evaluation 2 | Evaluation 3 | Evaluation 4 |
|---|---|---|---|---|---|---|
| | Evaluation method | Residue defect inhibition performance | Stain-like defect inhibition performance | Bridge defect inhibition performance | Pattern width uniformity | Pot life |
| Chemical liquid 27 | Pre-wetting | B | B | B | C | AA |
| Chemical liquid 28 | Pre-wetting | B | C | B | B | AA |
| Chemical liquid 29 | Pre-wetting | B | B | B | A | AA |
| Chemical liquid 30 | Pre-wetting | C | C | C | C | AA |
| Chemical liquid 31 | Pre-wetting | AA | A | AA | AA | AA |
| Chemical liquid 32 | Developer | AA | A | AA | AA | AA |
| Chemical liquid 33 | Pre-wetting | AA | A | AA | AA | AA |
| Chemical liquid 34 | Pre-wetting | E | E | E | D | Standard |
| Chemical liquid 35 | Pre-wetting | A | AA | A | AA | AA |
| Chemical liquid 36 | Developer | A | AA | A | AA | AA |
| Chemical liquid 37 | Pre-wetting | A | AA | A | AA | AA |
| Chemical liquid 38 | Pre-wetting | A | AA | A | AA | AA |
| Chemical liquid 39 | Pre-wetting | A | AA | A | AA | AA |
| Chemical liquid 40 | Pre-wetting | A | AA | A | AA | AA |
| Chemical liquid 41 | Rinsing solution | A | AA | A | AA | AA |
| Chemical liquid 42 | Pre-wetting | A | AA | A | AA | AA |
| Chemical liquid 43 | Pre-wetting | AA | A | AA | AA | AA |
| Chemical liquid 44 | Pre-wetting | AA | A | AA | AA | AA |

TABLE 1-continued

| | | | | | | |
|---|---|---|---|---|---|---|
| Chemical liquid 45 | Pre-wetting | AA | A | AA | AA | AA |
| Chemical liquid 46 | Pre-wetting | AA | A | AA | AA | AA |
| Chemical liquid 47 | Pre-wetting | AA | A | AA | AA | AA |
| Chemical liquid 48 | Pre-wetting | AA | A | AA | AA | AA |
| Chemical liquid 49 | Pre-wetting | E | E | E | D | D |
| Chemical liquid 50 | Pre-wetting | E | E | E | D | D |

Table 1 is divided into a first group: Table 1 (1-1) to Table 1 (1-4) and a second group: Table 1 (2-1) to Table 1 (2-4).

In the corresponding lines of four tables of each group subdivided from Table 1, the filters included in the filtering device (or the purification device) used for the purifying each chemical liquid and the evaluation results of the obtained chemical liquid are described.

For example, in the first line in Table 1 (1-1) to Table 1 (1-4) as a first group of Table 1, the chemical liquid 1 is described.

The first line shows that the chemical liquid 1 was manufactured by the purification device illustrated in FIG. 14, the liquid to be purified used for manufacturing the chemical liquid 1 contained cyclohexanone (CHN), and the filter of the purification device used for manufacturing the chemical liquid 1 was washed in advance under the condition of "PGMEA 1 day immersion". Furthermore, the first line shows that the purification device has a duplex distiller, BU-1 (PP-containing filter with a pore size of 200 nm disposed on the uppermost stream side of the flow path), BU-2 (IEX filter with a pore size of 10 nm disposed on the downstream side of BU-1), a tank TU-1 disposed on the upstream side of the filter A (F-A), a filter A2 with a pore size of 10 nm as F-A (filter A), BD-1 (nylon-containing filter with a pore size of 10 nm) and BD-2 (UPE-containing filter with a pore size of 3 nm) arranged on the downstream side of the filter F-A, and a tank TD-1 disposed on the downstream side of the filter F-A.

The first line also shows that the chemical liquid 1 was evaluated by the "prewetting" method, the residue defect inhibition performance is AA, the stain-like defect inhibition performance is A, the bridge defect inhibition performance is AA, the pattern width uniformity is AA, and the pot life of the filter of the purification device is AA.

Likewise, for the chemical liquids 2 to 26, the results are described in the tables of the first group, and for the chemical liquids 27 to 48, the results are described in the tables of the second group.

As is evident from the results shown in Table 1, the chemical liquids 1 to 33 and the chemical liquids 35 to 48, which were manufactured using the filtering device (purification device) having the filter B different from the filter A, had excellent defect inhibition performance. In contrast, the chemical liquid 34, the chemical liquid 49, and the chemical liquid 50, which were manufactured using the filtering device having only the filter A, did not have the desired effects.

In addition, compared to the chemical liquid 2, the chemical liquid 1, which was purified using filtering device (purification device) having the filter BU as the filter B, had better residue defect inhibition performance and better bridge defect inhibition performance and further increased the pot life of the filter.

Furthermore, compared to the chemical liquid 12, the chemical liquid 1, which was purified using the filtering device (purification device) having the filter BU containing a resin having an ion exchange group, had better residue defect inhibition performance, better stain-like defect inhibition performance, and better bridge defect inhibition performance and resulted in better pattern width uniformity.

Moreover, compared to the chemical liquid 3, the chemical liquid 1, which was purified using the filtering device (purification device) having the filter BD as the filter B, had better defect inhibition performance and better bridge defect inhibition performance and resulted in better pattern width uniformity.

In addition, compared to the chemical liquid 7, the chemical liquid 1, which was purified using a filtering device (purification device) having a filter BD with a pore size smaller than the pore size of the filter A, had better residue defect inhibition performance and better stain-like defect inhibition performance.

Furthermore, compared to the chemical liquid 2, the chemical liquid 1, which was purified using a filtering device (purification device) having a tank and a filter with a pore size equal to or greater than 20 nm that is disposed in series with the tank on the upstream side of the tank in the flow path, had better residue defect inhibition performance and better bridge defect inhibition performance and further increased the pot life of the filter of the filtering device.

TABLE 2

| | | | | |
|---|---|---|---|---|
| | | (1-1) | | |
| | Filtering device | Liquid to be purified | Pre-washing of filter | Distiller |
| Chemical liquid 101 | FIG. 18 | SPM (4:1) | PGMEA 1 day immersion | — |
| Chemical liquid 102 | FIG. 18 | 85% Phosphoric acid | PGMEA 1 day immersion | — |
| Chemical liquid 103 | FIG. 24 | SPM(4:1) | PGMEA 1 day immersion | — |
| Chemical liquid 104 | FIG. 24 | 85% Phosphoric acid | PGMEA 1 day immersion | — |

TABLE 2-continued (1-2)

| | BU-1 | | BU-2 | | |
| --- | --- | --- | --- | --- | --- |
| | Material component | Pore size (nm) | Material component | Pore size (nm) | Tank TU-1 |
| Chemical liquid 101 | PTFE | 200 | PTFE | 20 | — |
| Chemical liquid 102 | PTFE | 200 | PTFE | 20 | — |
| Chemical liquid 103 | — | — | — | — | — |
| Chemical liquid 104 | — | — | — | — | — |

(1-3)

| | F-A | | BD-1 | | BD-2 | |
| --- | --- | --- | --- | --- | --- | --- |
| | Material component | Pore size (nm) | Material component | Pore size (nm) | Material component | Pore size (nm) |
| Chemical liquid 101 | A2 | 10 | PTFE | 10 | PTFE | 10 |
| Chemical liquid 102 | A1 | 10 | PTFE | 10 | PTFE | 10 |
| Chemical liquid 103 | A3 | 10 | — | — | — | — |
| Chemical liquid 104 | A1 | 10 | — | — | — | — |

(1-4)

| | | | Evaluation 1 | | |
| --- | --- | --- | --- | --- | --- |
| | Tank TD-1 | Circulation | Particle defect inhibition performance | Stain-like defect inhibition performance | Evaluation 2 Pot life |
| Chemical liquid 101 | Present | Performed | A | A | A |
| Chemical liquid 102 | Present | Performed | A | A | A |
| Chemical liquid 103 | — | — | C | B | Standard |
| Chemical liquid 104 | — | — | C | B | D |

Table 2 is divided into Table 2 (1-1) to Table 2 (1-4). In the corresponding lines of the tables subdivided from Table 2, the filtering devices used for purifying the chemical liquids and the obtained evaluation results of chemical liquids are described.

For example, in the first line of each of the subdivision tables, the chemical liquid 101 is described.

The first line shows that the chemical liquid 101 was manufactured by the filtering device illustrated in FIG. 18, and the liquid to be purified used for manufacturing the chemical liquid 101 WAS SPM (4:1). In addition, the first line shows that the filter of the filtering device used for manufacturing the chemical liquid 101 was washed in advance under the condition of "PGMEA 1 day immersion". Furthermore, the first line shows that the filtering device has BU-1 (a PTFE-containing filter having a pore size of 200 nm), BU-2 (a PTFE-containing filter having a pore size of 20 nm), a tank TU-1 disposed on the upstream of the filter F-A, a filter A2 having a pore size of 10 nm as F-A (filter A), and has BD-1 (a PTFE-containing filter having a pore size of 10 nm), BD-2 (a PTFE-containing filter having a pore size of 10 nm), and a tank TD-1 which are disposed on the downstream side of the filter A2. The first line also shows that the circulation filtration was "performed".

As is evident from the first line, the chemical liquid 101 was evaluated as A for the particle defect inhibition performance, A for the stain-like defect inhibition performance, and A for the pot life of the filter of the filtering device.

Likewise, for the chemical liquids 102 to 104, the results are described in the above tables.

As is evident from the results described in Table 2, the chemical liquid 101 and the chemical liquid 102, which were purified using a filtering device having a filter A and a filter B different from the filter A, had the desired effects, and the chemical liquid 103 and the chemical liquid 104, which were purified using a filtering device having only a filter A, did not have the desired effects.

TABLE 3

Figure 26:
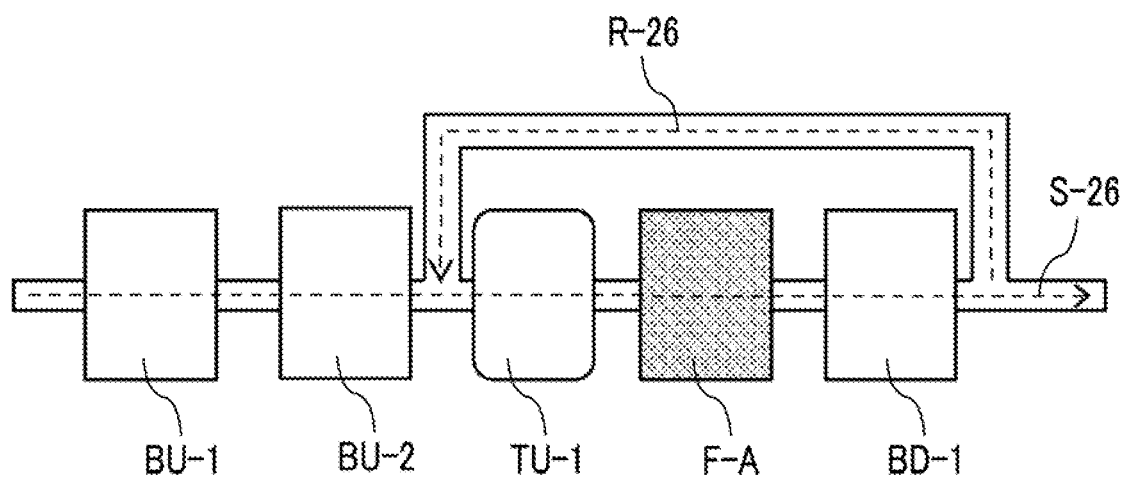
FIG. 26 is a schematic view illustrating a filtering device according to an embodiment of the present invention.

| | 1-1 | | | |
|---|---|---|---|---|
| | Filtering device | Liquid to be purified | Pre-washing of filter | Distiller |
| Chemical liquid 201 | FIG. 25 | Resist resin composition 2 | PGMEA 1 day immersion | — |
| Chemical liquid 202 | FIG. 26 | Resist resin composition 2 | PGMEA 1 day immersion | — |
| Chemical liquid 203 | FIG. 24 | Resist resin composition 2 | PGMEA 1 day immersion | — |
| Chemical liquid 204 | FIG. 25 | Resist resin composition 3 | PGMEA 1 day immersion | — |
| Chemical liquid 205 | FIG. 26 | Resist resin composition 3 | PGMEA 1 day immersion | — |
| Chemical liquid 206 | FIG. 24 | Resist resin composition 3 | PGMEA 1 day immersion | — |
| Chemical liquid 207 | FIG. 25 | Resist resin composition 4 | PGMEA 1 day immersion | — |
| Chemical liquid 208 | FIG. 26 | Resist resin composition 4 | PGMEA 1 day immersion | — |
| Chemical liquid 209 | FIG. 24 | Resist resin composition 4 | PGMEA 1 day immersion | — |

| | 1-2 | | | | | | |
|---|---|---|---|---|---|---|---|
| | BU-1 | | BU-2 | | | F-A | |
| | Material component | Pore size (nm) | Material component | Pore size (nm) | Tank TU-1 | Material component | Pore size (nm) |
| Chemical liquid 201 | Nylon | 10 | — | — | Present | A1 | 10 |
| Chemical liquid 202 | Nylon | 20 | Nylon | 10 | Present | A3 | 10 |
| Chemical liquid 203 | — | — | — | — | — | A1 | 10 |
| Chemical liquid 204 | Nylon | 10 | — | — | Present | A2 | 10 |
| Chemical liquid 205 | Nylon | 20 | Nylon | 10 | Present | A1 | 10 |
| Chemical liquid 206 | — | — | — | — | — | A1 | 10 |
| Chemical liquid 207 | Nylon | 10 | — | — | Present | A3 | 10 |
| Chemical liquid 208 | Nylon | 20 | Nylon | 10 | Present | A1 | 10 |
| Chemical liquid 209 | — | — | — | — | — | A2 | 10 |

| | 1-3 | | | | | | |
|---|---|---|---|---|---|---|---|
| | BD-1 | | | | Evaluation 1 | Evaluation 2 | |
| | Material component | Pore size (nm) | Tank TD-1 | Circulation | Bridge defect inhibition performance | Post-development defect inhibition performance | Evaluation 3 Pot life |
| Chemical liquid 201 | UPE | 1 | — | Performed | A | A | A |
| Chemical liquid 202 | UPE | 1 | — | Performed | A | A | AA |
| Chemical liquid 203 | — | — | — | — | C | C | Standard |
| Chemical liquid 204 | UPE | 1 | — | Performed | A | A | A |
| Chemical liquid 205 | UPE | 1 | — | Performed | A | A | AA |
| Chemical liquid 206 | — | — | — | — | C | C | D |
| Chemical liquid 207 | UPE | 1 | — | Performed | A | A | A |
| Chemical liquid 208 | UPE | 1 | — | Performed | A | A | AA |
| Chemical liquid 209 | — | — | — | — | C | C | D |

Table 3 is divided into Table 3 (1-1) to Table 3 (1-3). In the corresponding lines of the tables subdivided from Table 3, the filtering devices used for purifying the chemical liquids and the obtained evaluation results of chemical liquids are described.

For example, in the first line of each of the subdivision tables, the chemical liquid 201 is described.

The first line shows that the chemical liquid 201 was manufactured by the filtering device illustrated in FIG. 25, and the liquid to be purified used for manufacturing the chemical liquid 201 was the resist resin composition 2. In addition, the first line shows that the filter of the filtering device used for manufacturing the chemical liquid 201 was washed in advance under the condition of "PGMEA 1 day immersion". Furthermore, the first line shows that the filtering device has BU-1 (a nylon-containing filter having a pore size of 10 nm), a tank TU-1 on the upstream side of the filter F-A, a filter A1 having a pore size of 10 nm as F-A (filter A), and BD-1 (a UPE-containing filter having a pore size of 1 nm) on the downstream side of the filter A1. The first line also shows that the circulation filtration was "performed".

As is evident from the first line, the chemical liquid 201 was evaluated as A for the bridge defect inhibition performance, A for the post-development defect inhibition performance, and A for the pot life of the filter of the filtering device.

Likewise, for the chemical liquids 202 to 209, the results are described in the above tables.

From the results described in Table 3, it has been revealed that the chemical liquid purified using a filtering device having a filter A and a filter B different from the filter A has desired effects. In contrast, the chemical liquid purified using a filtering device having only a filter A did not have desired effects.

EXPLANATION OF REFERENCES

100, 200, 300, 400, 500, 600, 700, 800, 900, 1000: filtering device
1200, 1300: purification device
101: inlet portion
102: outlet portion
103, 104, 201, 601, 104-1, 104-2: filter
105, 202, 301, 302, 402, 501, 502, 602, 701, 801, 802, 803, 804, 901, 1001, 1002, 1003, 1104, 1105, 1305: piping
**401, 401(*a*), 401(*b*)**: tank
1100: manufacturing plant
1101: distillation device
1102, 1203, 1303, 1304: distiller
1103: portable tank
1106: transporting unit
1201, 1301: second inlet portion
1202, 1302: second outlet portion

What is claimed is:

1. A filtering device for obtaining a chemical liquid by purifying a liquid to be purified, comprising:
an inlet portion;
an outlet portion;
a filter A;
at least three filters B different from the filter A; and
a flow path extending from the inlet portion to the outlet portion,
wherein the filter A and the filters B are arranged in series between the inlet portion and the outlet portion,
the filter A is selected from the group consisting of a filter A1, a filter A2, and a filter A3,
the filter A1 has a porous base material made of polytetrafluoroethylene and a coating layer which is disposed to cover the porous base material and contains a fluorinated ionomer,
the fluorinated ionomer contains
a fluorinated monomer unit containing an ethylene group and a functional group which is convertible into a hydrophilic group selected from the group consisting of —$SO_2F$, —COOR, —COF, and a combination of these, R is a $C_1$-$C_{20}$ alkyl radical or a $C_6$-$C_{20}$ aryl radical;
a monomer unit derived from at least one bis-olefin selected from the group consisting of Formulas (OF-1), (OF-2), and (OF-3); and
at least one kind of atom selected from the group consisting of an iodine atom and a bromine atom,

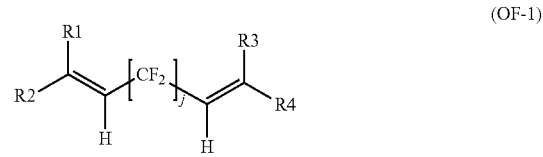

(OF-1)

in Formula (OF-1), j is an integer of 2 to 10, and R1, R2, R3, and R4 may be the same as or different from each other and each represent H, F, or a $C_1$-$C_5$ alkyl group, a perfluoroalkyl group, or a fluoroalkyl group,

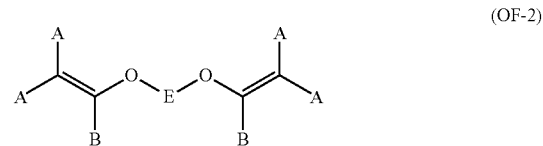

(OF-2)

in Formula (OF-2), a plurality of A's may be the same as or different from each other and are each independently selected from the group consisting of F, Cl, and H, a plurality of B's may be the same as or different from each other and are each independently selected from the group consisting of F, Cl, H, and ORB, RB is a branched or linear alkyl radical capable of being at least partially fluorinated or chlorinated, E is a divalent group which is capable of being inserted into an ether bond, is fluorinated as necessary, and has 2 to 10 carbon atoms,

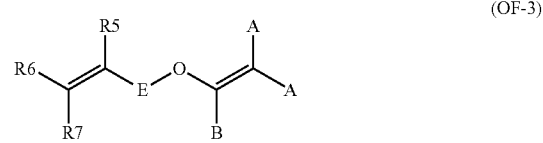

(OF-3)

in Formula (OF-3), E, A, and B have the same definition as E, A, and B in Formula (OF-2), R5, R6, and R7 may be the same as or different from each other and each represent H, F, a $C_1$-$C_5$ alkyl group, a perfluoroalkyl group, or a fluoroalkyl group,
the filter A2 contains a copolymer having a repeating unit based on tetrafluoroethylene and another repeating unit,
the filter A3 is a laminated structure having a first layer which consists of a porous base material made of polytetrafluoroethylene having a first hydrophilic group on a surface thereof and a second layer which is disposed on the first layer and consists of a porous base material made of polytetrafluoroethylene having a second hydrophilic group different from the first hydrophilic group on a surface thereof, the filters B includes at least two filters BU disposed on an upstream side of the filter A on the flow path, the at least two filters BU have a pore size larger than a pore size of the filter A, one of the at least two filters BU contains a polypropylene not having an ion exchange group or polyethylene not having an ion exchange group, the other of the at least two filters BU contains a resin having an ion exchange group which is an imide group, the filters B includes at least a filter BD disposed on a downstream side of the filter A on the flow path, and at least the one filter BD has a pore size smaller than a pore size of the filter A.

2. The filtering device according to claim 1,
wherein each of the first hydrophilic group and the second hydrophilic group is at least one kind of hydrophilic group selected from the group consisting of a polyether group, a hydroxyl group, a thioether group, a thiol group, a quaternary ammonium group, a carboxylic acid group, a sulfonic acid group, and a group obtained by combining these.

3. The filtering device according to claim 1,
wherein the at least two filters BU have a pore size equal to or greater than 20 nm.

4. The filtering device according to claim 1, further comprising:
a return flow path capable of returning the liquid to be purified to an upstream side of a first reference filter from a downstream side of the first reference filter,
wherein the first reference filter consists of at least one kind of filter selected from the group consisting of the filter A and the filter BU.

5. The filtering device according to claim 1,
wherein at least the one filter BD has a pore size equal to or smaller than 20 nm.

6. The filtering device according to claim 1,
wherein the filter BD contains at least one kind of compound selected from the group consisting of polyolefin, polyamide, polyfluorocarbon, polystyrene, polysulfone, and polyethersulfone.

7. The filtering device according to claim 1, further comprising:
a return flow path capable of returning the liquid to be purified to an upstream side of a second reference filter from a downstream side of the second reference filter,
wherein the second reference filter consists of at least one kind of filter selected from the group consisting of the filter A and the filter BD.

8. The filtering device according to claim 1, further comprising:
a tank which is disposed in series with the filter A on the flow path.

9. The filtering device according to claim 8, further comprising:
a filter C having a pore size equal to or greater than 20 nm that is disposed in series with the tank on an upstream side of the tank in the flow path.

10. The filtering device according to claim 1,
wherein the chemical liquid is at least one kind of chemical liquid selected from the group consisting of a developer, a rinsing solution, a wafer washing solution, a line washing solution, a prewet solution, a wafer rinsing solution, a resist solution, a solution for forming an underlayer film, a solution for forming an overlayer film, and a solution for forming a hardcoat, or at least one kind of chemical liquid selected from the group consisting of an aqueous developer, an aqueous rinsing solution, a peeling solution, a remover, an etching solution, an acidic washing solution, and a phosphoric acid, and a phosphoric acid-aqueous hydrogen peroxide mixture.

11. A purification device comprising:
the filtering device according to claim 1; and
at least one distiller connected to the inlet portion of the filtering device.

12. The purification device according to claim 11,
wherein the at least the one distiller includes a plurality of distillers connected in series.

13. A method for manufacturing a chemical liquid by purifying a liquid to be purified, comprising:
a filtration step of purifying the liquid to be purified by using the filtering device according to claim 1 so as to obtain a chemical liquid.

14. The method for manufacturing a chemical liquid according to claim 13, further comprising:
a filter washing step of washing the filter A and the filter B before the filtration step.

15. The method for manufacturing a chemical liquid according to claim 13, further comprising:
a device washing step of washing a liquid contact portion of the filtering device before the filtration step.

16. A method for manufacturing a chemical liquid by purifying a liquid to be purified, comprising:
a step of filtering the liquid to be purified by using;
a filter A including a porous base material which is made of polyfluorocarbon and a coating layer which is disposed to cover the porous base material and contains a resin having a hydrophilic group; and
at least three filters B different from the filter A so as to obtain a chemical liquid,
wherein the filters B include at least two filters BU disposed on an upstream side of the filter A on a flow path,
the at least two filters BU have a pore size larger than a pore size of the filter A,
one of the at least two filters BU contains a polypropylene not having an ion exchange group or polyethylene not having an ion exchange group
the other of the at least two filters BU contains a resin having an ion exchange group which is an imide group,
the filters B includes at least a filter BD disposed on a downstream side of the filter A on the flow path, and
at least the one filter BD has a pore size smaller than a pore size of the filter A.

17. A filtering device for obtaining a chemical liquid by purifying a liquid to be purified, comprising:
an inlet portion;
an outlet portion;
a filter A;
at least one filter B different from the filter A;
a flow path extending from the inlet portion to the outlet portion; and
a return flow path,
wherein the filter A and the filter B are arranged in series between the inlet portion and the outlet portion,
the filter A is selected from the group consisting of a filter A1, a filter A2, and a filter A3, the filter A1 has a porous base material made of polytetrafluoroethylene and a coating layer which is disposed to cover the porous base material and contains a fluorinated ionomer, the fluorinated ionomer contains a fluorinated monomer unit containing an ethylene group and a functional group which is convertible into a hydrophilic group selected from the group consisting of —SO$_2$F, —COOR, —COF, and a combination of these, R is a C$_1$-C$_{20}$ alkyl radical or a C$_6$-C$_{20}$ aryl radical;

a monomer unit derived from at least one bis-olefin selected from the group consisting of Formulas (OF-1), (OF-2), and (OF-3); and at least one kind of atom selected from the group consisting of an iodine atom and a bromine atom,

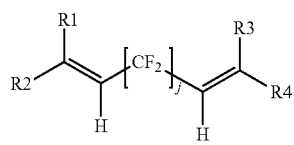
(OF-1)

in Formula (OF-1), j is an integer of 2 to 10, and R1, R2, R3, and R4 may be the same as or different from each other and each represent H, F, or a C$_1$-C$_5$ alkyl group, a perfluoroalkyl group, or a fluoroalkyl group,

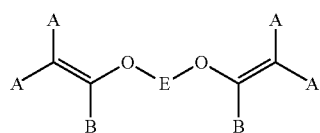
(OF-2)

in Formula (OF-2), a plurality of A's may be the same as or different from each other and are each independently selected from the group consisting of F, Cl, and H, a plurality of B's may be the same as or different from each other and are each independently selected from the group consisting of F, Cl, H, and ORB, RB is a branched or linear alkyl radical capable of being at least partially fluorinated or chlorinated, E is a divalent group which is capable of being inserted into an ether bond, is fluorinated as necessary, and has 2 to 10 carbon atoms,

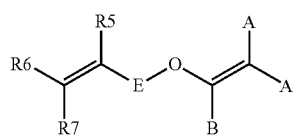
(OF-3)

in Formula (OF-3), E, A, and B have the same definition as E, A, and B in Formula (OF-2), R5, R6, and R7 may be the same as or different from each other and each represent H, F, a C$_1$-C$_5$ alkyl group, a perfluoroalkyl group, or a fluoroalkyl group, the filter A2 contains a copolymer having a repeating unit based on tetrafluoroethylene and another repeating unit, and the filter A3 is a laminated structure having a first layer which consists of a porous base material made of polytetrafluoroethylene having a first hydrophilic group on a surface thereof and a second layer which is disposed on the first layer and consists of a porous base material made of polytetrafluoroethylene having a second hydrophilic group different from the first hydrophilic group on a surface thereof, the filter B includes at least one filter BU disposed on an upstream side of the filter A on the flow path, and the return path is capable of returning the liquid to be purified to a downstream side of the filter BU from a downstream side of the filter A.

18. A filtering device for obtaining a chemical liquid by purifying a liquid to be purified, comprising:

an inlet portion;

an outlet portion;

a filter A;

at least one filter B different from the filter A;

a flow path extending from the inlet portion to the outlet portion; and a return flow path, wherein the filter A and the filter B are arranged in series between the inlet portion and the outlet portion, the filter A is selected from the group consisting of a filter A1, a filter A2, and a filter A3, the filter A1 has a porous base material made of polytetrafluoroethylene and a coating layer which is disposed to cover the porous base material and contains a fluorinated ionomer, the fluorinated ionomer contains a fluorinated monomer unit containing an ethylene group and a functional group which is convertible into a hydrophilic group selected from the group consisting of —SO$_2$F, —COOR, —COF, and a combination of these, R is a C$_1$-C$_{20}$ alkyl radical or a C$_6$-C$_{20}$ aryl radical;

a monomer unit derived from at least one bis-olefin selected from the group consisting of Formulas (OF-1), (OF-2), and (OF-3); and at least one kind of atom selected from the group consisting of an iodine atom and a bromine atom,

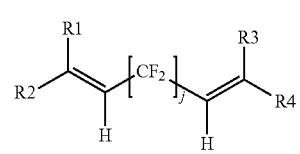
(OF-1)

in Formula (OF-1), j is an integer of 2 to 10, and R1, R2, R3, and R4 may be the same as or different from each other and each represent H, F, or a C$_1$-C$_5$ alkyl group, a perfluoroalkyl group, or a fluoroalkyl group,

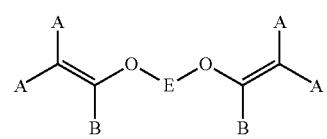
(OF-2)

in Formula (OF-2), a plurality of A's may be the same as or different from each other and are each independently selected from the group consisting of F, Cl, and H, a plurality of B's may be the same as or different from each other and are each independently selected from the group consisting of F, Cl, H, and ORB, RB is a branched or linear alkyl radical capable of being at least partially fluorinated or chlorinated, E is a divalent group which is capable of being inserted into an ether bond, is fluorinated as necessary, and has 2 to 10 carbon atoms,

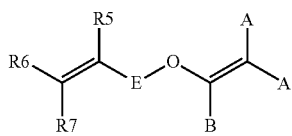

(OF-3)

in Formula (OF-3), E, A, and B have the same definition as E, A, and B in Formula (OF-2), R5, R6, and R7 may be the same as or different from each other and each represent H, F, a $C_1$-$C_5$ alkyl group, a perfluoroalkyl group, or a fluoroalkyl group, the filter A2 contains a copolymer having a repeating unit based on tetrafluoroethylene and another repeating unit, the filter A3 is a laminated structure having a first layer which consists of a porous base material made of polytetrafluoroethylene having a first hydrophilic group on a surface thereof and a second layer which is disposed on the first layer and consists of a porous base material made of polytetrafluoroethylene having a second hydrophilic group different from the first hydrophilic group on a surface thereof, the filter B includes at least a filter BD disposed on a downstream side of the filter A on the flow path, and the return path is capable of returning the liquid to be purified to a downstream side of the filter A from a downstream side of the filter BD.

19. A filtering device for obtaining a chemical liquid by purifying a liquid to be purified, comprising:
an inlet portion;
an outlet portion;
a filter A3;
at least one filter B different from the filter A3; and
a flow path extending from the inlet portion to the outlet portion,
wherein the filter A3 and the filter B are arranged in series between the inlet portion and the outlet portion,
the filter A3 is a laminated structure having a first layer which consists of a porous base material made of polytetrafluoroethylene having a first hydrophilic group on a surface thereof and a second layer which is disposed on the first layer and consists of a porous base material made of polytetrafluoroethylene having a second hydrophilic group different from the first hydrophilic group on a surface thereof, and
each of the first hydrophilic group and the second hydrophilic group is at least one kind of hydrophilic group selected from the group consisting of a polyether group, a thioether group, a thiol group, and a group obtained by combining these.

20. A method for manufacturing a chemical liquid by purifying a liquid to be purified, comprising:
a step of filtering the liquid to be purified by using;
a filter A including a porous base material which is made of polyfluorocarbon and a coating layer which is disposed to cover the porous base material and contains a resin having a hydrophilic group;
a filter B different from the filter A so as to obtain a chemical liquid; and
a return flow path,
wherein the filter B includes at least one filter BU disposed on an upstream side of the filter A on a flow path, and
the return path is capable of returning the liquid to be purified to a downstream side of the filter BU from a downstream side of the filter A.

21. A method for manufacturing a chemical liquid by purifying a liquid to be purified, comprising:
a step of filtering the liquid to be purified by using;
a filter A including a porous base material which is made of polyfluorocarbon and a coating layer which is disposed to cover the porous base material and contains a resin having a hydrophilic group;
a filter B different from the filter A so as to obtain a chemical liquid; and
a return flow path,
wherein the filter B includes at least a filter BD disposed on a downstream side of the filter A on the flow path, and
the return path is capable of returning the liquid to be purified to a downstream side of the filter A from a downstream side of the filter BD.

22. A method for manufacturing a chemical liquid by purifying a liquid to be purified, comprising:
a step of filtering the liquid to be purified by using;
a filter A3 including a porous base material which is made of polyfluorocarbon and a coating layer which is disposed to cover the porous base material and contains a resin having a hydrophilic group; and
a filter B different from the filter A3 so as to obtain a chemical liquid,
wherein the filter A3 is a laminated structure having a first layer which consists of a porous base material made of polytetrafluoroethylene having a first hydrophilic group on a surface thereof and a second layer which is disposed on the first layer and consists of a porous base material made of polytetrafluoroethylene having a second hydrophilic group different from the first hydrophilic group on a surface thereof, and
each of the first hydrophilic group and the second hydrophilic group is at least one kind of hydrophilic group selected from the group consisting of a polyether group, a thioether group, a thiol group, and a group obtained by combining these.

* * * * *